(12) United States Patent
Chen et al.

(10) Patent No.: US 12,345,740 B2
(45) Date of Patent: Jul. 1, 2025

(54) PROBE CARD SUBSTRATE, SUBSTRATE STRUCTURE AND METHOD OF FABRICATING THE SAME

(71) Applicant: Taiwan Semiconductor Manufacturing Company, Ltd., Hsinchu (TW)

(72) Inventors: Wei-Yu Chen, Hsinchu (TW); Yu-Min Liang, Taoyuan (TW); Hao-Cheng Hou, Hsinchu (TW); Tsung-Ding Wang, Tainan (TW); Chien-Hsun Lee, Hsin-chu County (TW); Chung-Shi Liu, Hsinchu (TW); Jung-Wei Cheng, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 363 days.

(21) Appl. No.: 17/738,023

(22) Filed: May 6, 2022

(65) Prior Publication Data

US 2023/0358786 A1    Nov. 9, 2023

(51) Int. Cl.
| | |
|---|---|
| G01R 1/073 | (2006.01) |
| G01R 1/02 | (2006.01) |
| G01R 1/04 | (2006.01) |
| G01R 1/067 | (2006.01) |
| G01R 3/00 | (2006.01) |
| G01R 31/28 | (2006.01) |
| H01L 23/00 | (2006.01) |

(52) U.S. Cl.
CPC ..... *G01R 1/07371* (2013.01); *G01R 31/2886* (2013.01)

(58) Field of Classification Search
CPC . G01R 1/02; G01R 1/04; G01R 1/067; G01R 1/073; G01R 31/28; G01R 3/00; H01L 23/00; H01L 23/12; H01L 23/13; H01L 23/14; H01L 23/522; H01L 23/538
See application file for complete search history.

(56) References Cited

U.S. PATENT DOCUMENTS

| | | |
|---|---|---|
| 8,802,504 B1 | 8/2014 | Hou et al. |
| 8,803,292 B2 | 8/2014 | Chen et al. |
| 8,803,316 B2 | 8/2014 | Lin et al. |
| 8,993,380 B2 | 3/2015 | Hou et al. |
| 9,281,254 B2 | 3/2016 | Yu et al. |
| 9,299,649 B2 | 3/2016 | Chiu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,496,189 B2 | 11/2016 | Yu et al. |

(Continued)

*Primary Examiner* — Neel D Shah
(74) *Attorney, Agent, or Firm* — JCIPRNET

(57) ABSTRACT

A substrate structure includes a core substrate, a redistribution layer, a plurality of test pads, a first protective coating, at least one conductive pad and a passive device. The redistribution layer is disposed on and electrically connected to the core substrate. The test pads are disposed over the redistribution layer. The first protective coating is coated on the test pads. The conductive pad is d disposed on the redistribution layer aside the plurality of test pads. The passive device is disposed on and electrically connected to the at least one conductive pad.

20 Claims, 50 Drawing Sheets

(56) References Cited

U.S. PATENT DOCUMENTS

| | | | |
|---|---|---|---|
| 2009/0224780 A1* | 9/2009 | Chao | G01R 31/2863 |
| | | | 324/762.05 |
| 2015/0179616 A1* | 6/2015 | Lin | H01L 23/3121 |
| | | | 257/773 |
| 2018/0190579 A1* | 7/2018 | Chou | H01L 23/49838 |
| 2019/0393149 A1* | 12/2019 | Wang | H01L 23/3121 |

* cited by examiner

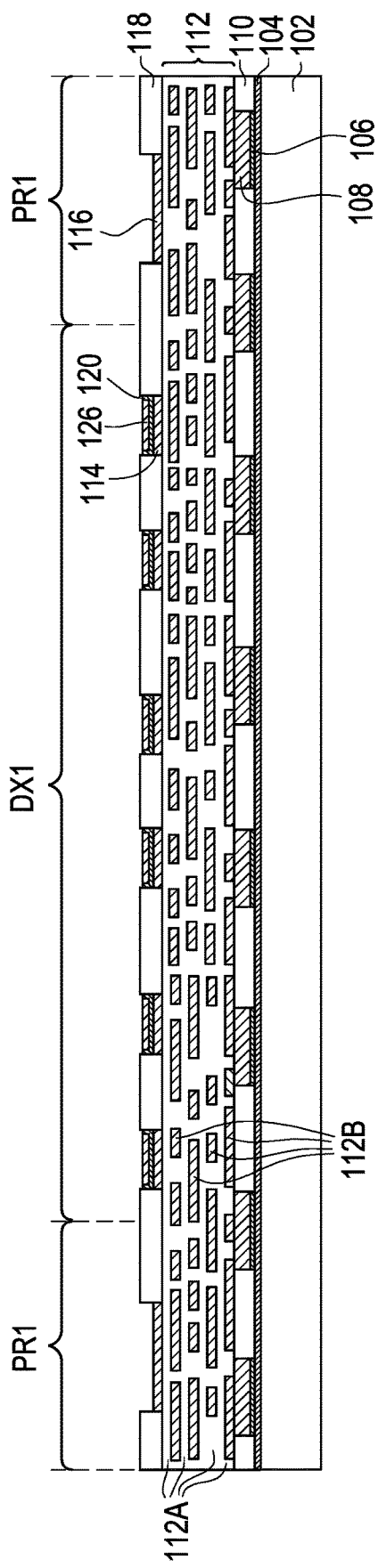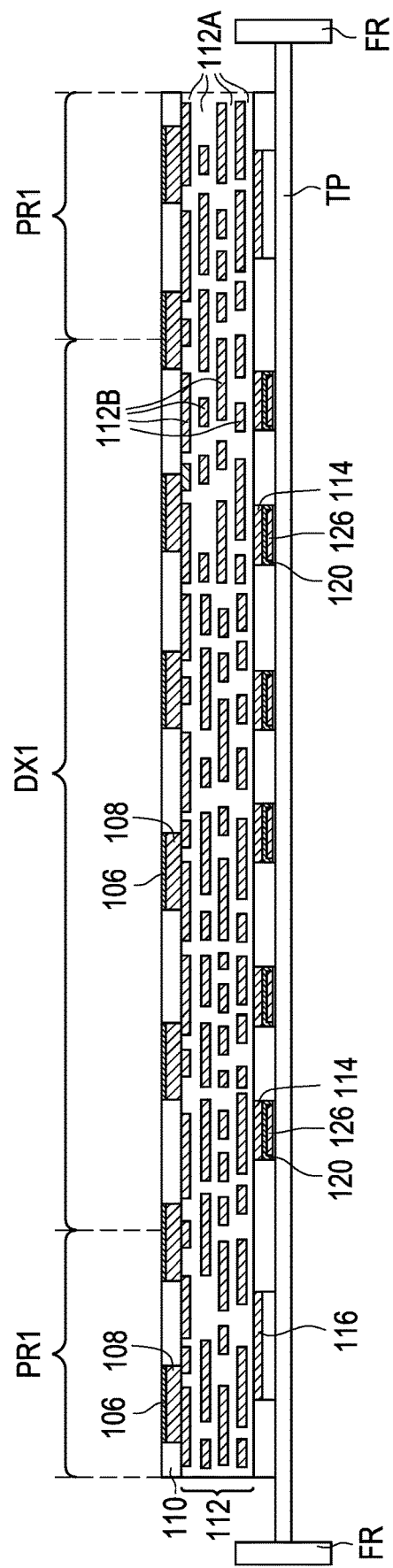
FIG. 1I
FIG. 1J

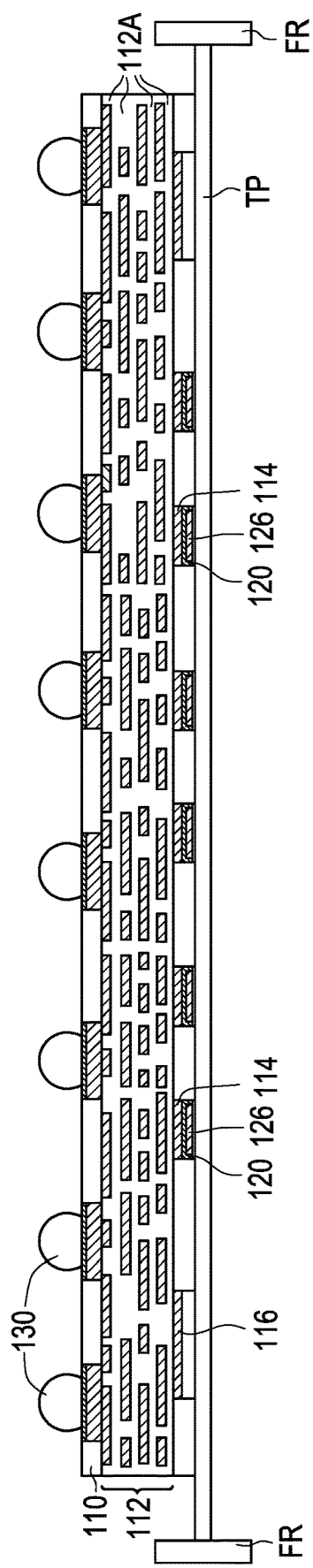
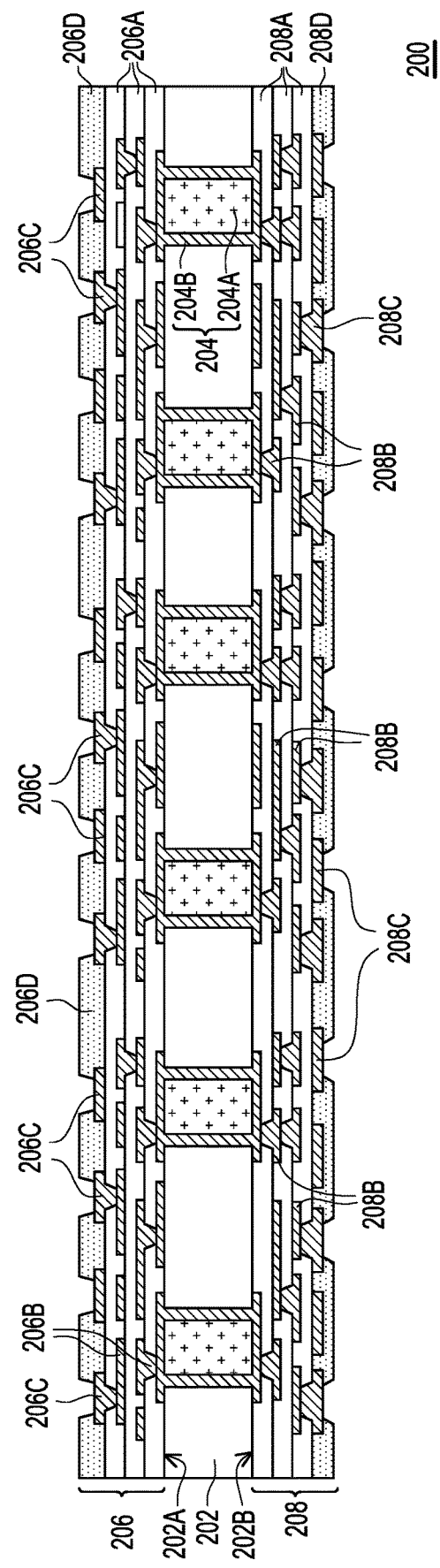
FIG. 1K
FIG. 1L

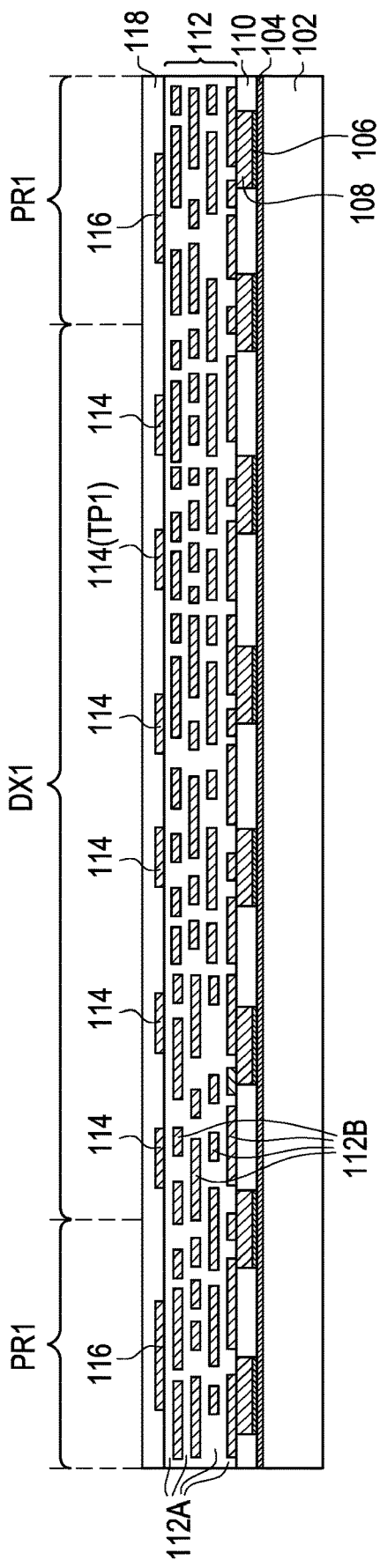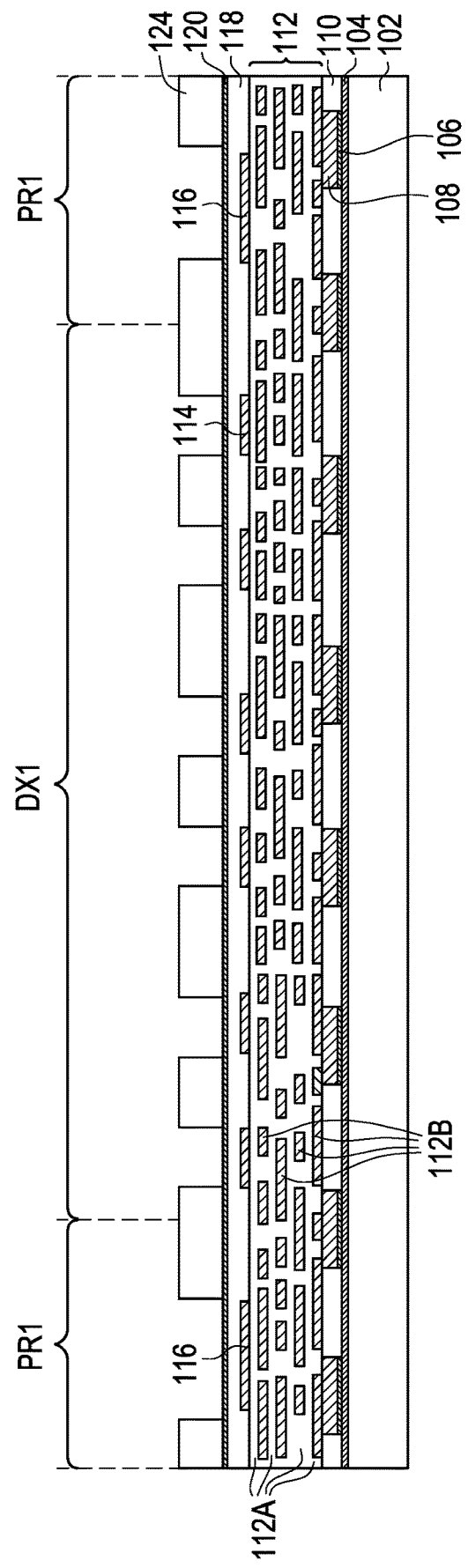
FIG. 2A
FIG. 2B

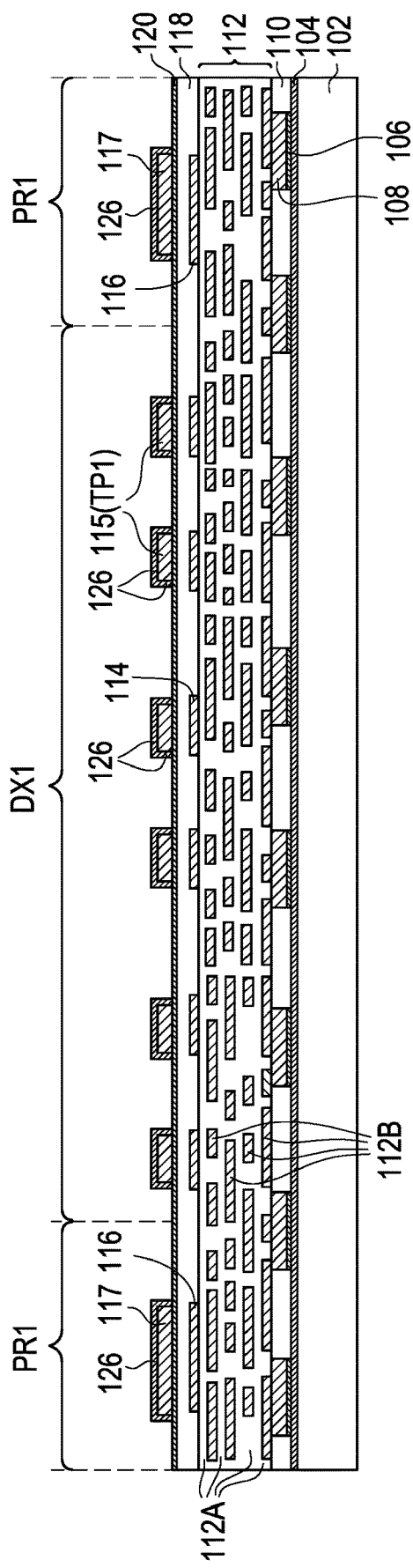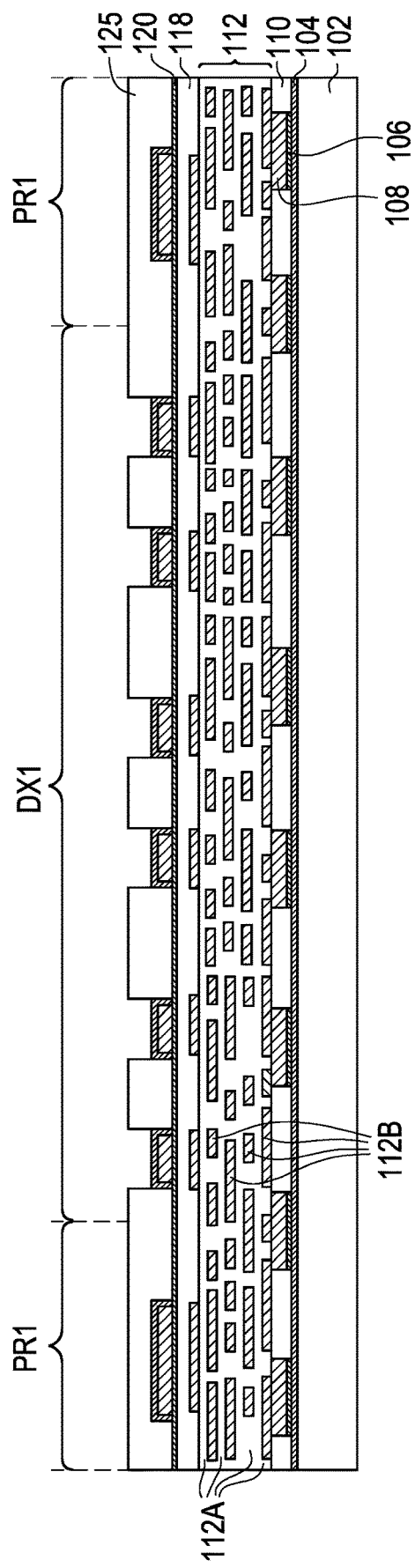

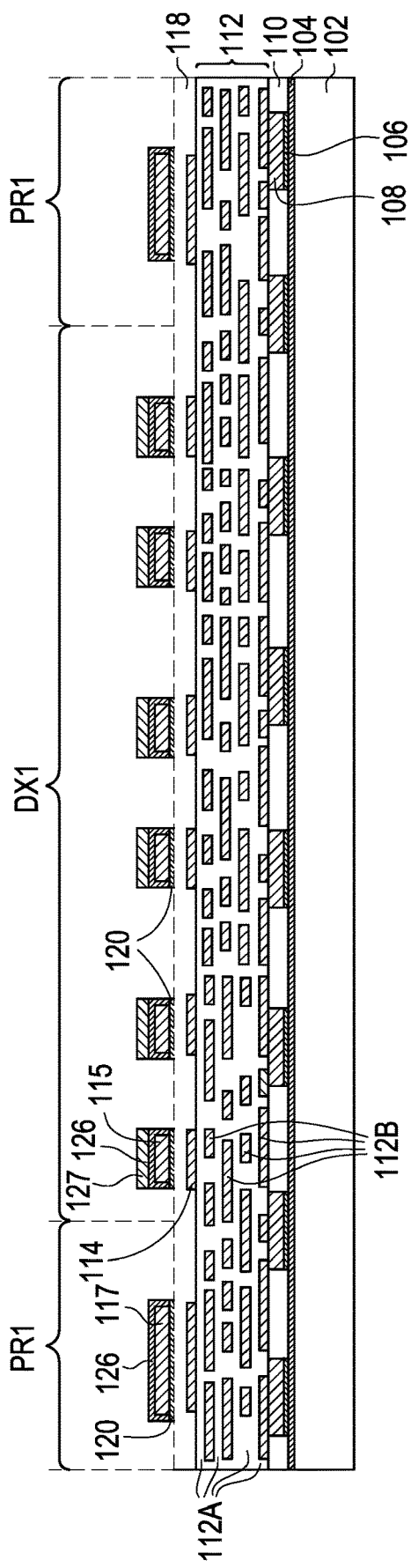
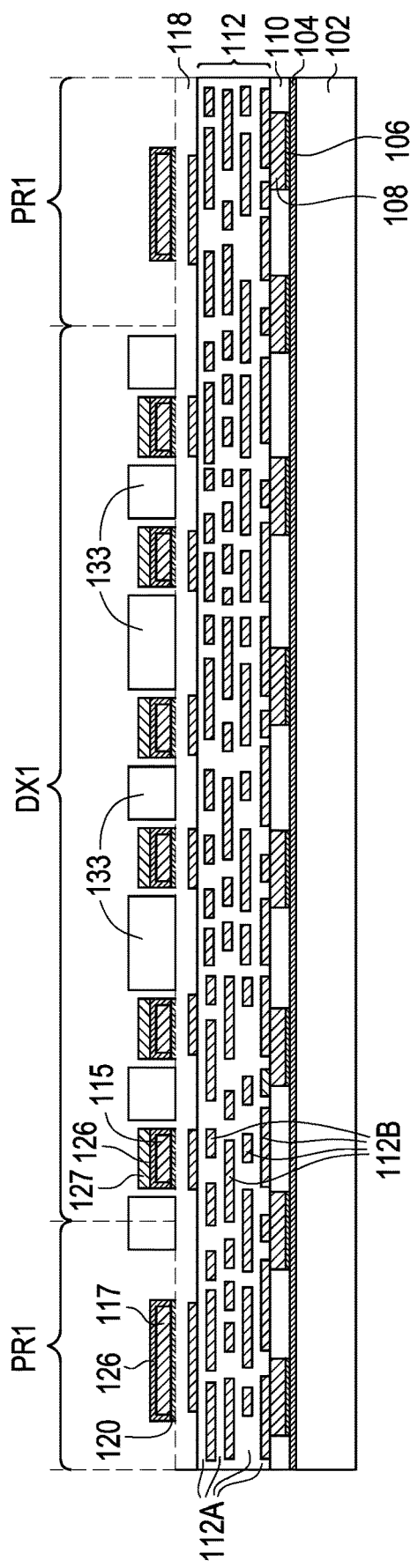
FIG. 3A
FIG. 3B

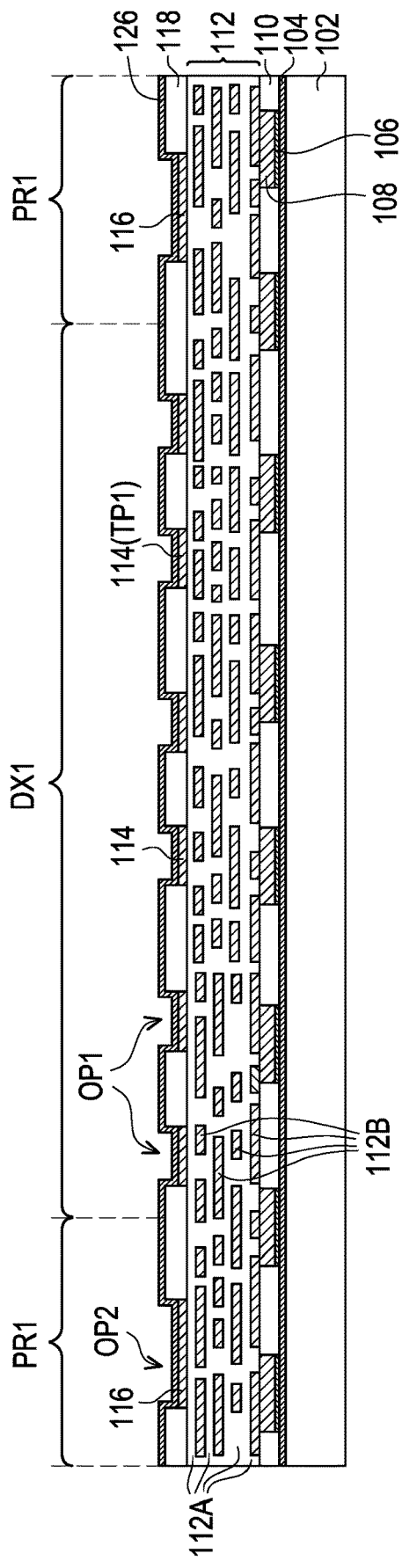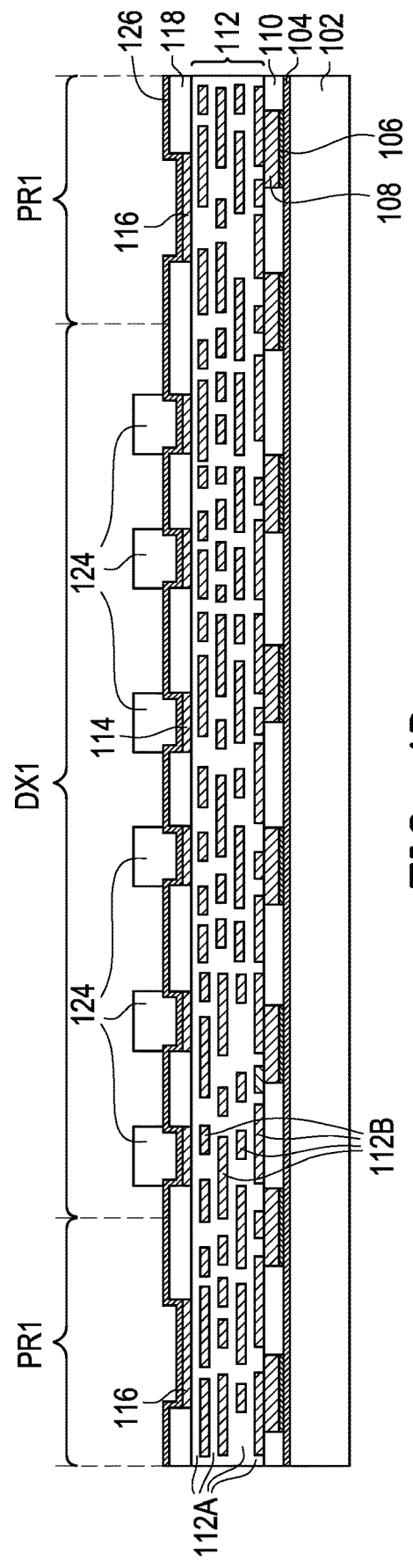
FIG. 4C
FIG. 4D

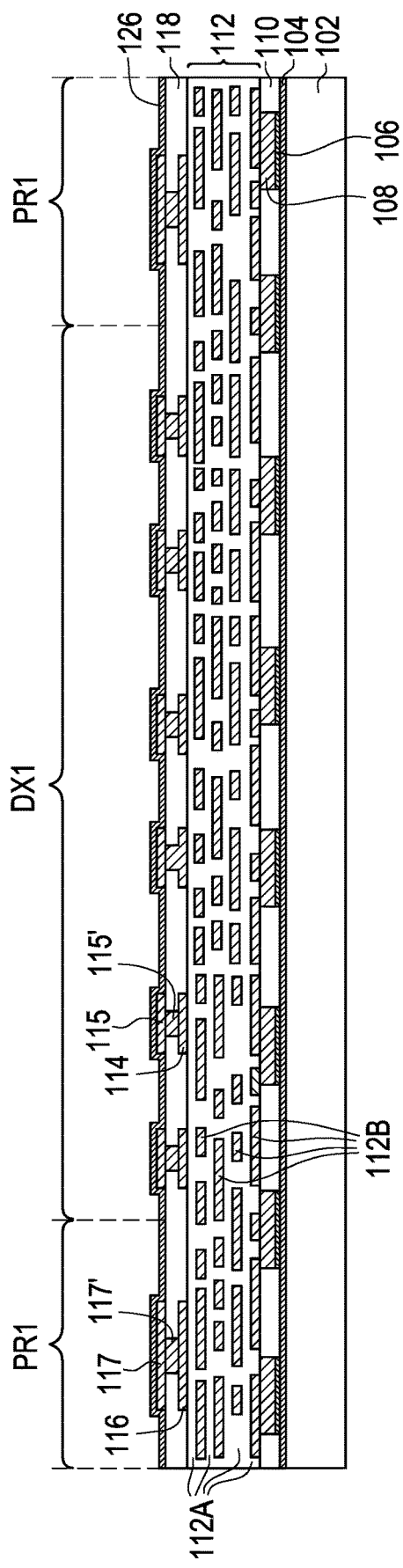
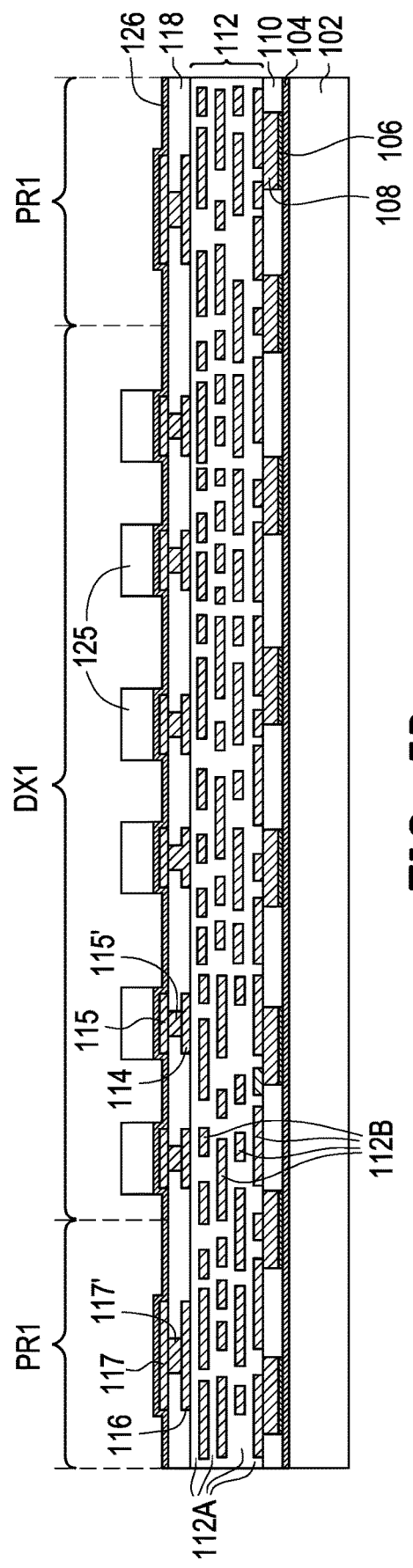
FIG. 5C
FIG. 5D

PROBE CARD SUBSTRATE, SUBSTRATE STRUCTURE AND METHOD OF FABRICATING THE SAME

BACKGROUND

With the evolving of semiconductor technologies, integrated circuit (IC) devices become smaller and the functionalities continue to increase. The testing of the IC devices plays an important role in IC manufacturing to ensure the functionalities of the IC devices. Typically, the prober station is configured to provide the testing signals for a device-under-test (DUT) via the probe card which includes a probe head connected to a printed circuit board (PCB). Although existing methods and apparatus of testing have been generally adequate for their intended purposes, they have not been entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2A to FIG. 2K are schematic sectional views of various stages in a method of fabricating a substrate structure according to some other exemplary embodiments of the present disclosure.

FIG. 3A to FIG. 3C are schematic sectional views of various stages in a method of fabricating a substrate structure according to some other exemplary embodiments of the present disclosure.

FIG. 4A to FIG. 4K are schematic sectional views of various stages in a method of fabricating a substrate structure according to some other exemplary embodiments of the present disclosure.

FIG. 5A to FIG. 5J are schematic sectional views of various stages in a method of fabricating a substrate structure according to some other exemplary embodiments of the present disclosure.

DETAILED DESCRIPTION

Figure 1A:
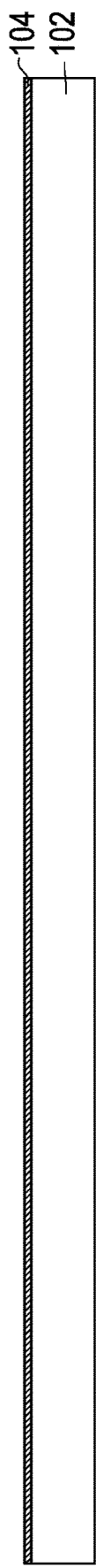
FIG. 1A to FIG. 1P are schematic sectional views of various stages in a method of fabricating a substrate structure according to some exemplary embodiments of the present disclosure.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 1B:
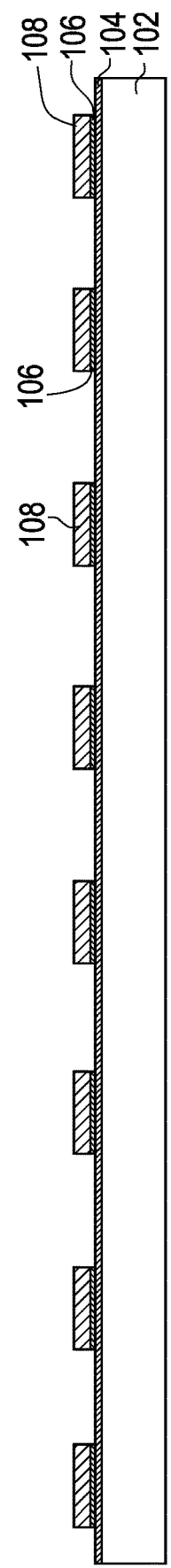
Figure 1C:
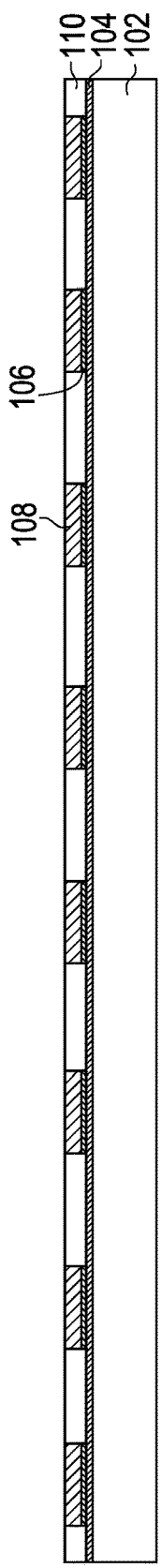
Figure 1D:
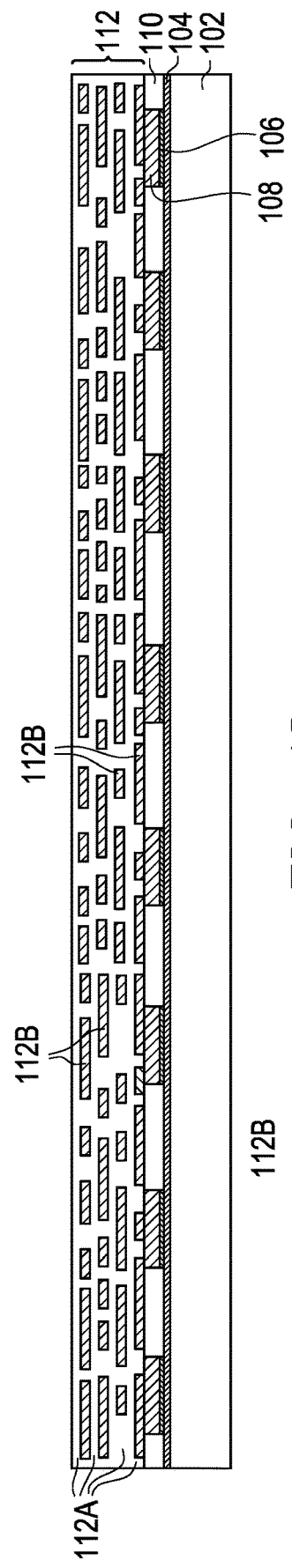
Figure 1E:
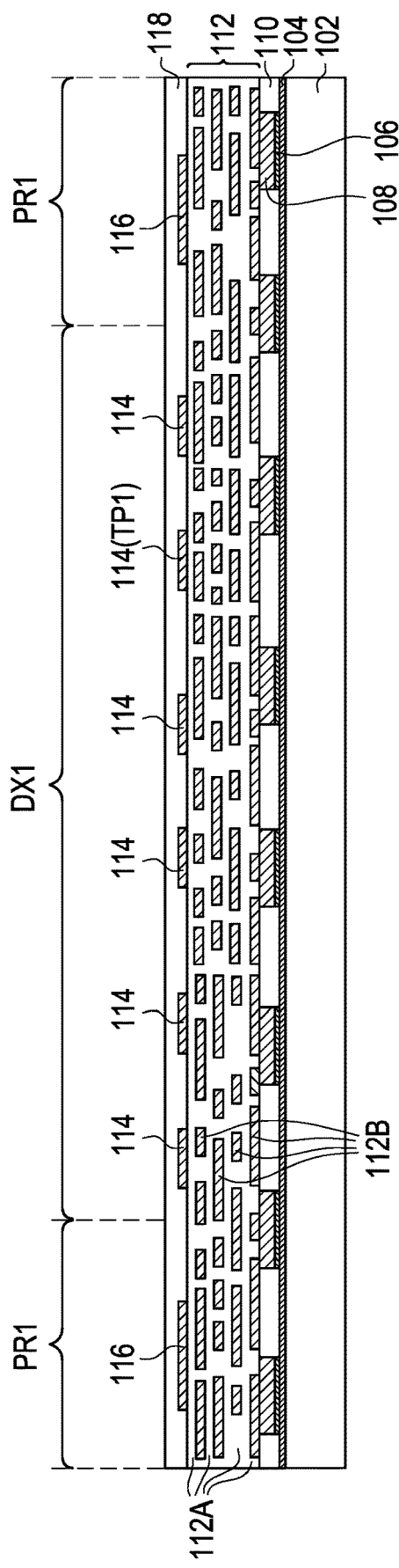
Figure 1F:
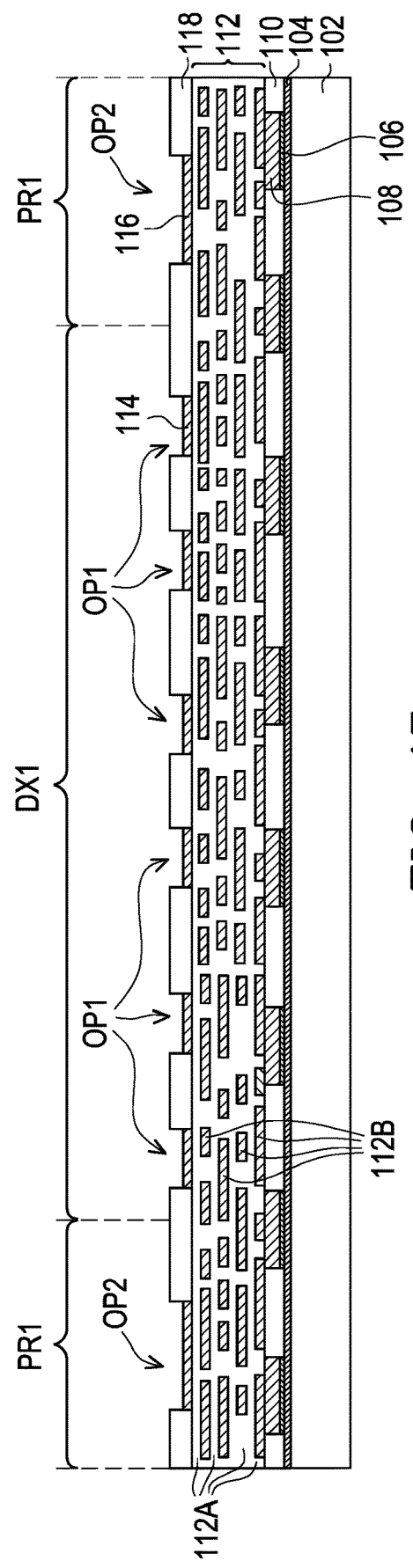
Figure 1G:
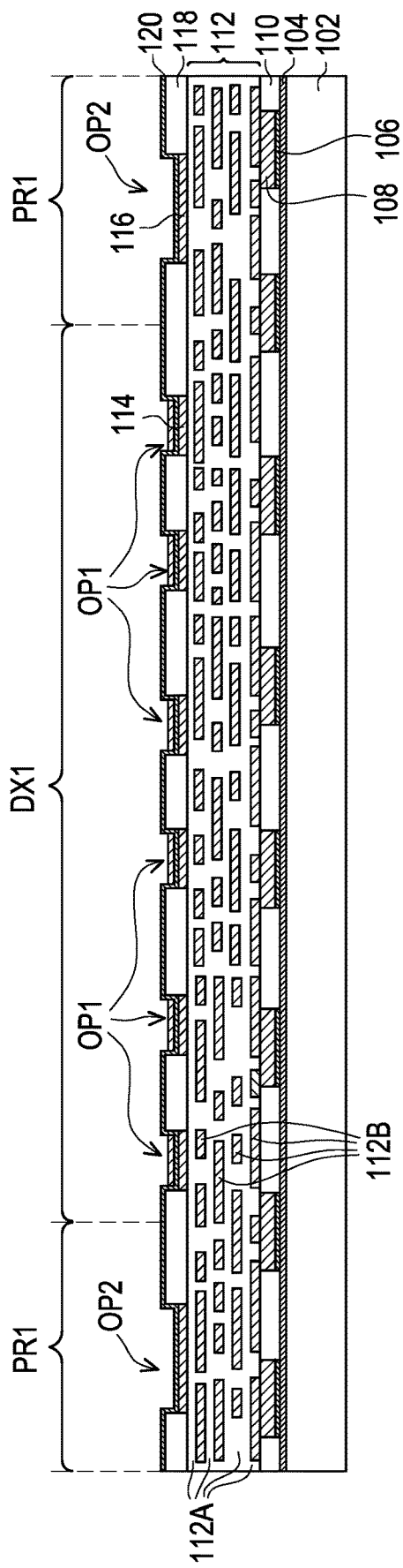
Figure 1H:
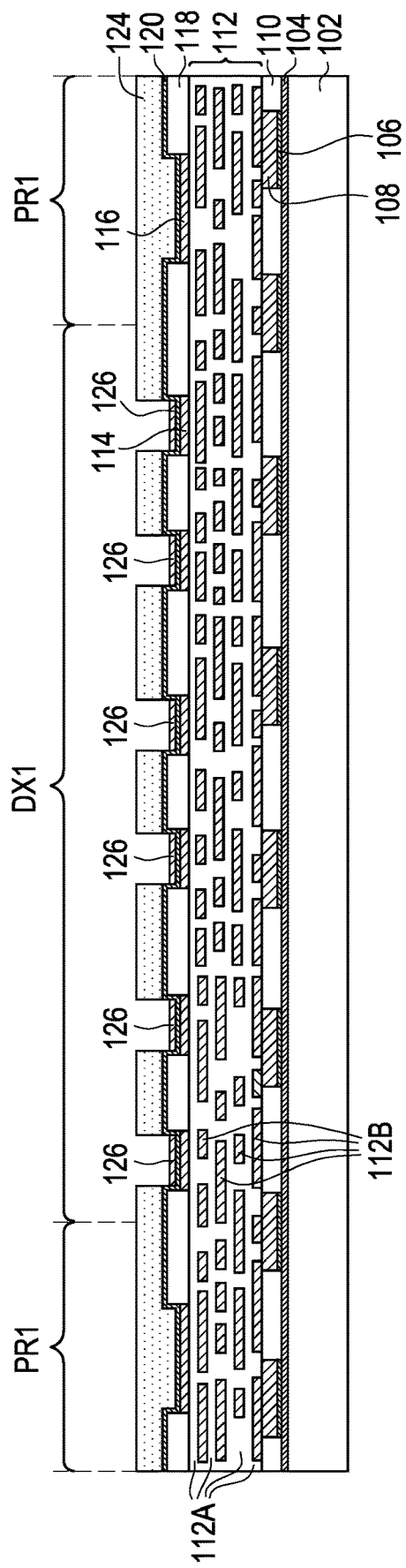
Figure 1M:
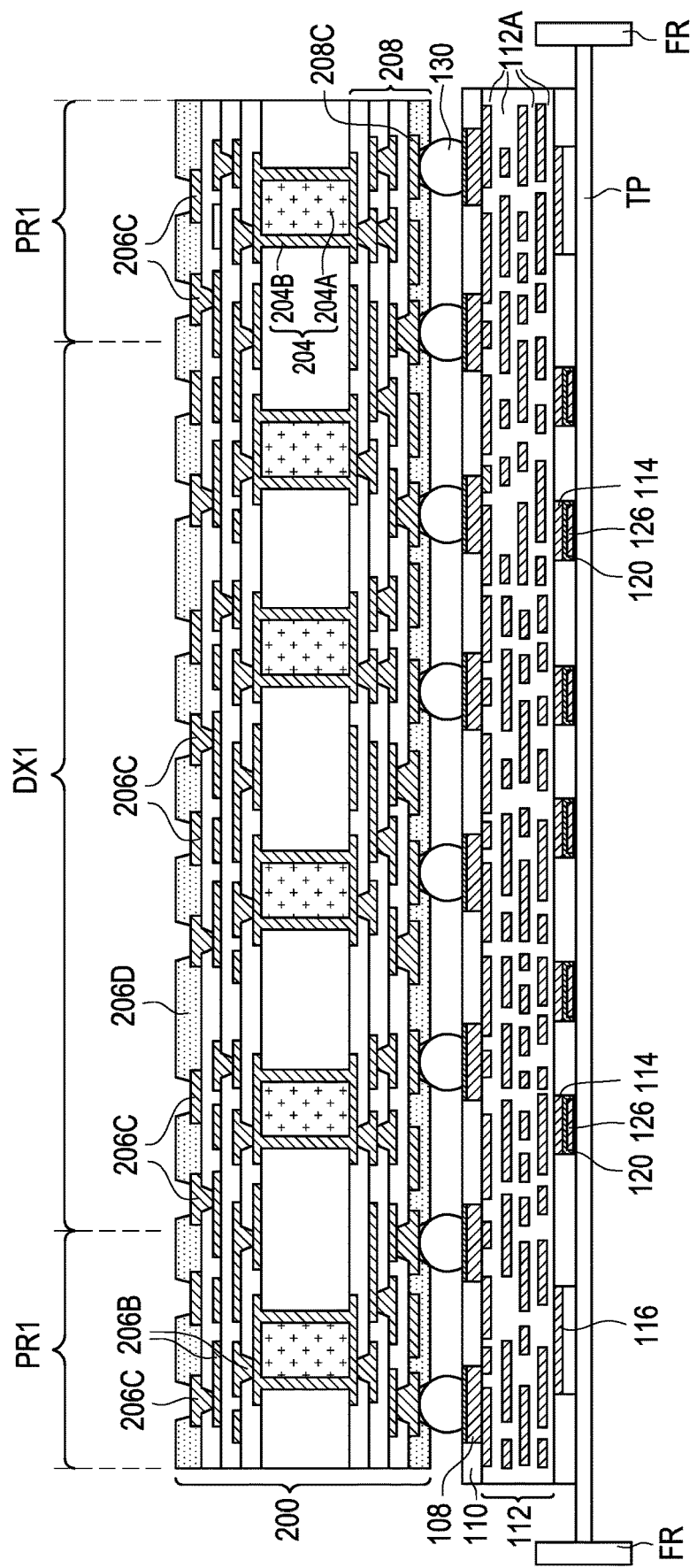
Figure 1N:
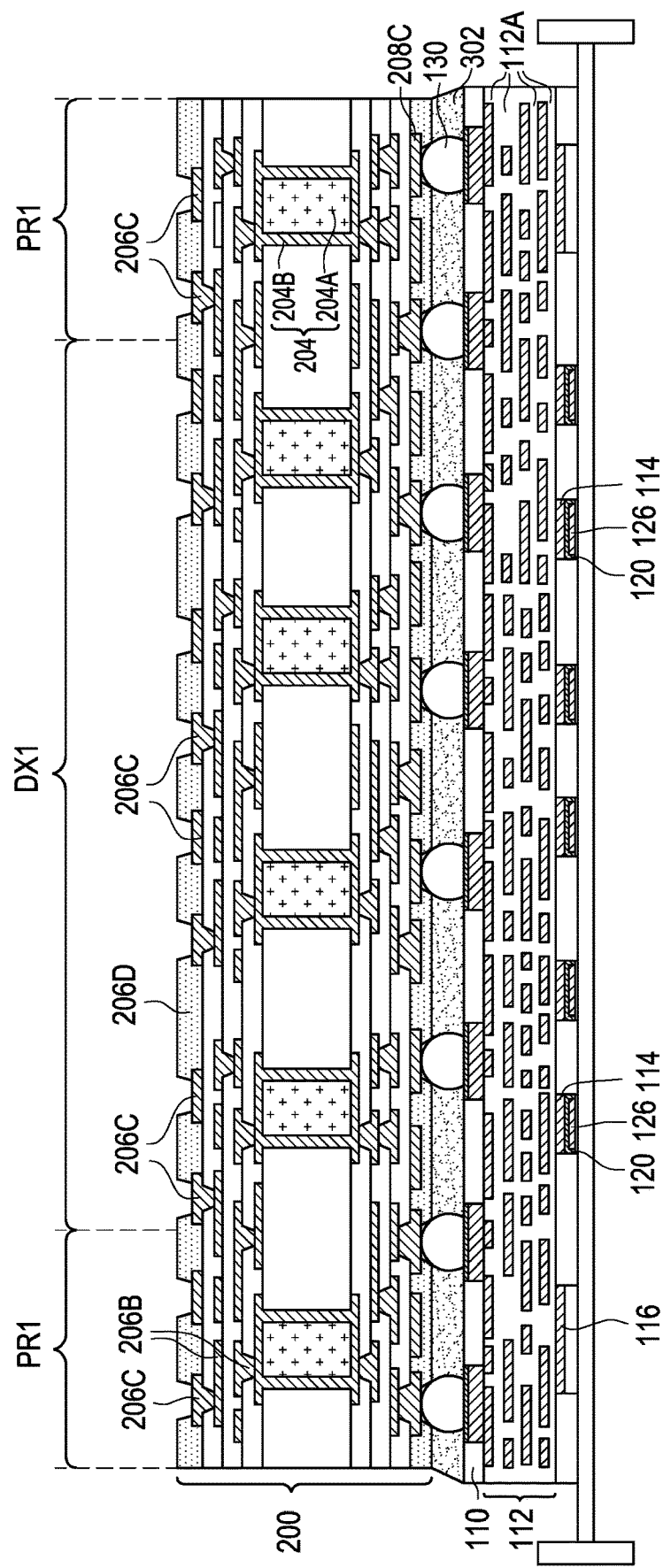
Figure 10:
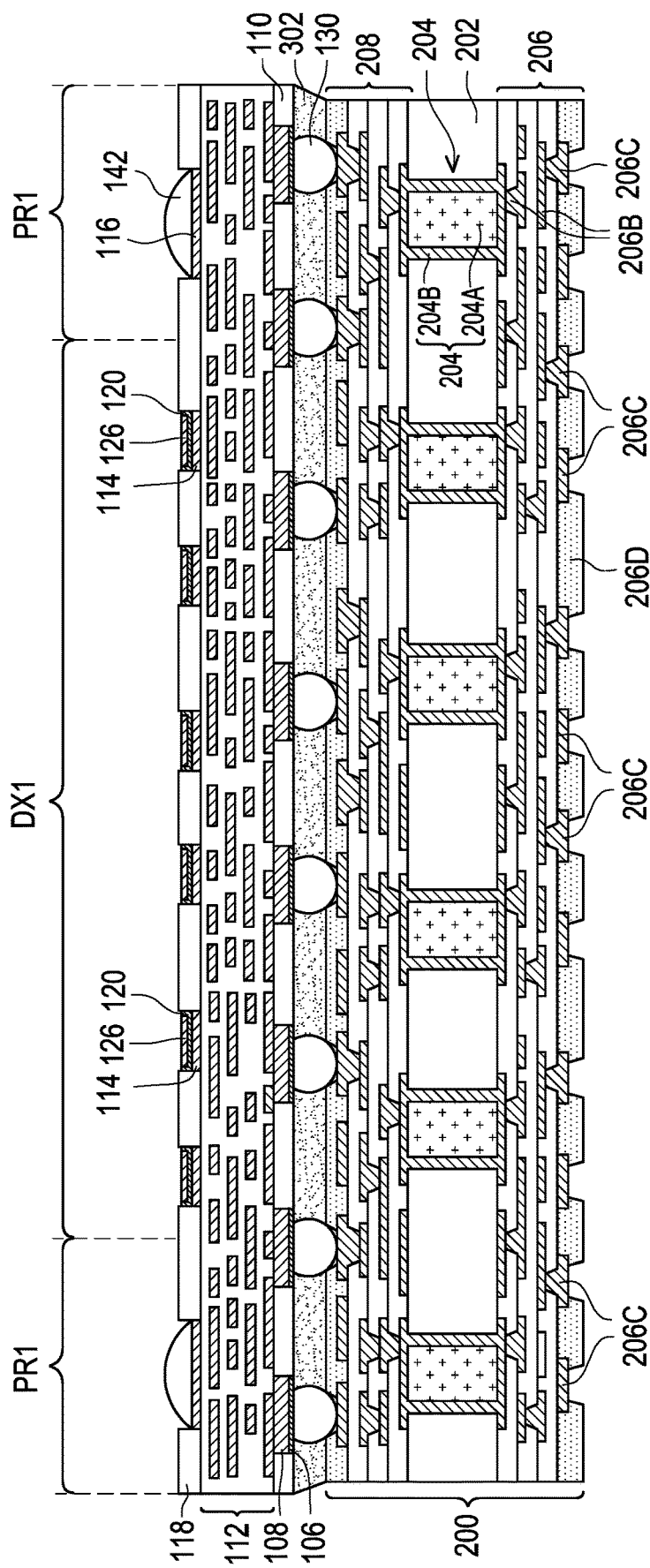
FIG. 10A and FIG. 10B are schematic sectional views of various stages in a method of fabricating a substrate structure according to some other exemplary embodiments of the present disclosure.
Figure 1P:
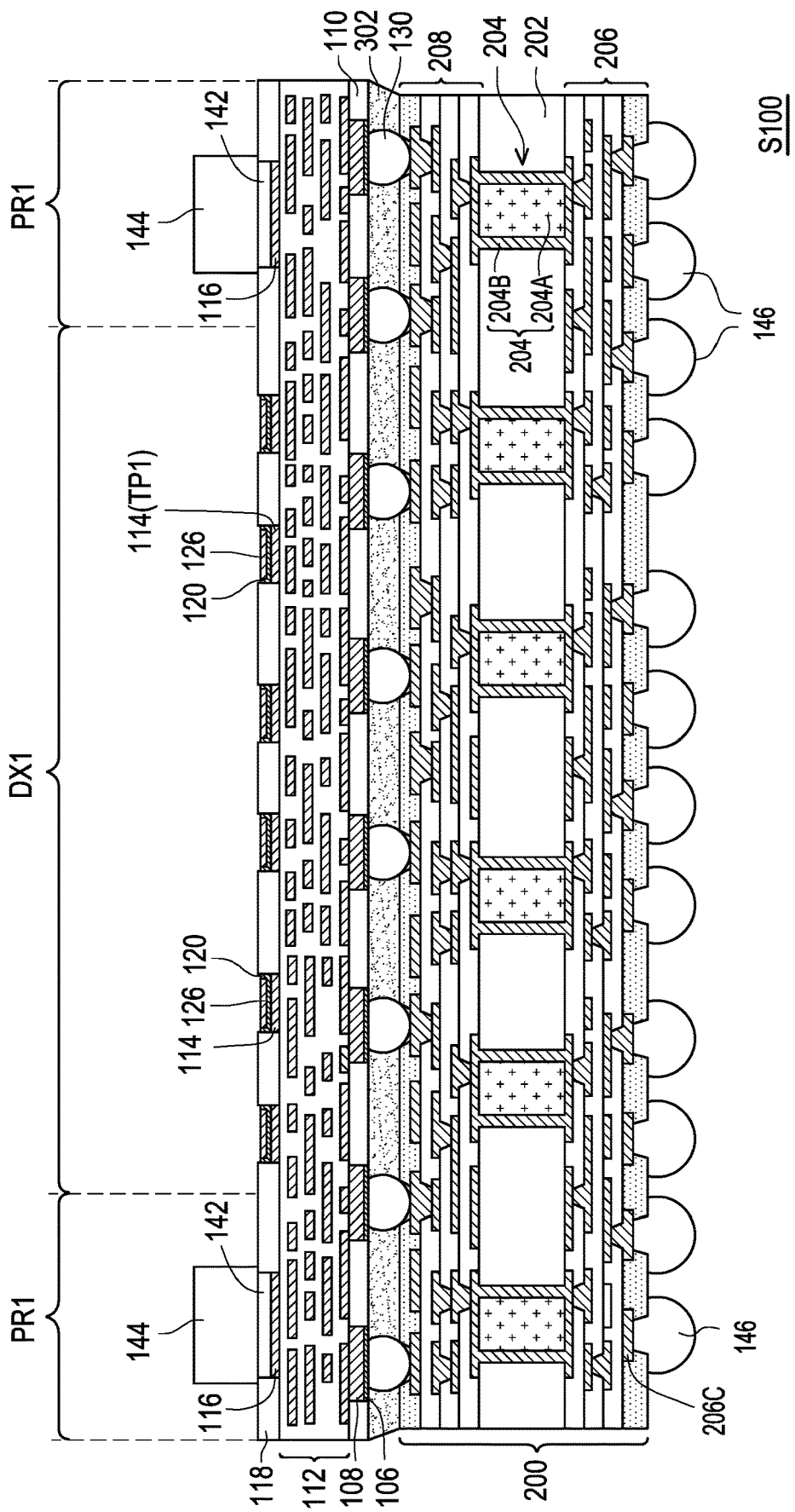

FIG. 1A to FIG. 1P are schematic sectional views of various stages in a method of fabricating a substrate structure according to some exemplary embodiments of the present disclosure. As illustrated in FIG. 1A, a carrier 102 is provided. In some embodiments, the carrier 102 may be a glass carrier, a ceramic carrier substrate, or the like. In some embodiments, the carrier 102 is coated with a debond layer 104. The material of the debond layer 104 may be any material suitable for bonding and de-bonding the carrier 102 from the above layer(s) or any wafer(s) disposed thereon.

In some embodiments, the debond layer 104 may include a dielectric material layer made of a dielectric material including any suitable polymer-based dielectric material (such as benzocyclobutene ("BCB"), polybenzoxazole ("PBO")). In an alternative embodiment, the debond layer 304 may include a dielectric material layer made of an epoxy-based thermal-release material, which loses its adhesive property when heated, such as a light-to-heat-conversion (LTHC) release coating film. In a further alternative embodiment, the debond layer 104 may include a dielectric material layer made of an ultra-violet (UV) glue, which loses its adhesive property when exposed to UV lights. In certain embodiments, the debond layer 104 may be dispensed as a liquid and cured, or may be a laminate film laminated onto the carrier 102, or may be the like. The top surface of the debond layer 104, which is opposite to a bottom surface contacting the carrier 102, may be levelled and may have a high degree of coplanarity. In certain embodiments, the debond layer 104 is, for example, a LTHC layer with good chemical resistance, and such layer enables room temperature de-bonding from the carrier 102 by applying laser irradiation, however the disclosure is not limited thereto.

In an alternative embodiment, a buffer layer (not shown) may be coated on the debond layer 104, where the debond layer 104 is sandwiched between the buffer layer and the carrier 102, and the top surface of the buffer layer may further provide a high degree of coplanarity. In some embodiments, the buffer layer may be a dielectric material layer. In some embodiments, the buffer layer may be a polymer layer which made of polyimide, PBO, BCB, or any other suitable polymer-based dielectric material. In some embodiments, the buffer layer may be Ajinomoto Buildup Film (ABF), Solder Resist film (SR), or the like. In other words, the buffer layer is optional and may be omitted based on the demand, so that the disclosure is not limited thereto.

Referring to FIG. 1B, a seed layer 106 is formed on the debond layer 04. In some embodiments, a photoresist (not shown) is formed on the seed layer 106, and have openings revealing portions of the seed layer 106. Subsequently, conductive patterns 108 are formed in the openings of the photoresist. In some embodiments, the conductive patterns 108 are formed by performing an electroplating process. In certain embodiments, the conductive patterns 108 are plated in the openings of the photoresist by using the seed layer 106 as a seed. The conductive patterns 108 may be metal pads or under-ball metallurgy (UBM) patterns. In some embodiments, the conductive patterns 108 include Cu, Ti, Ta, W, Ru, Co, Ni. Au or an alloy thereof. In certain embodiments, the conductive patterns 108 include Cu.

After forming the conductive patterns 108, the photoresist is removed, and portions of the seed layer 106 is removed by using the conductive patterns 108 as a mask. As such, the remaining seed layer 106 is located below each of the conductive patterns 108. For example, sidewalls (or edge) of the seed layer 106 is aligned with sidewalls (or edge) of the conductive patterns 108. However, in some other embodiments, the edge of the seed layer 106 is protruded out from the edge of the conductive patterns 108.

Referring to FIG. 1C, a dielectric layer 110 is formed over the debond layer 104 to cover the conductive patterns 108 and the seed layer 106. In some embodiments, the dielectric layer 110 is a polymer such as polybenzoxazole (PBO), polyimide, benzocyclobutene (BCB), or the like; a nitride such as silicon nitride or the like; an oxide such as silicon oxide, phosphosilicate glass (PSG), borosilicate glass (BSG), boron-doped phosphosilicate glass (BPSG), or the like. In certain embodiments, a planarization process is performed on the dielectric layer 110 so that a top surface of the dielectric layer 110 is substantially aligned with a top surface of the conductive patterns 108. For example, the planarization process includes a chemical mechanical polishing (CMP) process, a mechanical grinding step, or the like. In some embodiments, after the mechanical grinding or chemical mechanical polishing (CMP) steps, a cleaning step may be optionally performed. For example, the cleaning step is preformed to clean and remove the residue generated from the planarization step. However, the disclosure is not limited thereto, and the planarization step may be performed through any other suitable methods.

Referring to FIG. 1D, a redistribution layer 112 is formed above the dielectric layer 110 and over the conductive patterns 108. In some embodiments, forming the redistribution layer 112 includes forming a plurality of dielectric layers 112A and a plurality of conductive elements 112B alternately stacked. The number of layers of the dielectric layers 112A and the number of layers of the conductive elements 112B are not particularly limited, and may be adjusted based on product requirement. In some embodiments, the conductive patterns 108 are electrically connected to the conductive patterns 108 located underneath.

In some embodiments, the material of the dielectric layers 112A may be polyimide, polybenzoxazole (PBO), benzocyclobutene (BCB), a nitride such as silicon nitride, an oxide such as silicon oxide, phosphosilicate glass (PSG), borosilicate glass (BSG), boron-doped phosphosilicate glass (BPSG), a combination thereof or the like, which may be patterned using a photolithography and/or etching process. In some embodiments, the dielectric layers 112A are formed by suitable fabrication techniques such as spin-on coating, chemical vapor deposition (CVD), plasma-enhanced chemical vapor deposition (PECVD) or the like. The disclosure is not limited thereto.

In some embodiments, the material of the conductive elements 112B may be made of conductive materials formed by electroplating or deposition, such as aluminum, titanium, copper, nickel, tungsten, and/or alloys thereof, which may be patterned using a photolithography and etching process. In some embodiments, the conductive elements 112B may be patterned copper layers or other suitable patterned metal layers. Throughout the description, the term "copper" is intended to include substantially pure elemental copper, copper containing unavoidable impurities, and copper alloys containing minor amounts of elements such as tantalum, indium, tin, zinc, manganese, chromium, titanium, germanium, strontium, platinum, magnesium, aluminum or zirconium, etc.

Referring to FIG. 1E, in a subsequent step, conductive pads 114 and conductive pads 116 are formed over the redistribution layer 112. For example, the conductive pads 114 are arranged in an array and located in a device under testing (DUT) area DX1 of the redistribution layer 112, while the conductive pads 116 are located in peripheral areas PR1 located on two sides of the DUT area DX1. In the exemplary embodiment, the conductive pads 114 are test pads TP1 used in probe card application for electrical examination of a semiconductor device. For example, at later steps, the test pads TP1 may be in contact with probe pins (not shown) which are electrically connected to a semiconductor device, whereby the semiconductor device is the device under testing (DUT), or the examination target. Furthermore, as illustrated in FIG. 1E, both the conductive pads 114 in the DUT area DX1 and the conductive pads 116 in the peripheral areas PR1 are covered by a polymer layer 118. For example, the polymer layer 118 may surround the conductive pads 114, 116, and cover the top surfaces of the conductive pads 114, 116. In some embodiments, a material of the conductive pads 114, 116 is similar to a material of the conductive elements 112B. In certain embodiments, a material of the polymer layer 118 is polyimide, or the like.

Referring to FIG. 1F, in some embodiments, the polymer layer 118 is patterned to form first openings OP1 and second openings OP2. For example, the first openings OP1 reveal the conductive pads 114 (or test pads TP1) located in the DUT area DX1, while the second openings OP2 reveal the conductive pads 116 located in the peripheral area PR1. In some embodiments, a width of the first openings OP1 is smaller than a width of the second openings OP2. However, the disclosure is not limited thereto, and the widths of the first openings OP1 and the second openings OP2 may be adjusted based on actual design requirements.

Referring to FIG. 1G, in some embodiments, a seed layer 120 is conformally formed over the polymer 118 within the first openings OP1 and the second openings OP2. For example, the seed layer 120 is formed in the first openings OP1 to contact the conductive pads 114 (test pads TP1), and is formed in the second openings OP2 to contact the conductive pads 116. In some embodiments, the seed layer 120 is a metal layer, which may be a single layer or a composite layer comprising a plurality of sub-layers formed of different materials. The seed layer 120 may be, for example, a titanium layer and a copper layer over the titanium layer. In certain embodiments, the seed layer 120 may be formed using, for example, physical vapor deposition (PVD) or the like.

Referring to FIG. 1H, in a subsequent step, a photoresist 124 is formed on the redistribution layer 112 over the seed layer 120. For example, the photoresist 124 is formed to cover the conductive pads 116, while exposing an area corresponding to the conductive pads 114 (the test pads TP1), and exposing portions of the seed layer 120. In some embodiments, the photoresist 124 is patterned to form openings, which corresponds to the first openings OP1 of the polymer layer 118. The photoresist 124 may be formed by spin coating or the like and may be exposed to light for patterning.

In some embodiments, a first protective coating 126 is formed on the conductive pads 114 (test pads TP1) through the first openings OP1 and through the openings of the photoresist 124. In certain embodiments, the seed layer 120 is sandwiched between the first protective coating 126 and the conductive pads 114. The first protective coating 126 may be formed by plating, such as electroplating or electroless plating, or the like. In some embodiments, the first protective coating 126 is made of a conductive material. In the exemplary embodiment, the first protective coating 126 is a gold (Au) layer. In the illustrated embodiment, a top surface of the first protective coating 126 is located below a top surface of the polymer layer 118. However, the disclosure is not limited thereto. In alternative embodiments, top surfaces of the first protective coating 126 and the polymer layer 118 may be aligned.

Referring to FIG. 1I, in some embodiments, the photoresist 124 is removed or stripped off. The photoresist 124 may be removed by an acceptable ashing or stripping process, such as using an oxygen plasma or the like. Furthermore, once the photoresist 124 is removed, the seed layer 120 is etched so that portions of the seed layer 120 located on the top surface of the polymer layer 118 and within the second openings OP2 are removed. In some embodiments, the seed layer 120 located in the first opening OP1 of the DUT area DX1 and below the first protective coating 126 is retained after the seed layer etching step. In certain embodiments, portions of the seed layer 120 not covered by the first protective coating 126 are removed by using an acceptable etching process, such as by wet or dry etching. In some embodiments, tops of the etched seed layer 120 are aligned with top surfaces of the first protective coating 126. In some embodiments, the etched seed layer 120 is arranged in a U-shaped manner in each of the first openings OP1 of the polymer layer 118. In certain embodiments, the top surface of the polymer layer 118 is slightly higher than tops of the first protective coating 126 and tops of the etched seed layer 120. In some other embodiments, the top surface of the polymer layer 118 may be aligned with the tops of the first protective coating 126 and tops of the etched seed layer 120.

Referring to FIG. 1J, the structure illustrated in FIG. 1I is turned upside down and attached to a tape TP (e.g., a dicing tape) supported by a frame FR. As illustrated in FIG. 1J, the carrier 102 is debonded and is separated from the dielectric layer 110. In some embodiments, the de-bonding process includes projecting a light such as a laser light or an UV light on the debond layer 104 (e.g., the LTHC release layer) so that the carrier 102 can be easily removed along with the debond layer 104. During the de-bonding step, the tape TP is used to secure the structure before de-bonding the carrier 102 and the debond layer 104. After the de-bonding process, the seed layer 106 and a backside of the dielectric layer 110 may be revealed or exposed. In some other embodiments, the seed layer 106 may be removed to reveal the conductive patterns 108 underneath.

Referring to FIG. 1K, in some embodiments, a plurality of conductive connectors 130 is formed on the seed layer 106 over the conductive patterns 108. The conductive connectors 130 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 130 may include a conductive material such as solder, copper, aluminum, gold, nickel, silver, palladium, tin, the like, or a combination thereof.

Referring to FIG. 1L, in some embodiments, a core substrate 200 is provided. The core substrate 200 is used for bonding to the redistribution layer 112 illustrated in FIG. 1K. In some embodiments, the core substrate 200 includes a core material 202, conductive vias 204, a first redistribution structure 206 and a second redistribution structure 208. The core material 202 include one or more layers of glass fiber, resin, filler, pre-preg, epoxy, silica filler, Ajinomoto Build-up Film (ABF), polyimide, molding compound, other materials, and/or combinations thereof. The core material 202 may be formed of organic materials and/or inorganic materials. In some embodiments, the core material 202 may include two or more layers of material. In some embodiments, the core material 202 includes one or more passive components (not shown) embedded therein. The core material 202 may comprise other materials or components. The core material 202 has a first surface 202A and a second surface 202B opposite to the first surface 202A.

As illustrated in FIG. 1L, the conductive vias 204 extends through the core material 202 from the first surface 202A to the second surface 202B. For example, the conductive vias 204 may include a fill material 204A and a conductive coating 204B surrounding the fill material 204A. In some embodiments, the fill material 204A is an insulating fill material, while the conductive coating 204B include conductive materials such as copper, a copper alloy, or other conductors. In some embodiments, the conductive vias 204 provide vertical electrical connections from one side of the core material 202 to the other side of the core material 202. For example, the conductive vias 204 may be electrically connected to the first redistribution structure 206 and the second redistribution structure 208. In some embodiments, the conductive vias 204 is formed in the core material 202 using a drilling process, photolithography, a laser process, or another suitable technique to form an opening. Thereafter, the opening may be filled or plated with the conductive coating 204B, and further filled with the fill material 204A.

In some embodiments, the first redistribution structure 206 is formed on the first surface 202A of the core material 202. The first redistribution structure 206 includes a plurality of dielectric layers 206A and a plurality of conductive elements 206B alternately stacked. In some embodiments, the second redistribution structure 208 is formed on the second surface 202B of the core material 202. In a similar way, the second redistribution structure 208 includes a plurality of dielectric layers 208A and a plurality of conductive elements 208B alternately stacked. The materials of the dielectric layers 206A, 208A and the conductive elements 208A, 208B may be similar to the materials of the dielectric layers 112A and the conductive elements 112B of the redistribution layer 112. Therefore, the details will be omitted herein.

In some embodiments, the first redistribution structure 206 includes conductive pads 206C for external connection, and solder resists 206D for protecting the features of the first redistribution structure 206. Similarly, the second redistribution structure 208 include conductive pads 208C for external connection, and solder resists 208D for protecting the features of the second redistribution structure 208. In some embodiments, the first redistribution structure 206 and the second redistribution structure 208 may have more or fewer number of layers of the dielectric layers 206A, 208A and the conductive elements 208A than shown in FIG. 1L.

Turning to FIG. 1M, in some embodiments, the core substrate 200 shown in FIG. 1L is bonded or attached to the redistribution layer 112 shown in FIG. 1K. For example, the core substrate 200 is electrically connected to the redistribution layer 112 through the conductive connectors 130 and the conductive patterns 108. A reflowing process may be performed so that the conductive connectors 130 are physically and electrically coupled to the conductive pads 208C of the second redistribution structure 208 of the core substrate 200.

Referring to FIG. 1N, in a subsequent step, an underfill material 302 is formed between the core substrate 200 and the redistribution layer 112. In certain embodiments, the underfill material 302 fill up the spaces in between the core substrate 200 and the dielectric layer 110. For example, the underfill material 302 is covering the conductive connectors 130. The underfill material 302 may be a molding compound, epoxy, underfill, molding underfill (MUF), resin or the like. Referring to FIG. 1O, in some embodiments, the structure shown in FIG. 1N is flipped upside down, and a conductive paste 142 such as solder paste, silver paste, or the like, is dispensed by a printing process on the conductive pads 116 in the peripheral areas PR1.

In some embodiments, the structure shown in FIG. 1O correspond to one testing unit cell of the substrate structure. However, it is noted that there may be a plurality of testing unit cells arranged in the substrate structure. In certain embodiments, the entire wafer or substrate may be diced or singulated (e.g. by cutting through the redistribution layer 112 and the core substrate 200 as shown in FIG. 1N) to separate the unit cells into different groups.

Referring to FIG. 1P, after forming the conductive paste 142, passive devices 144 (integrated passive device or surface mount devices) may be mounted on the redistribution layer 112 in the peripheral areas PR1. For example, the passive devices 144 are electrically connected to the conductive pads 116 through the conductive paste 142. In some embodiments, the passive devices 144 are multi-layer ceramic capacitors (MLCC), or the like. Subsequently, a plurality of conductive terminals 146 may be formed on the first redistribution structure 206 of the core substrate 200. For example, the conductive terminals 146 may be electrically connected to the conductive pads 206C of the first redistribution structure 206. In some embodiments, the conductive terminals 146 are ball grid array (BGA) connectors, solder balls, metal pillars, controlled collapse chip connection (C4) bumps, micro bumps, electroless nickel-electroless palladium-immersion gold technique (ENEPIG) formed bumps, or the like.

After forming the conductive terminals 146, a substrate structure S100 in accordance with some embodiments of the present disclosure is accomplished. In some embodiments, the substrate structure S100 is a probe card substrate used in probe card applications. For example, in certain embodiments, probe pins (not shown) are further disposed to make contact with the first protective coating 126 over the conductive pads 114 (test pads TP1). The probe pins may be electrically connected to a device under testing (DUT) or examination target for electrical examination.

FIG. 2A to FIG. 2K are schematic sectional views of various stages in a method of fabricating a substrate structure according to some other exemplary embodiments of the present disclosure. The method illustrated in FIG. 2A to FIG. 2K is similar to the method illustrated in FIG. 1A to FIG. 1P, therefore, the same reference numerals are used to refer to the same or like parts, and its detailed description will be omitted herein.

As illustrated in FIG. 2A, the same steps described in FIG. 1A to FIG. 1E may be performed to form the conductive patterns 108, the dielectric layer 110, the redistribution layer 112, the conductive pads 114, 116 and the polymer layer 118 over the carrier 102. Referring to FIG. 2B, the seed layer 120 is formed over the substantially planar top surface of the polymer layer 118. For example, the seed layer 120 may be a titanium layer and a copper layer over the titanium layer, or the like. Subsequently, a photoresist 124 is formed on the redistribution layer 112 over the seed layer 120. The photoresist 124 is patterned to form openings revealing the seed layer 120, whereby the openings may correspond to positions of the conductive pads 114, 116.

Referring to FIG. 2C, in some embodiments, conductive pads 115 and conductive pads 117 are formed on the seed layer 120 and over the polymer layer 118. For example, the conductive pads 115 are arranged in an array and located in a device under testing (DUT) area DX1 over the redistribution layer 112, while the conductive pads 117 are located in peripheral areas PR1 located on two sides of the DUT area DX1. In the exemplary embodiment, the conductive pads 115 are test pads TP1 used in probe card application for electrical examination of a semiconductor device. The conductive pads 115 and conductive pads 117 may be electrically connected to the redistribution layer 112 for transmitting electrical signals to the below components. In the exemplary embodiment, materials of the conductive pads 115, 117 are similar to the materials of the conductive pads 114, 116, thus its details will not be repeated herein.

As further illustrated in FIG. 2C, in some embodiments, a first protective coating 126 is formed over the conductive pads 115 (test pads TP1) and over the conductive pads 117. For example, the first protective coating 126 is disposed on the polymer layer 118 and over the seed layer 120. The first protective coating 126 cover side surfaces and top surfaces of the conductive pads 115 (test pads TP1), and cover side surfaces and top surfaces of the conductive pads 117. In certain embodiments, the first protecting coating 126 may be joined with the seed layer 120 located below the conductive pads 115, 117. The first protective coating 126 may be formed by plating, such as electroplating or electroless plating, or the like. In some embodiments, the first protective coating 126 is made of a conductive material. In the exemplary embodiment, the first protective coating 126 is a nickel (Ni) layer.

Figure 2E:
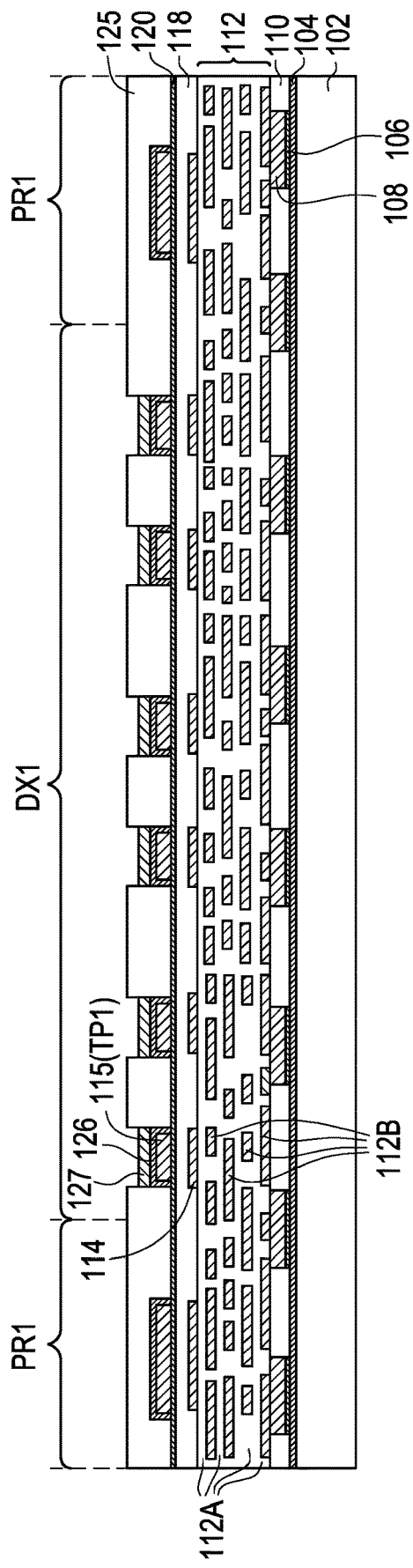

Referring to FIG. 2D, in a subsequent step, a photoresist 125 is formed over the seed layer 120. For example, the photoresist 125 is formed to cover the conductive pads 117 located in the peripheral areas PR1. In some embodiments, the photoresist 125 is patterned to form openings exposing the conductive pads 115 (test pads TP1) having the first protective coating 126 coated thereon. The photoresist 125 may be formed by spin coating or the like and may be exposed to light for patterning. Referring to FIG. 2E, in some embodiments, a second protective coating 127 may be formed over the first protective coating 126. For example, the second protective coating 127 is formed on the top surface of the first protective coating 126 through the openings of the photoresist 125. In some embodiments, the second protective coating 127 is formed by plating, such as electroplating or electroless plating, or the like. Furthermore, the second protective coating 127 is made of a conductive material. In the exemplary embodiment, when the first protective coating 126 is a nickel (Ni) layer, then the second protective coating 127 is a gold (Au) layer, for example.

Figure 2F:
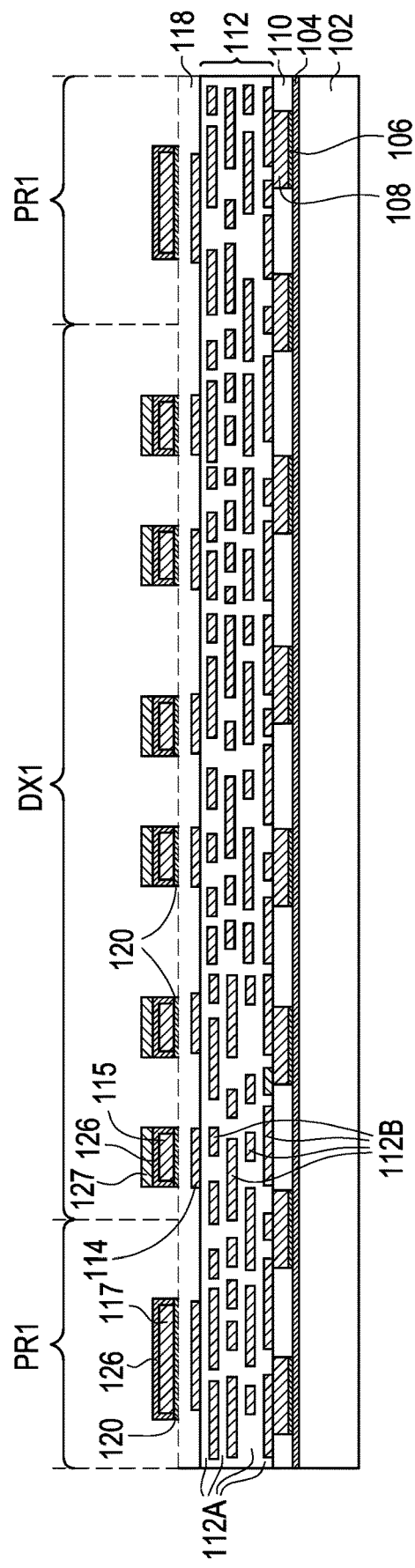

Referring to FIG. 2F, after forming the second protective coating 127, the photoresist 125 is removed or stripped off. The photoresist 125 may be removed by an acceptable ashing or stripping process, such as using an oxygen plasma or the like. Furthermore, once the photoresist 125 is removed, the seed layer 120 is etched so that portions of the seed layer 120 not covered by the conductive pads 115, 117 are removed. As illustrated in FIG. 2F, after the seed layer etching step, the second protective coating 127 is located in the DUT area DX1 over the etched seed layer 120. For example, the second protective coating 127 is located on the conductive pads 115 (test pads TP1) and on the first protective coating 126 in the DUT area DX1 over the etched seed layer 120. Furthermore, in some embodiments, the sidewalls of the second protective coating 127, the sidewalls of the first protective coating 126 and the sidewalls of the seed layer 120 are aligned with one another.

Figure 2G:
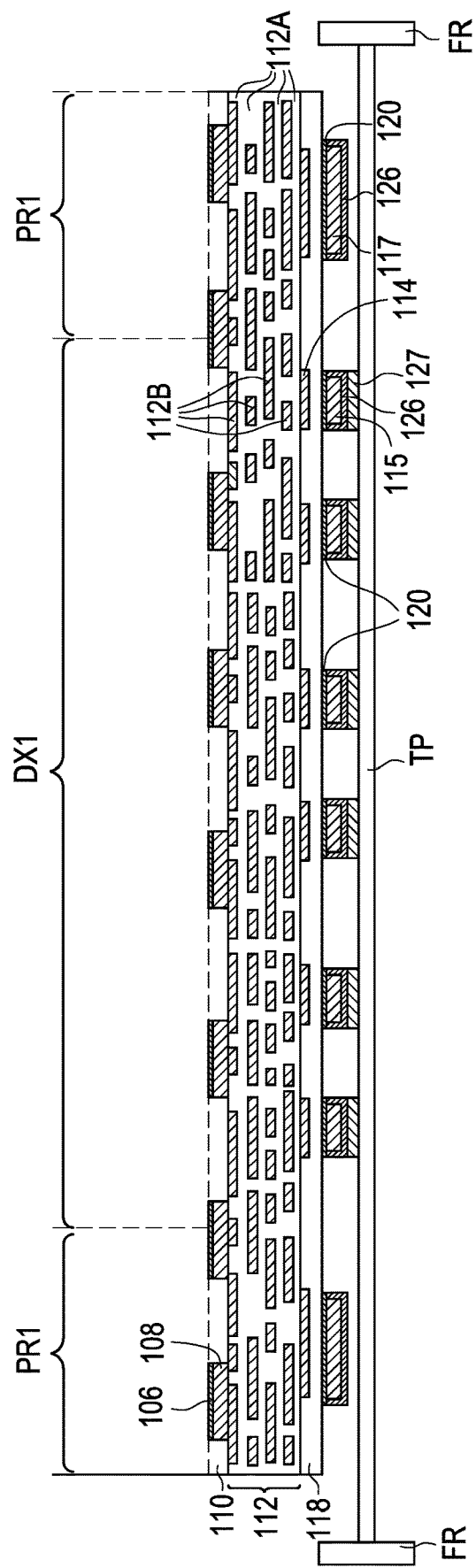

Referring to FIG. 2G, the structure illustrated in FIG. 2G is turned upside down and attached to a tape TP (e.g., a dicing tape) supported by a frame FR. As illustrated in FIG. 2G, the carrier 102 is debonded and is separated from the dielectric layer 110. In some embodiments, the de-bonding process includes projecting a light such as a laser light or an UV light on the debond layer 104 (e.g., the LTHC release layer) so that the carrier 102 can be easily removed along with the debond layer 104. After the de-bonding process, the seed layer 106 and a backside of the dielectric layer 110 may be revealed or exposed. In some other embodiments, the seed layer 106 may be removed to reveal the conductive patterns 108 underneath.

Figure 2H:
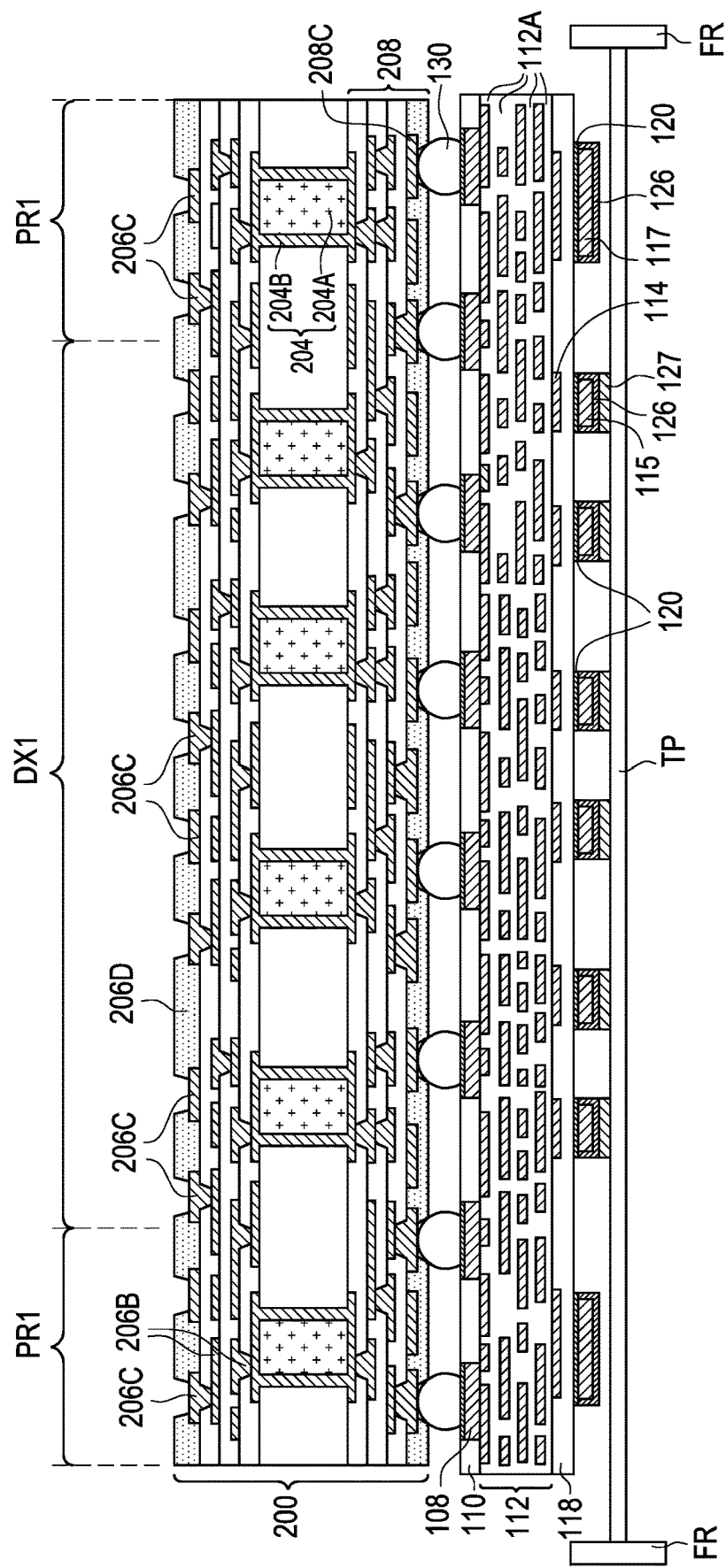

Referring to FIG. 2H, in some embodiments, a plurality of conductive connectors 130 is formed on the seed layer 106 over the conductive patterns 108. Subsequently, the core substrate 200 shown in FIG. 1L is bonded or attached to the redistribution layer 112 shown in FIG. 2G. For example, the core substrate 200 is electrically connected to the redistribution layer 112 through the conductive connectors 130 and the conductive patterns 108. A reflowing process may be performed so that the conductive connectors 130 are physically and electrically coupled to the conductive pads 208C of the second redistribution structure 208 of the core substrate 200.

Figure 2I:
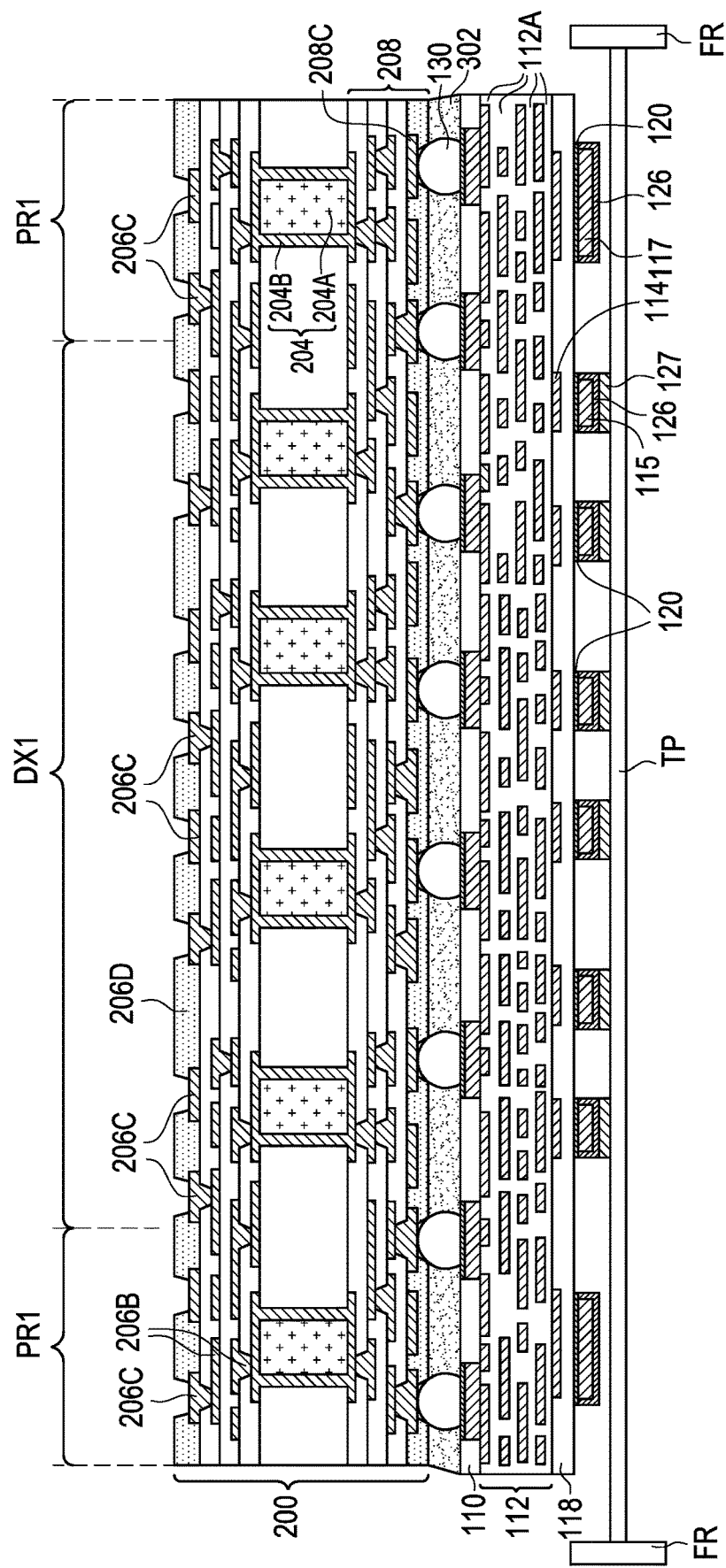
Figure 2J:
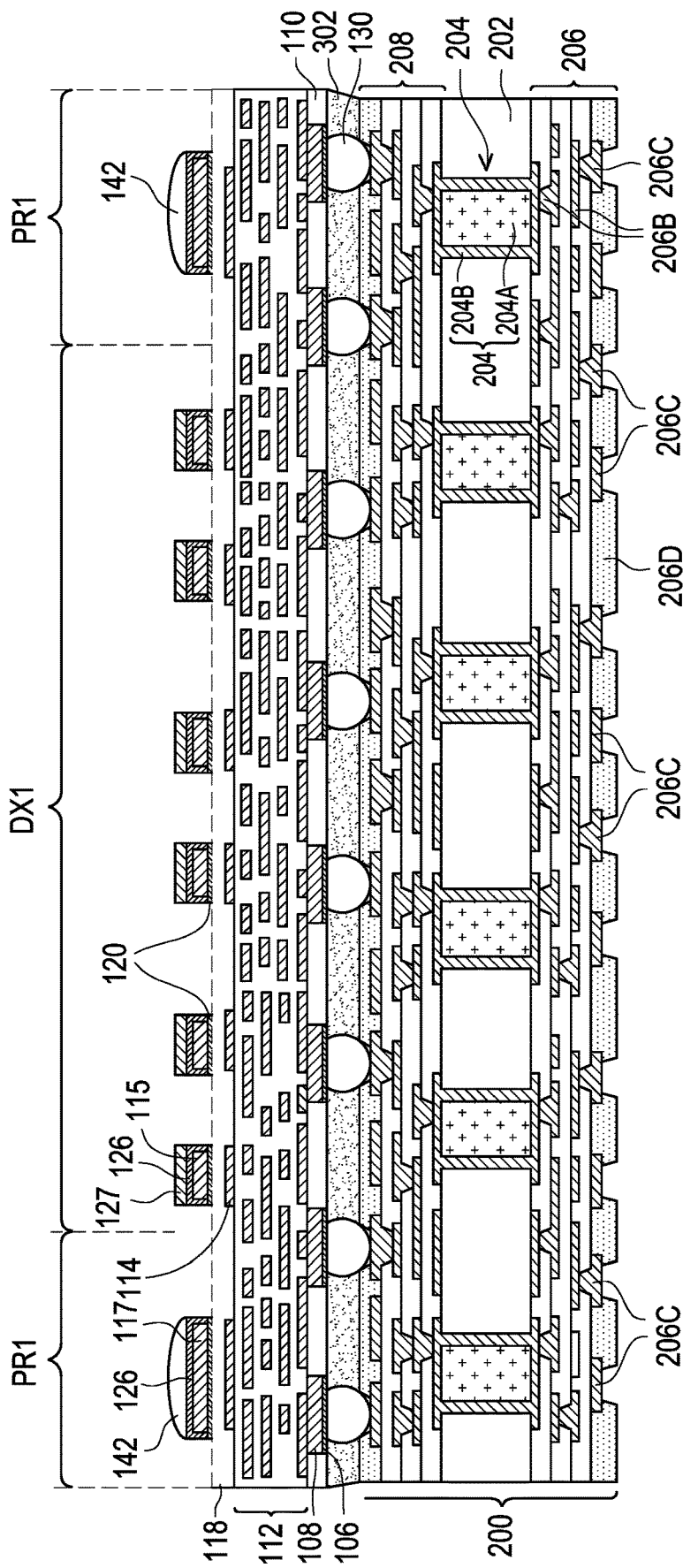

Referring to FIG. 2I, in a subsequent step, an underfill material 302 is formed between the core substrate 200 and the redistribution layer 112. In certain embodiments, the underfill material 302 fill up the spaces in between the core substrate 200 and the dielectric layer 110. Referring to FIG. 2J, in some embodiments, the structure shown in FIG. 2I is flipped upside down, and a conductive paste 142 such as solder paste, silver paste, or the like, is dispensed by a printing process on the conductive pads 116 in the peripheral areas PR1. A dicing process may be performed as necessary to separate the entire wafer or substrate into a certain number of unit cells per group (where FIG. 2J shows one unit cell).

Figure 2K:
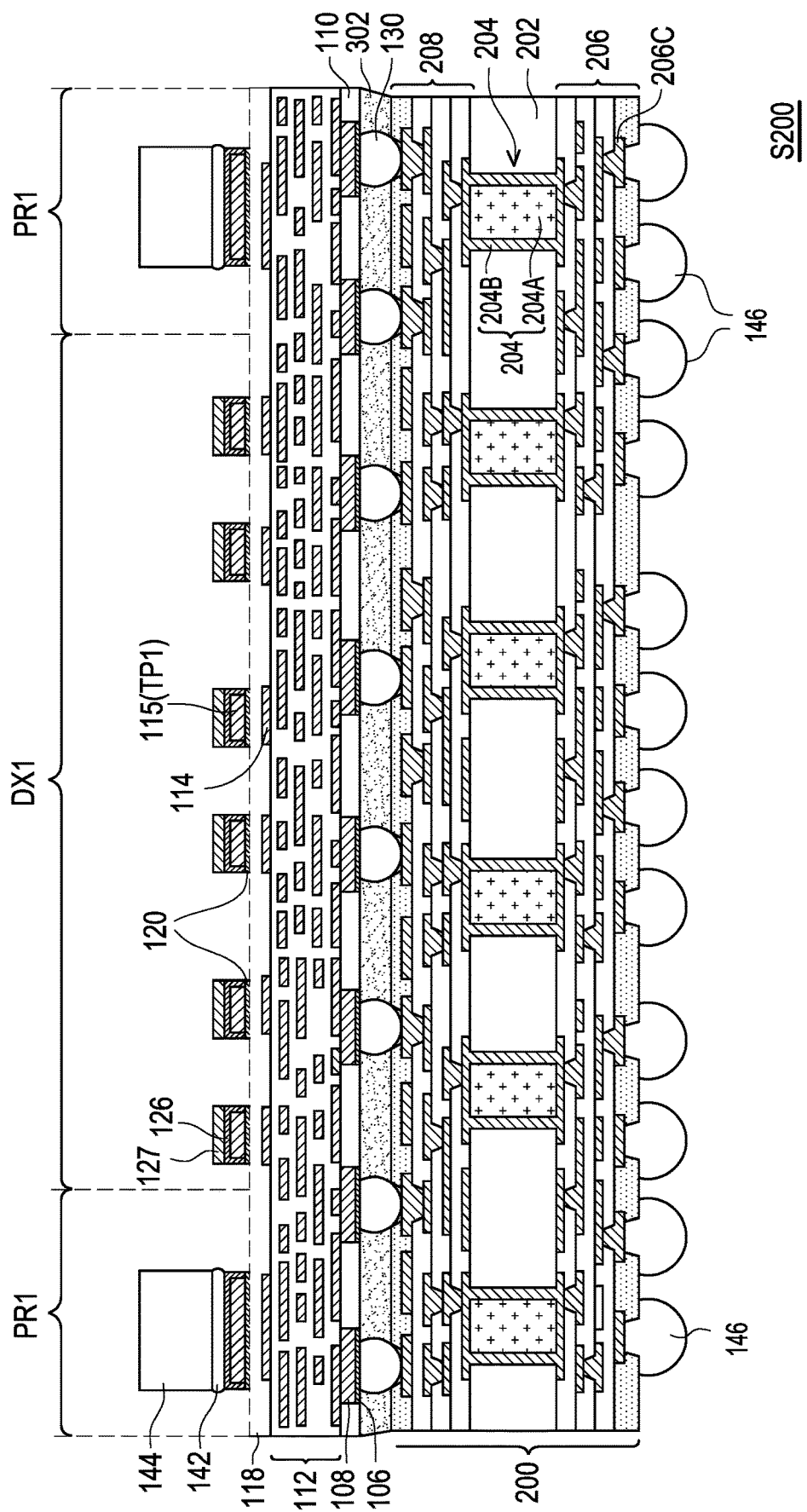

Referring to FIG. 2K, after forming the conductive paste 142, passive devices 144 (integrated passive device or surface mount devices) may be mounted on the redistribution layer 112 in the peripheral areas PR1 over the conductive paste 142. Subsequently, a plurality of conductive terminals 146 may be formed on the first redistribution structure 206 of the core substrate 200. For example, the conductive terminals 146 may be electrically connected to the conductive pads 206C of the first redistribution structure 206.

After forming the conductive terminals 146, a substrate structure S200 in accordance with some embodiments of the present disclosure is accomplished. In some embodiments, the substrate structure S200 is a probe card substrate used in probe card applications. For example, in certain embodiments, probe pins (not shown) are further disposed to make contact with the first protective coating 126 over the conductive pads 115 (test pads TP1). The probe pins may be electrically connected to a device under testing (DUT) or examination target for electrical examination.

Figure 3C:
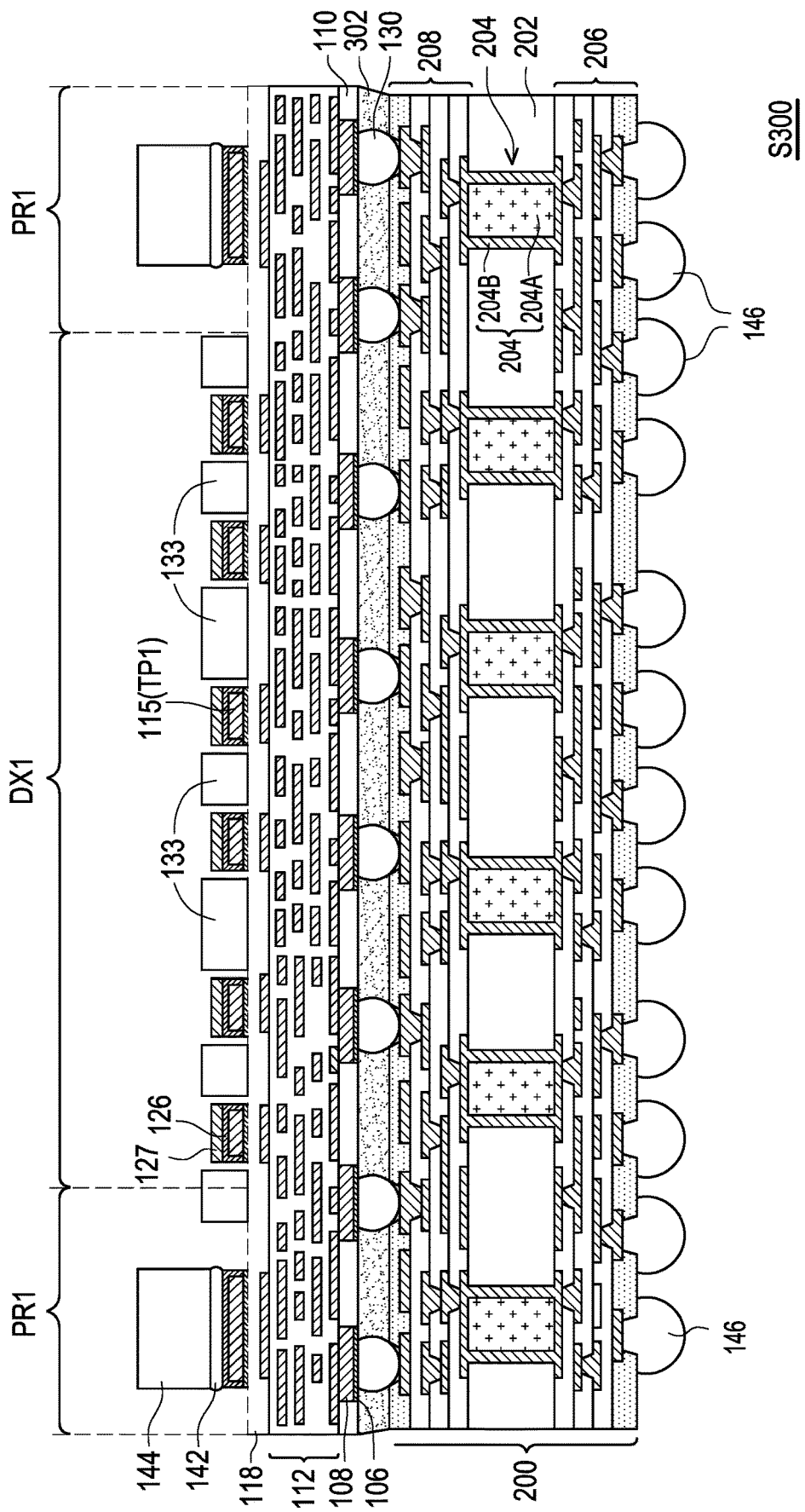

FIG. 3A to FIG. 3C are schematic sectional views of various stages in a method of fabricating a substrate structure according to some other exemplary embodiments of the present disclosure. The method illustrated in FIG. 3A to FIG. 3C is similar to the method illustrated in FIG. 2A to FIG. 2K, therefore, the same reference numerals are used to refer to the same or like parts, and its detailed description will be omitted herein.

As illustrated in FIG. 3A, the same steps described in FIG. 2A to FIG. 2F may be performed to form the conductive pads 115, 117 on the seed layer 120 and over the polymer layer 118, and to form the first protective coating 126 on the conductive pads 115 (test pads TP1). Referring to FIG. 3B, in some embodiments, a pad layer 133 is formed on the redistribution layer 112 to separate the plurality of conductive pads 115 (test pads TP1) from one another. In some embodiments, the pad layer 133 is a non-solder mask defined (NSMD) pad. In other words, the pad layer 133 does not contact the conductive pads 115 (test pads TP1) and the first protective coating 126. Instead, the pad layer 133 is spaced apart from the conductive pads 115 (test pads TP1) and the first protective coating 126.

Subsequently, the same steps described in FIG. 2G to FIG. 2K may be performed to form the substrate structure S300 shown in FIG. 3C. In some embodiments, the substrate structure S300 is a probe card substrate used in probe card applications. For example, in certain embodiments, probe pins (not shown) are further disposed to make contact with the second protective coating 127 over the conductive pads 115 (test pads TP1). The probe pins may be electrically connected to a device under testing (DUT) or examination target for electrical examination.

FIG. 4A to FIG. 4K are schematic sectional views of various stages in a method of fabricating a substrate structure according to some other exemplary embodiments of the present disclosure. The method illustrated in FIG. 4A to FIG. 4K is similar to the method illustrated in FIG. 1A to FIG. 1P, therefore, the same reference numerals are used to refer to the same or like parts, and its detailed description will be omitted herein.

Figure 4A:
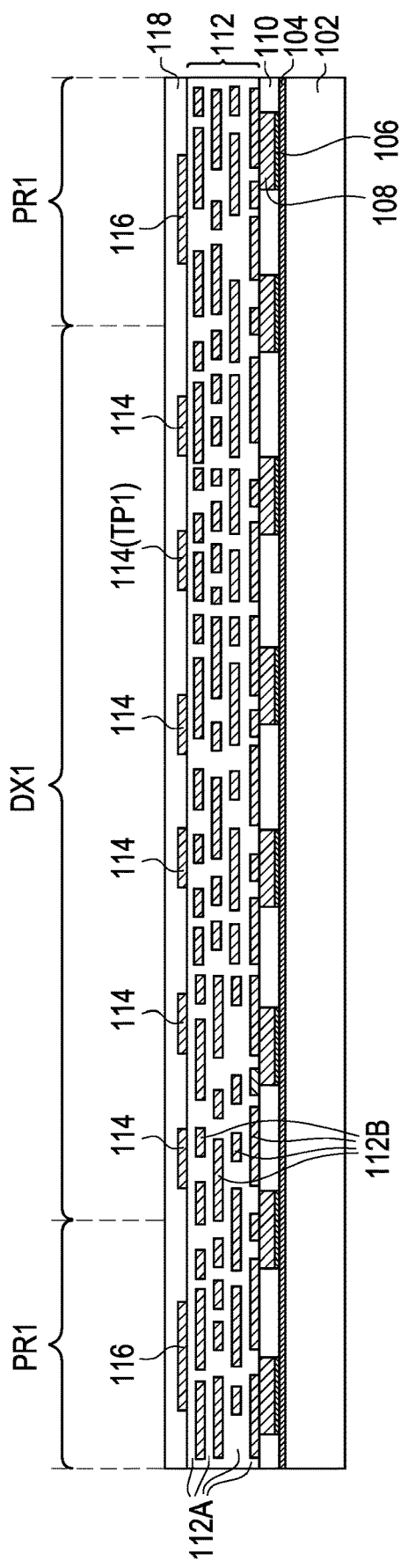
Figure 4B:
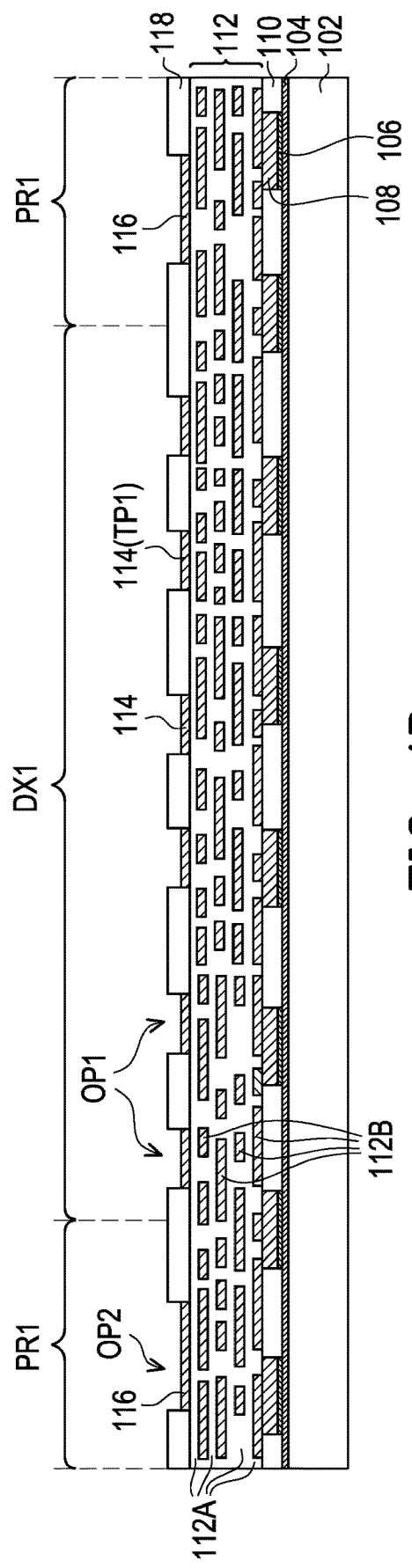

As illustrated in FIG. 4A, the same steps described in FIG. 1A to FIG. 1E may be performed to form the conductive patterns 108, the dielectric layer 110, the redistribution layer 112, the conductive pads 114, 116 and the polymer layer 118 over the carrier 102. Referring to FIG. 4B, in some embodiments, the polymer layer 118 is patterned to form first openings OP1 and second openings OP2. For example, the first openings OP1 reveal the conductive pads 114 (or test pads TP1) located in the DUT area DX1, while the second openings OP2 reveal the conductive pads 116 located in the peripheral area PR1.

Referring to FIG. 4C, in some embodiments, a first protective coating 126 is conformally formed over the polymer 118 within the first openings OP1 and the second openings OP2. For example, the first protective coating 126 is formed in the first openings OP1 to contact the conductive pads 114 (test pads TP1), and is formed in the second openings OP2 to contact the conductive pads 116. In the exemplary embodiment, the first protective coating 126 is a hard layer made by sputtering titanium (Ti), nickel (Ni), vanadium (V) and gold (Au), for example.

Referring to FIG. 4D, in a subsequent step, a photoresist 124 is formed on the first protective coating 126 over the redistribution layer 112. For example, the photoresist 124 is formed on the first protective coating 126 in the DUT area DX1 to cover the conductive pads 114 (or test pads TP1). In some embodiments, the photoresist 124 is patterned to form openings that reveal portions of the first protective coating 126 in the peripheral area PR1, and to reveal portions of the first protective coating 126 in the DUT area DX1.

Figure 4E:
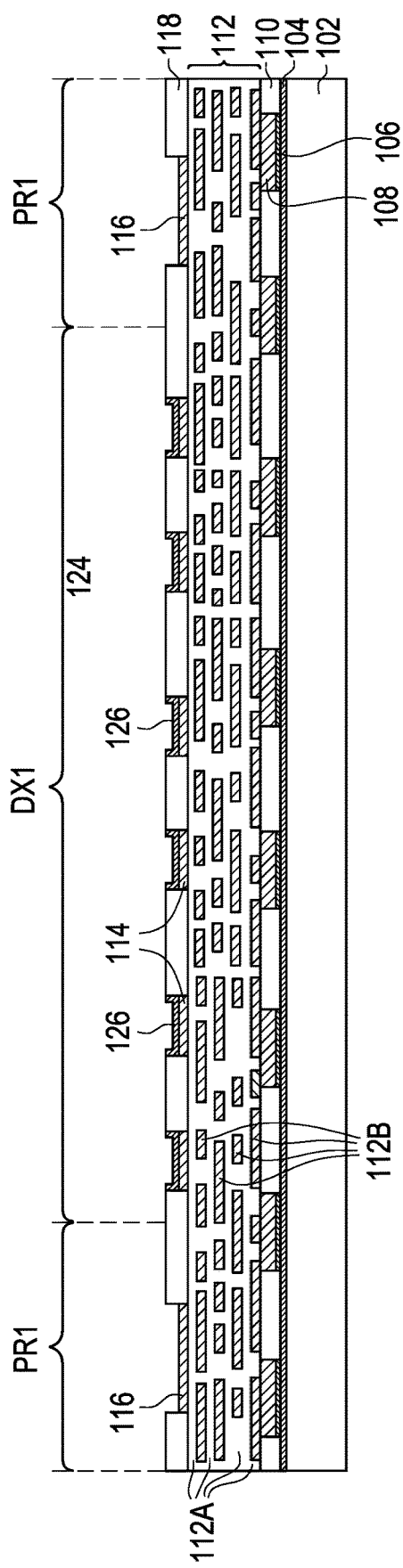

Referring to FIG. 4E, in some embodiments, portions of the first protective coating 126 not covered by the photoresist 124 may be removed or etched. For example, the first protective coating 126 is etched to reveal the conductive pads 116. In some embodiments, tops of the etched first protective coating 126 is aligned with a top surface of the polymer layer 118. In certain embodiments, the etched first protective coating 126 is arranged in a U-shaped manner in each of the first openings OP1 of the polymer layer 118. Thereafter, the photoresist 124 may be stripped off or removed.

Figure 4F:
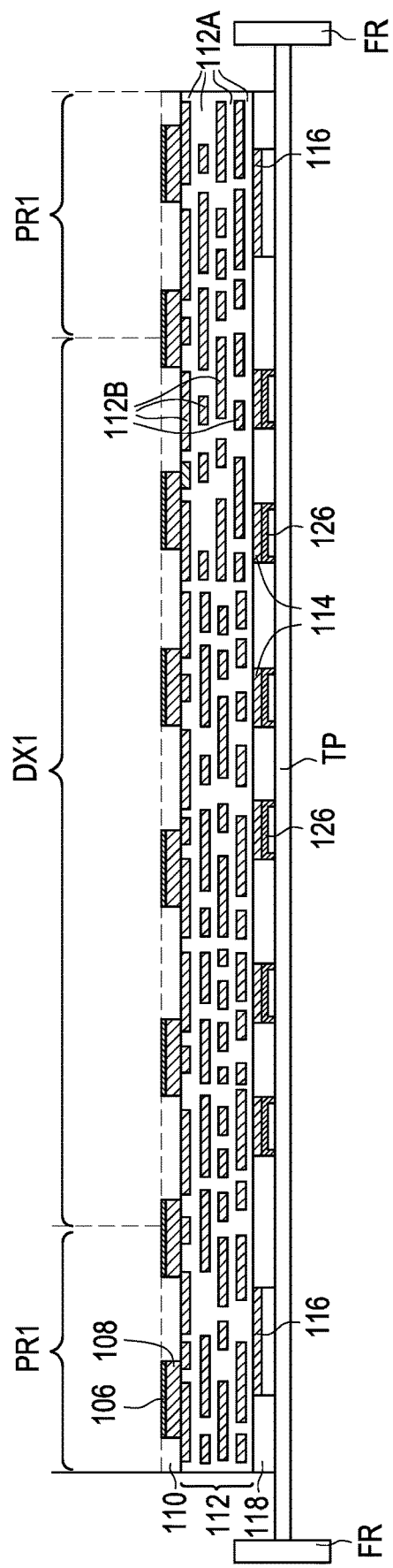

Referring to FIG. 4F, the structure illustrated in FIG. 4E is turned upside down and attached to a tape TP (e.g., a dicing tape) supported by a frame FR. As illustrated in FIG. 4F, the carrier 102 is debonded and is separated from the dielectric layer 110. In some embodiments, the de-bonding process includes projecting a light such as a laser light or an UV light on the debond layer 104 (e.g., the LTHC release layer) so that the carrier 102 can be easily removed along with the debond layer 104. After the de-bonding process, the seed layer 106 and a backside of the dielectric layer 110 may be revealed or exposed. In some other embodiments, the seed layer 106 may be removed to reveal the conductive patterns 108 underneath.

Figure 4G:
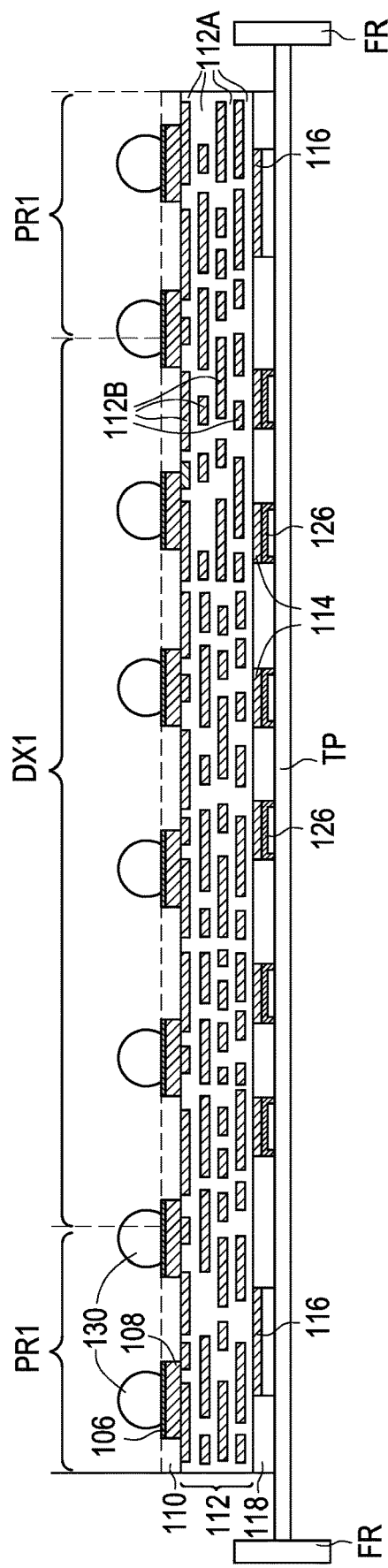
Figure 4H:
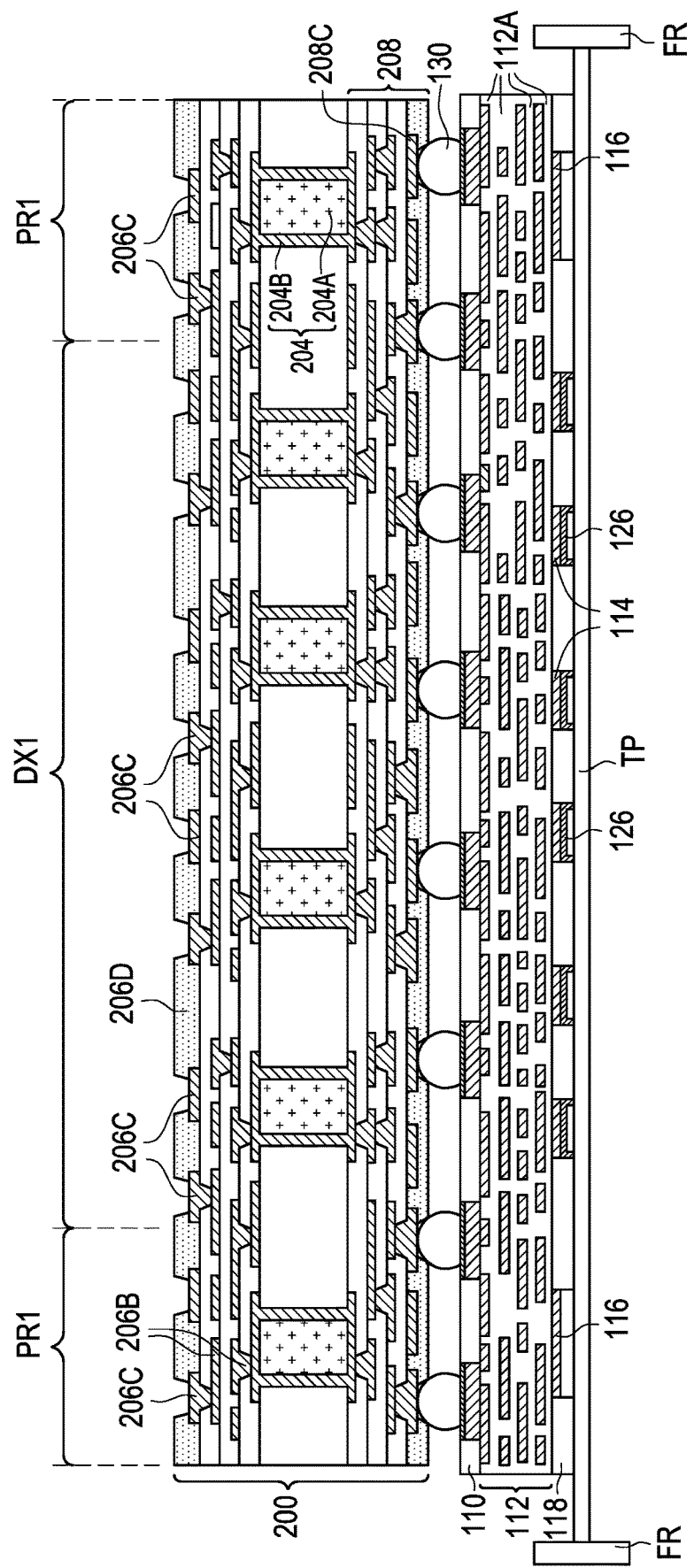

Referring to FIG. 4G in some embodiments, a plurality of conductive connectors 130 is formed on the seed layer 106 over the conductive patterns 108. Subsequently, referring to FIG. 4H, the core substrate 200 shown in FIG. 1L is bonded or attached to the redistribution layer 112 shown in FIG. 4G. For example, the core substrate 200 is electrically connected to the redistribution layer 112 through the conductive connectors 130 and the conductive patterns 108. A reflowing process may be performed so that the conductive connectors 130 are physically and electrically coupled to the conductive pads 208C of the second redistribution structure 208 of the core substrate 200.

Figure 4I:
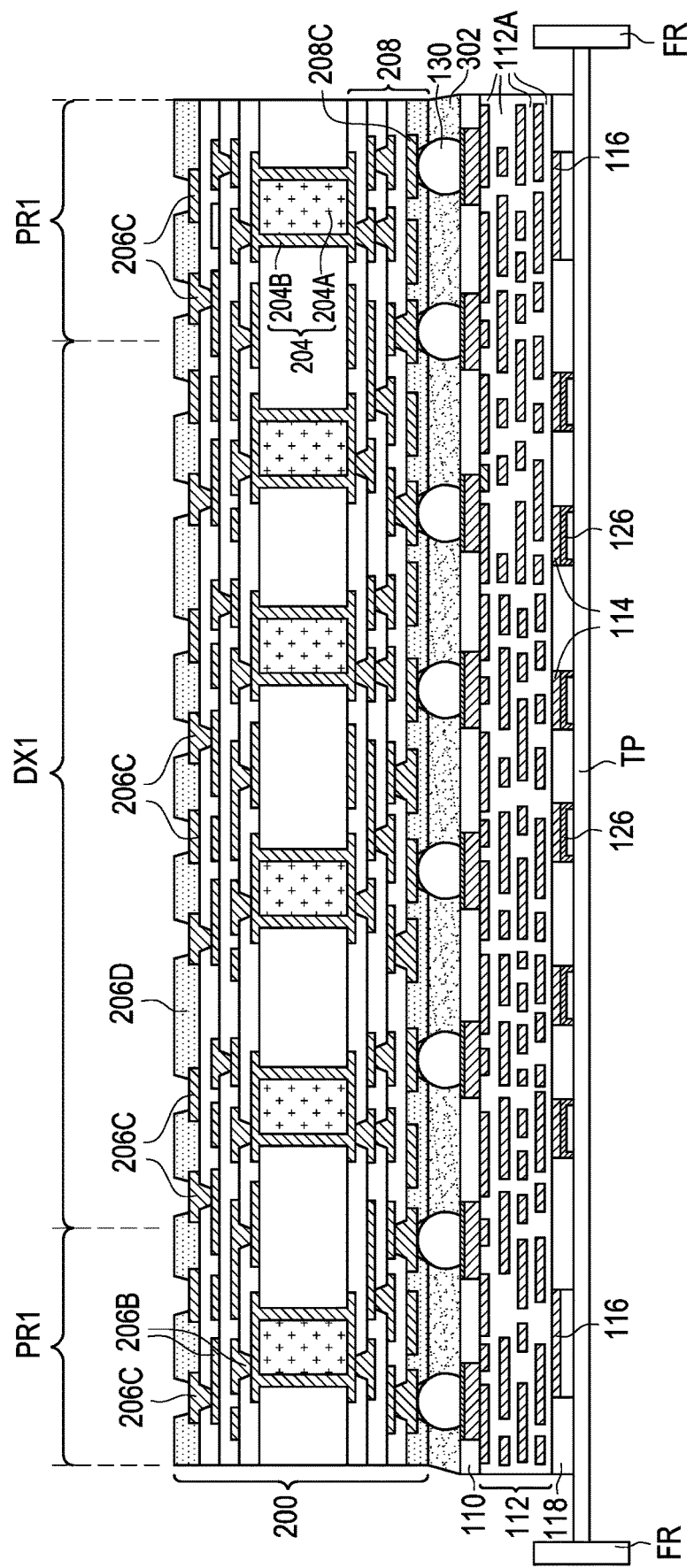
Figure 4J:
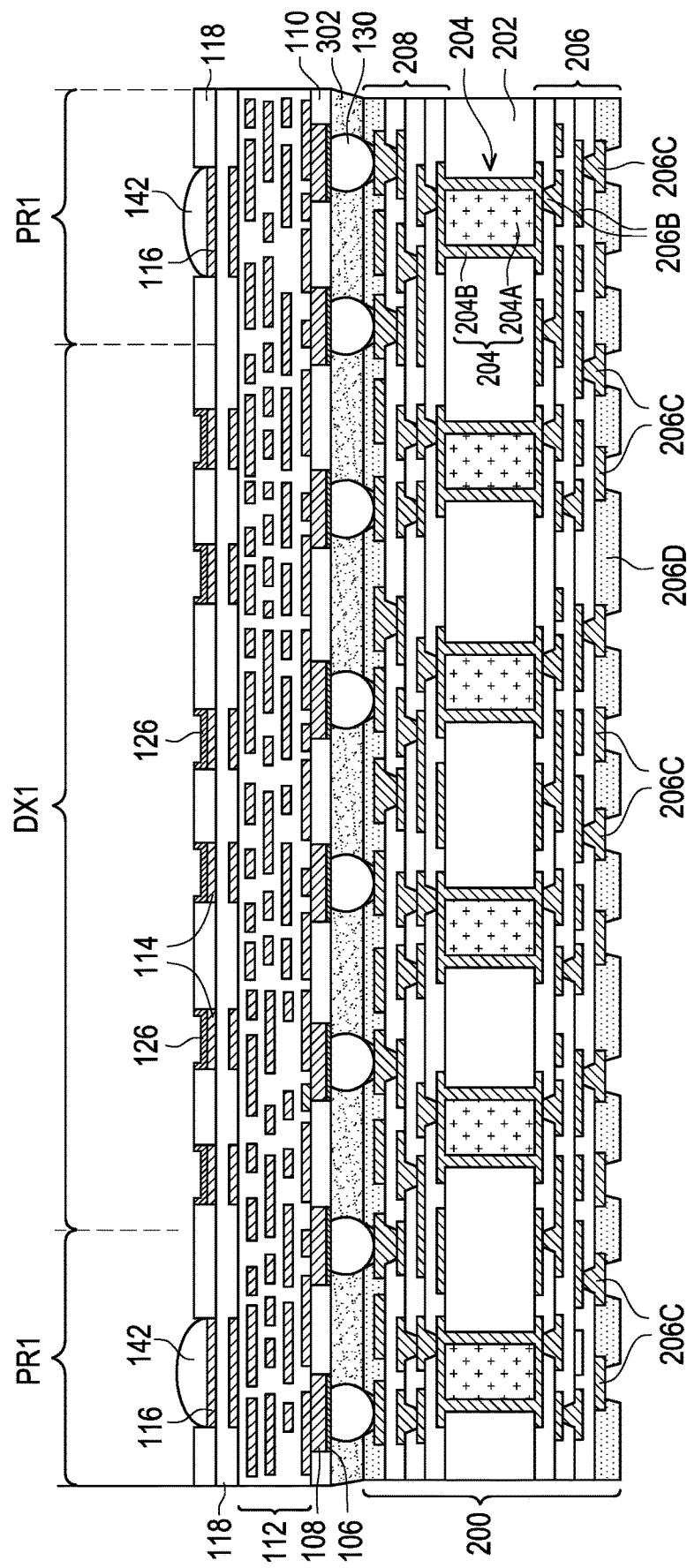

Referring to FIG. 4I, in a subsequent step, an underfill material 302 is formed between the core substrate 200 and the redistribution layer 112. In certain embodiments, the underfill material 302 fill up the spaces in between the core substrate 200 and the dielectric layer 110. Referring to FIG. 4J, in some embodiments, the structure shown in FIG. 4I is flipped upside down, and a conductive paste 142 such as solder paste, silver paste, or the like, is dispensed by a printing process on the conductive pads 116 in the peripheral areas PR1. A dicing process may be performed as necessary to separate the entire wafer or substrate into a certain number of unit cells per group (where FIG. 4J shows one unit cell).

Figure 4K:
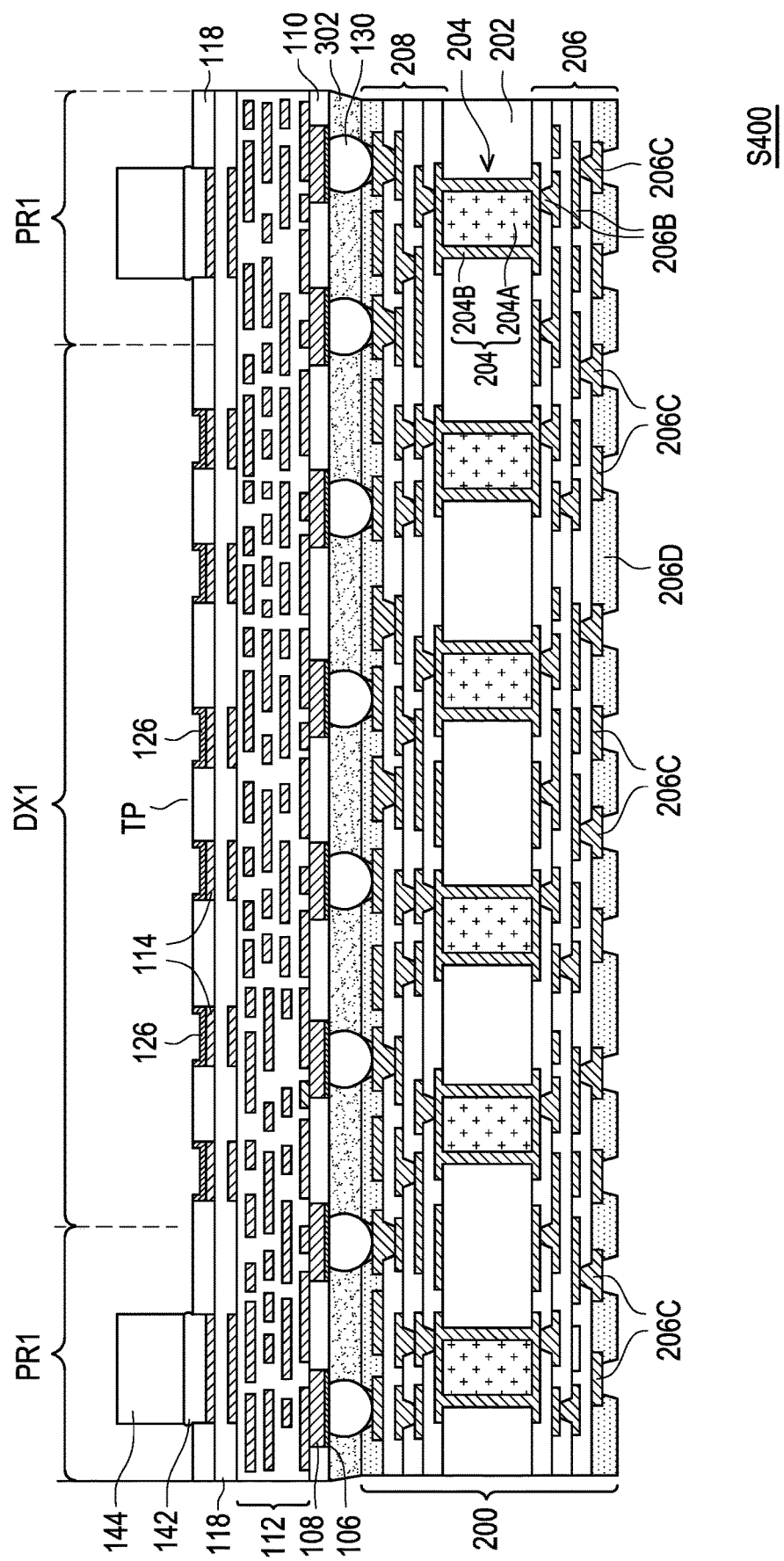

Referring to FIG. 4K, after forming the conductive paste 142, passive devices 144 (integrated passive device or surface mount devices) may be mounted on the redistribution layer 112 in the peripheral areas PR1 over the conductive paste 142. Subsequently, a plurality of conductive terminals 146 may be formed on the first redistribution structure 206 of the core substrate 200. For example, the conductive terminals 146 may be electrically connected to the conductive pads 206C of the first redistribution structure 206.

After forming the conductive terminals 146, a substrate structure S400 in accordance with some embodiments of the present disclosure is accomplished. In some embodiments, the substrate structure S400 is a probe card substrate used in probe card applications. For example, in certain embodiments, probe pins (not shown) are further disposed to make contact with the first protective coating 126 over the conductive pads 114 (test pads TP1). The probe pins may be electrically connected to a device under testing (DUT) or examination target for electrical examination.

FIG. 5A to FIG. 5J are schematic sectional views of various stages in a method of fabricating a substrate structure according to some other exemplary embodiments of the present disclosure. The method illustrated in FIG. 5A to FIG. 5J is similar to the method illustrated in FIG. 1A to FIG. 1P, therefore, the same reference numerals are used to refer to the same or like parts, and its detailed description will be omitted herein.

Figure 5A:
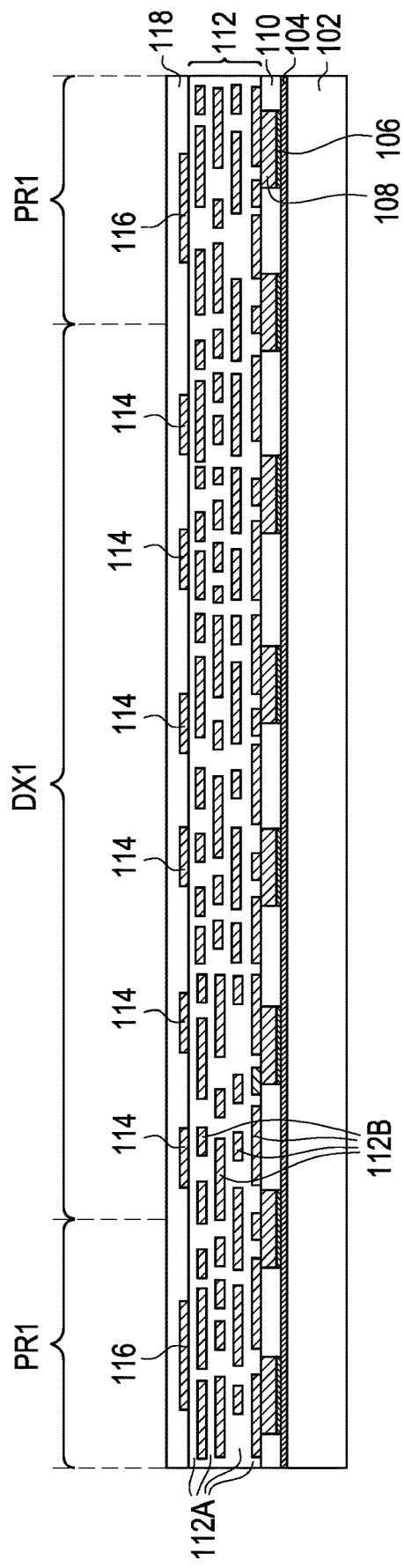
Figure 5B:
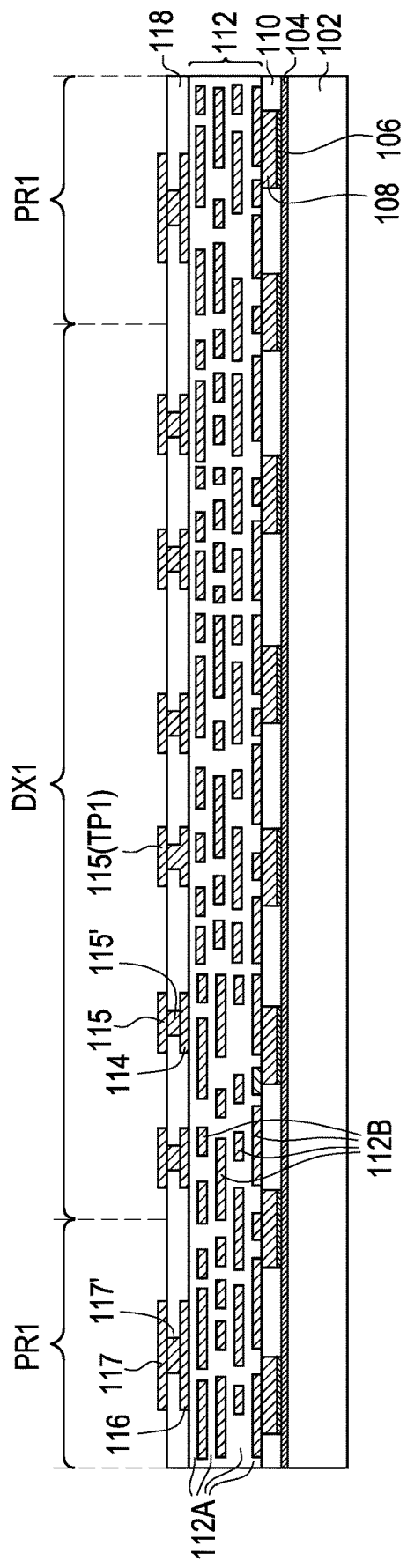

As illustrated in FIG. 5A, the same steps described in FIG. 1A to FIG. 1E may be performed to form the conductive patterns 108, the dielectric layer 110, the redistribution layer 112, the conductive pads 114, 116 and the polymer layer 118 over the carrier 102. Referring to FIG. 5B, in some embodiments, the polymer layer 118 is patterned to form openings revealing the conductive pads 114, 116. In some embodiments, a plurality of conductive vias 115' and a plurality of conductive vias 117' are formed in the openings of the patterned polymer layer 118. For example, the conductive vias 115' are disposed on and electrically connected to the conductive pads 114, and the conductive vias 117' are disposed on and electrically connected to the conductive pads 116. In some embodiments, the conductive pads 115 (or test pads TP1) are formed on the conductive vias 115', while the conductive pads 117 are formed on the conductive vias 117'. In some alternative embodiments, the conductive pads 115 are formed along with the conductive vias 115' in a single step, while the conductive pads 117 are formed along with the conductive vias 117' in a single step. The disclosure is not limited thereto.

Referring to FIG. 5C, a first protective coating 126 is conformally formed over the polymer 118 on the conductive pads 115, 117. For example, the first protective coating 126 contacts the top surfaces of the conductive pads 117 in the peripheral areas PR1, and further contacts the top surfaces of the conductive pads 115 in the DUT area DX1. In the exemplary embodiment, the first protective coating 126 is a hard layer made by sputtering titanium (Ti), nickel (Ni), vanadium (V) and gold (Au), for example.

Referring to FIG. 5D, in a subsequent step, a photoresist 125 is formed on the first protective coating 126 over the redistribution layer 112. For example, the photoresist 125 is formed on the first protective coating 126 in the DUT area DX1 to cover the conductive pads 115 (or test pads TP1). In some embodiments, the photoresist 124 is patterned to form openings that reveal portions of the first protective coating 126 in the peripheral area PR1, and to reveal portions of the first protective coating 126 in the DUT area DX1.

Figure 5E:
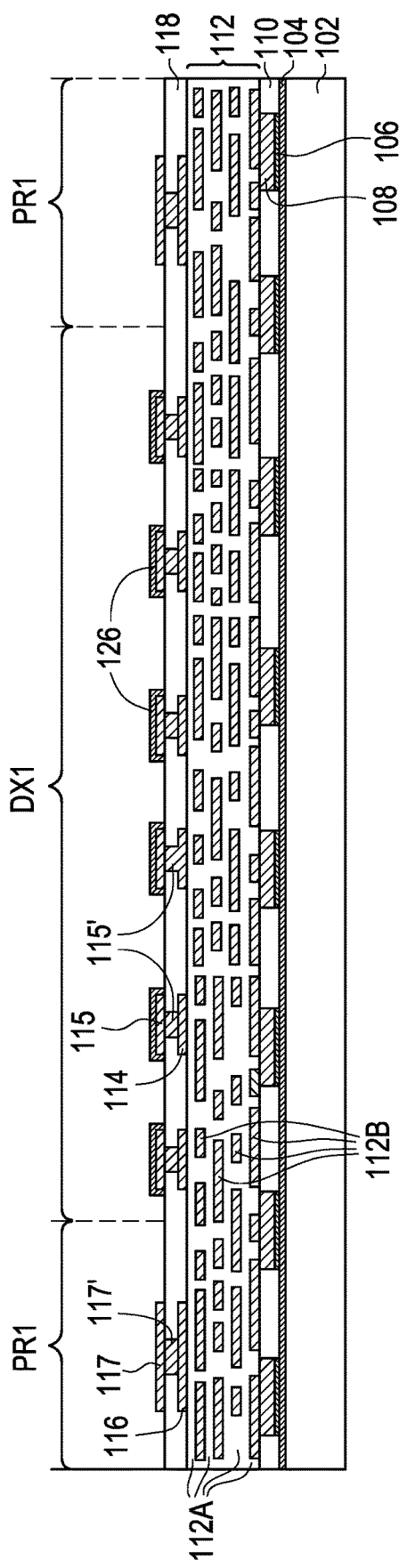

Referring to FIG. 5E, portions of the first protective coating 126 not covered by the photoresist 125 may be removed or etched. For example, the first protective coating 126 is etched to reveal the conductive pads 117. In some embodiments, the etched first protective coating 126 cover side surfaces and top surfaces of the conductive pads 115 (or test pads TP1). Thereafter, the photoresist 125 may be stripped off or removed.

Figure 5F:
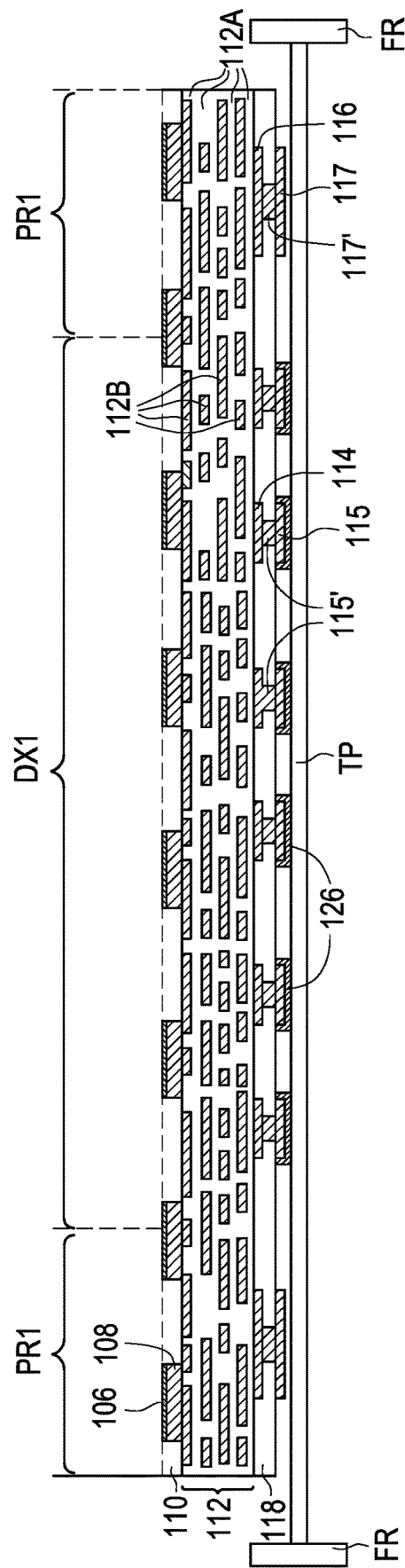

Referring to FIG. 5F, the structure illustrated in FIG. 5E is turned upside down and attached to a tape TP (e.g., a dicing tape) supported by a frame FR. As illustrated in FIG. 5F, the carrier 102 is debonded and is separated from the dielectric layer 110. In some embodiments, the de-bonding process includes projecting a light such as a laser light or an UV light on the debond layer 104 (e.g., the LTHC release layer) so that the carrier 102 can be easily removed along with the debond layer 104. After the de-bonding process, the seed layer 106 and a backside of the dielectric layer 110 may be revealed or exposed. In some other embodiments, the seed layer 106 may be removed to reveal the conductive patterns 108 underneath.

Figure 5G:
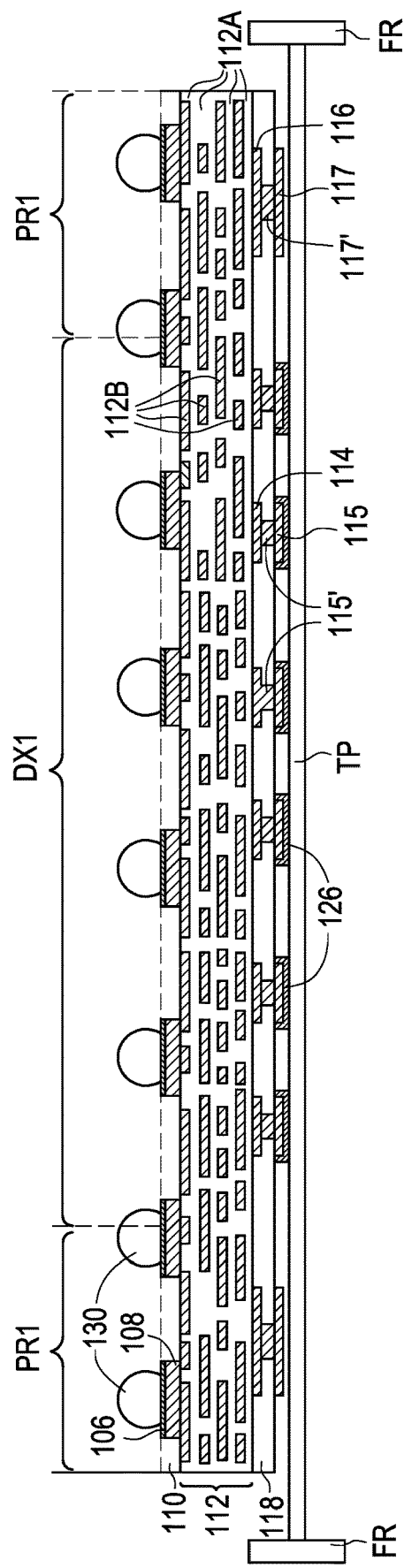

Referring to FIG. 5G in some embodiments, a plurality of conductive connectors 130 is formed on the seed layer 106 over the conductive patterns 108. Subsequently, referring to FIG. 5H, the core substrate 200 shown in FIG. 1L is bonded or attached to the redistribution layer 112 shown in FIG. 5G. For example, the core substrate 200 is electrically connected to the redistribution layer 112 through the conductive connectors 130 and the conductive patterns 108. A reflowing process may be performed so that the conductive connectors 130 are physically and electrically coupled to the conductive pads 208C of the second redistribution structure 208 of the core substrate 200. Thereafter, an underfill material 302 may be formed between the core substrate 200 and the redistribution layer 112. For example, the underfill material 302 fill up the spaces in between the core substrate 200 and the dielectric layer 110.

Figure 5H:
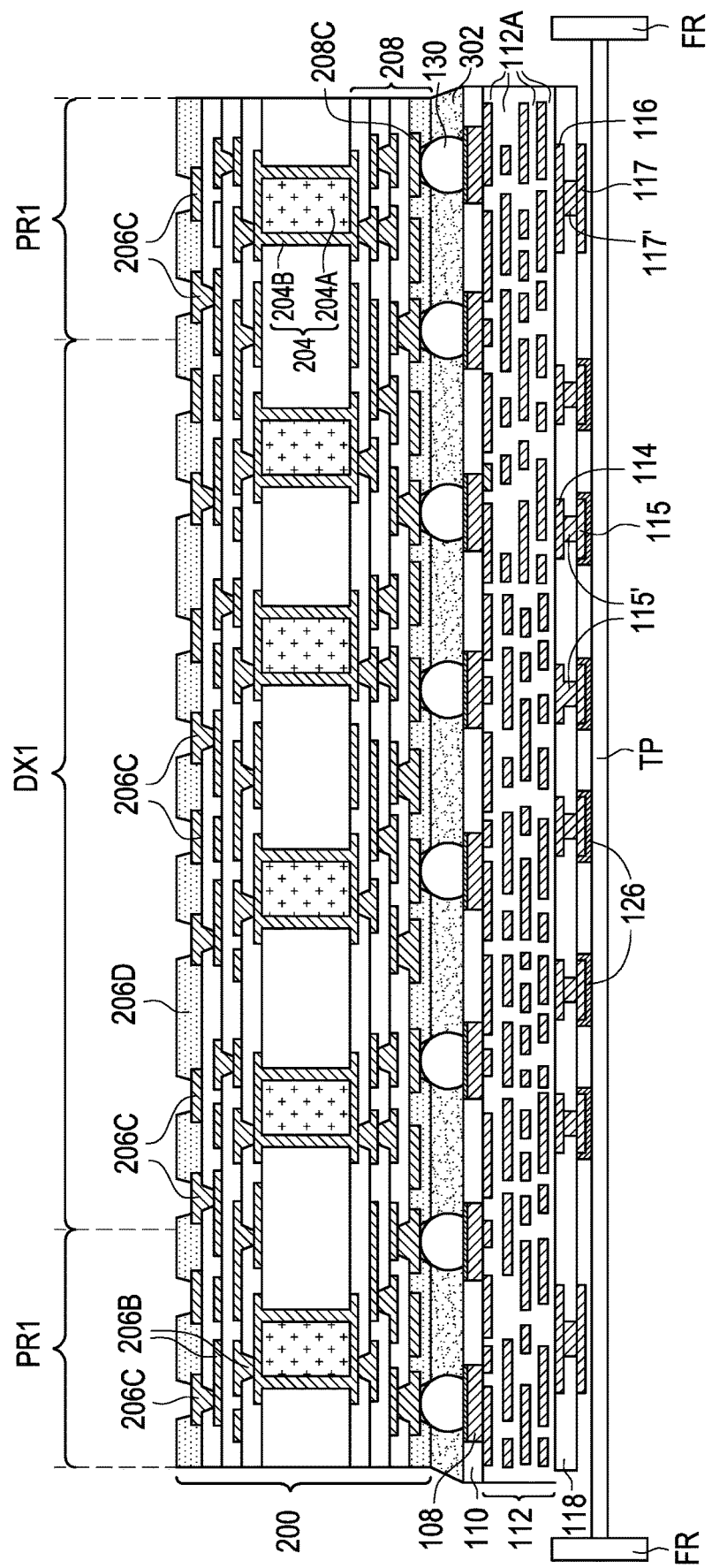
Figure 5I:
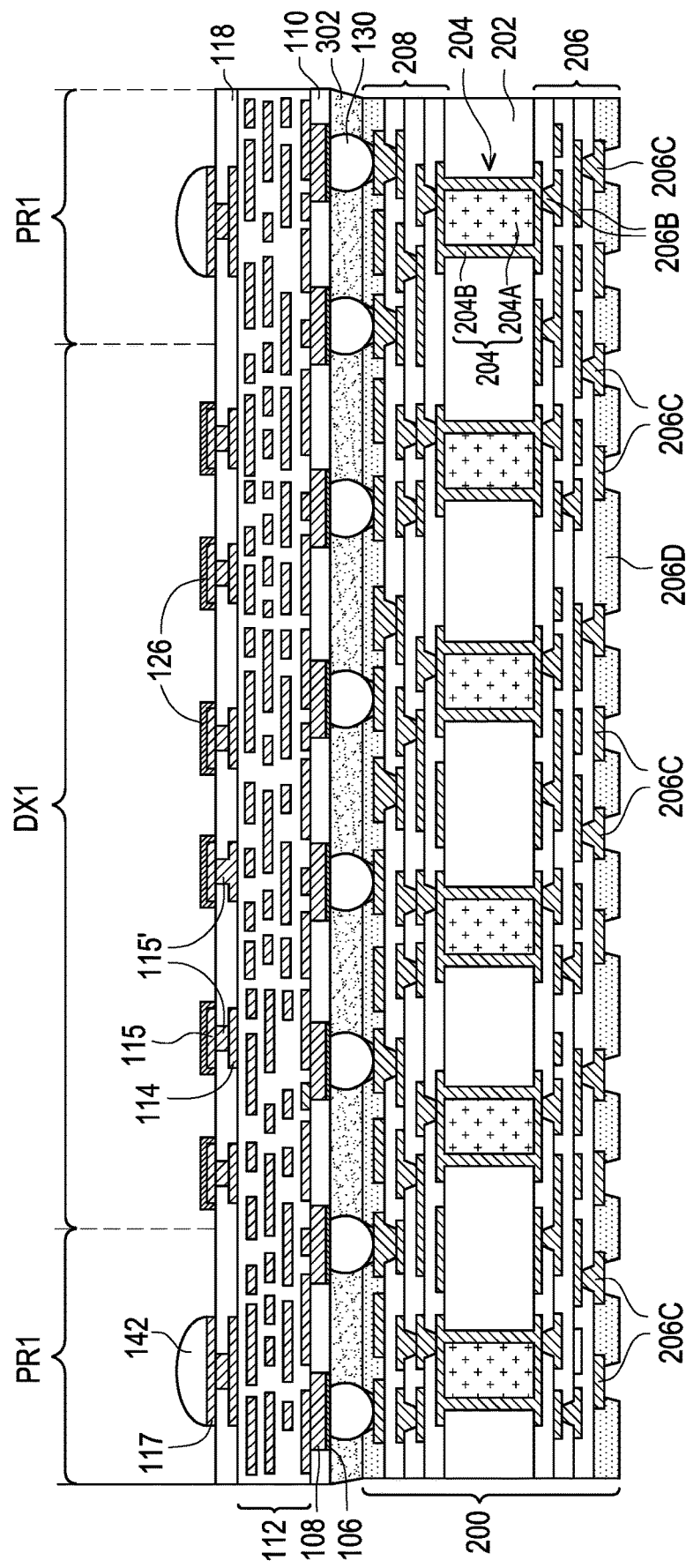

Referring to FIG. 5I, in some embodiments, the structure shown in FIG. 5H is flipped upside down, and a conductive paste 142 such as solder paste, silver paste, or the like, is dispensed by a printing process on the conductive pads 117 in the peripheral areas PR1. A dicing process may be performed as necessary to separate the entire wafer or substrate into a certain number of unit cells per group (where FIG. 5I shows one unit cell).

Figure 5J:
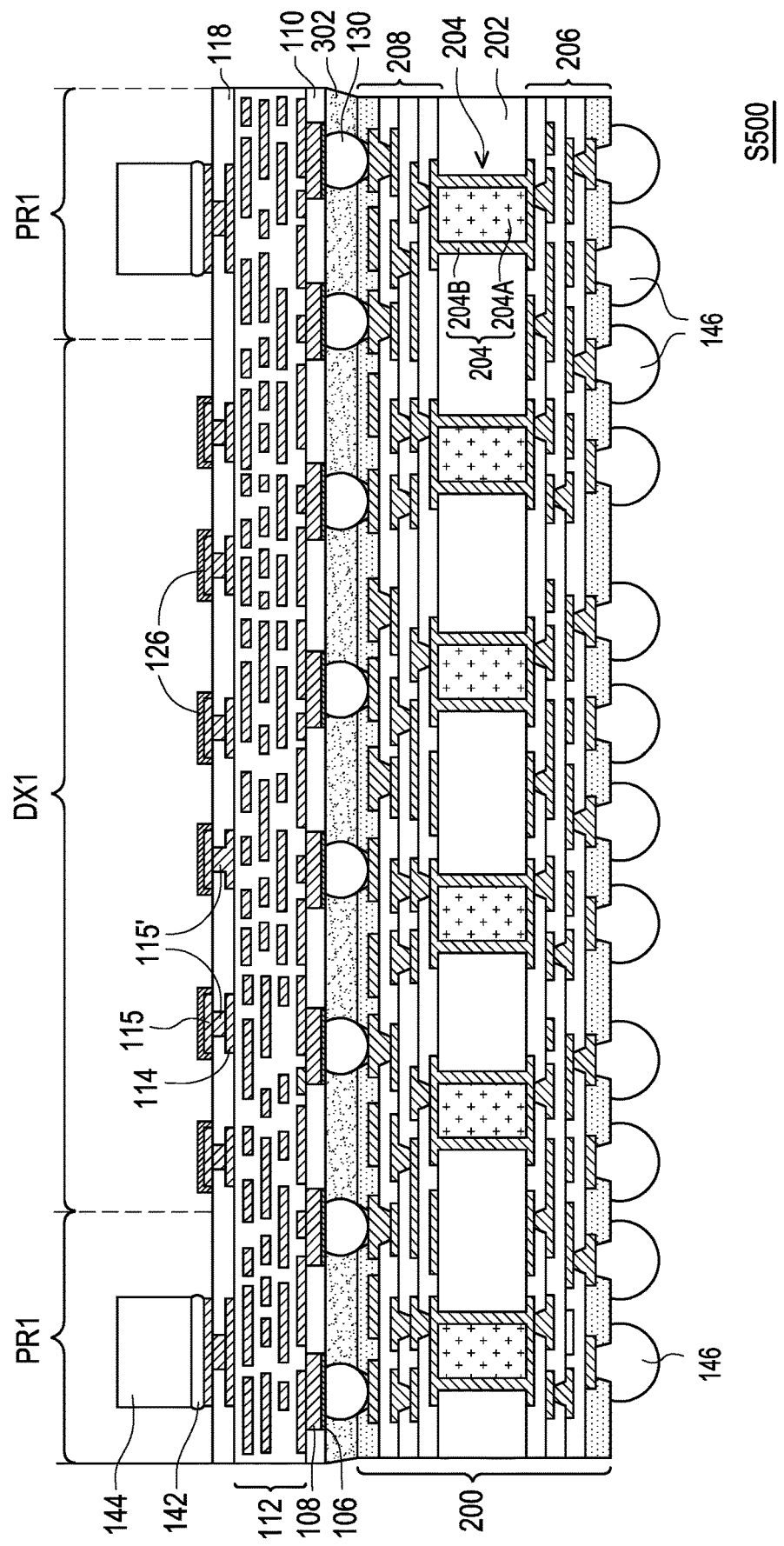

Referring to FIG. 5J, after forming the conductive paste 142, passive devices 144 (integrated passive device or surface mount devices) may be mounted on the redistribution layer 112 in the peripheral areas PR1 over the conductive paste 142. Subsequently, a plurality of conductive terminals 146 may be formed on the first redistribution structure 206 of the core substrate 200. For example, the conductive terminals 146 may be electrically connected to the conductive pads 206C of the first redistribution structure 206.

After forming the conductive terminals 146, a substrate structure S500 in accordance with some embodiments of the present disclosure is accomplished. In some embodiments, the substrate structure S500 is a probe card substrate used in probe card applications. For example, in certain embodiments, probe pins (not shown) are further disposed to make contact with the first protective coating 126 over the conductive pads 115 (test pads TP1). The probe pins may be electrically connected to a device under testing (DUT) or examination target for electrical examination.

Figure 6:
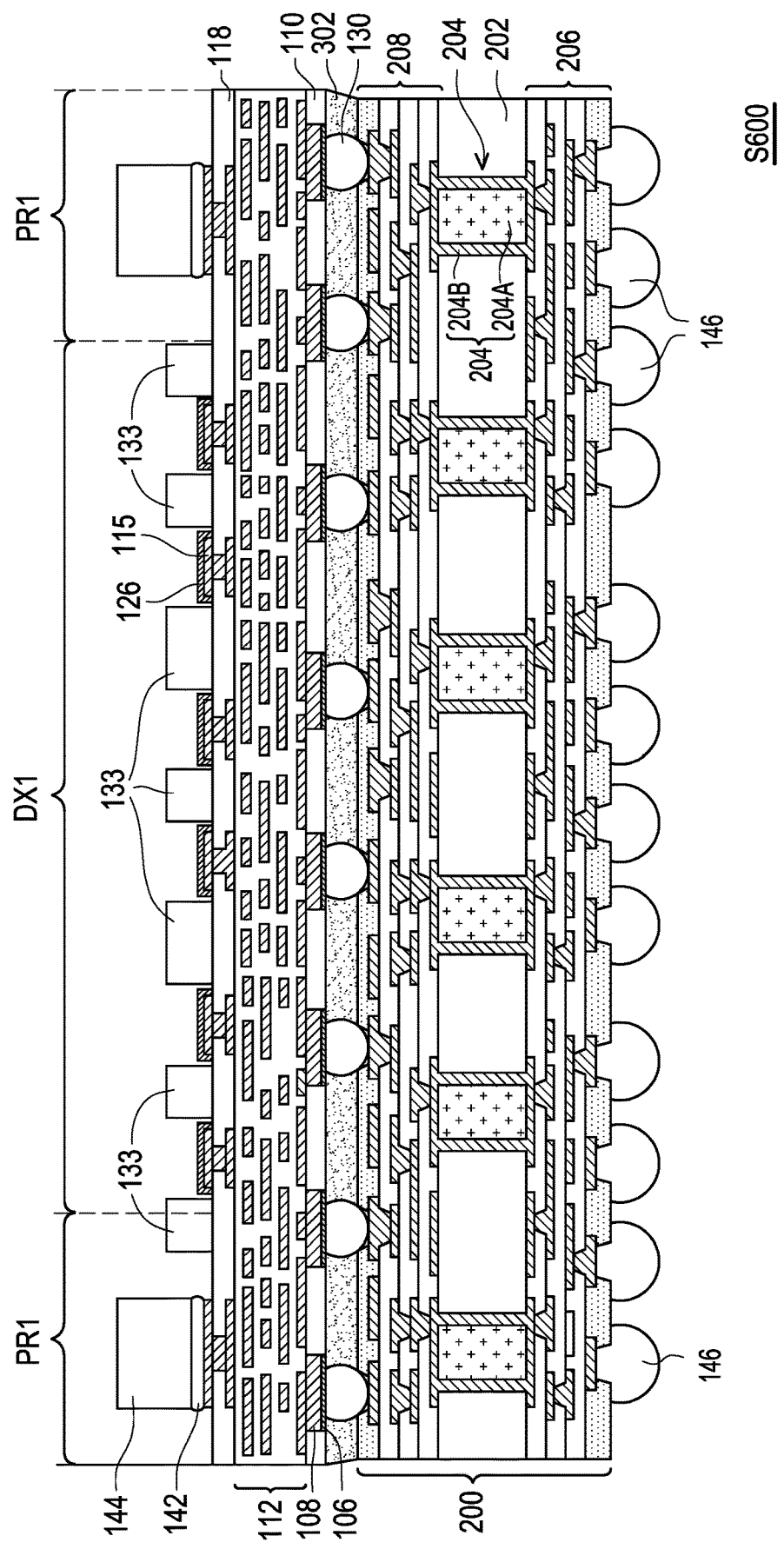
FIG. 6 is a schematic sectional view of a substrate structure according to some other exemplary embodiments of the present disclosure.

FIG. 6 is a schematic sectional view of a substrate structure according to some other exemplary embodiments of the present disclosure. The substrate structure S600 illustrated in FIG. 6 is similar to the substrate structure S500 illustrated in FIG. 5J. Therefore, the same reference numerals are used to refer to the same or liked parts, and its detailed description will be omitted herein.

The substrate structure S600 illustrated in FIG. 6 is the same as the substrate structure S500 illustrate in FIG. 5J except that a pad layer 133 is further disposed on the polymer layer 118. The pad layer 133 may be formed by a similar method described in FIG. 3A to FIG. 3B, thus its details will not be repeated herein. Similar to the above embodiments, the substrate structure S600 is a probe card substrate used in probe card applications. For example, in certain embodiments, probe pins (not shown) are further disposed to make contact with the first protective coating 126 over the conductive pads 115 (test pads TP1). The probe pins may be electrically connected to a device under testing (DUT) or examination target for electrical examination.

In some embodiments, the substrate structures S100, S200, S300, S400, S500 and S600 may be further connected to a circuit board structure (not shown) through conductive terminals. The method of connection to the circuit board structure will be further described in more detail with reference to the embodiments shown in FIG. 7A to FIG. 11B. It is noted that the method shown in FIG. 7A to FIG. 11B may be applied to all of the substrate structures S100, S200, S300, S400, S500 and S600 (where conductive terminals 146 are omitted/replaced) for further connection to the circuit board structure.

Figure 7A:
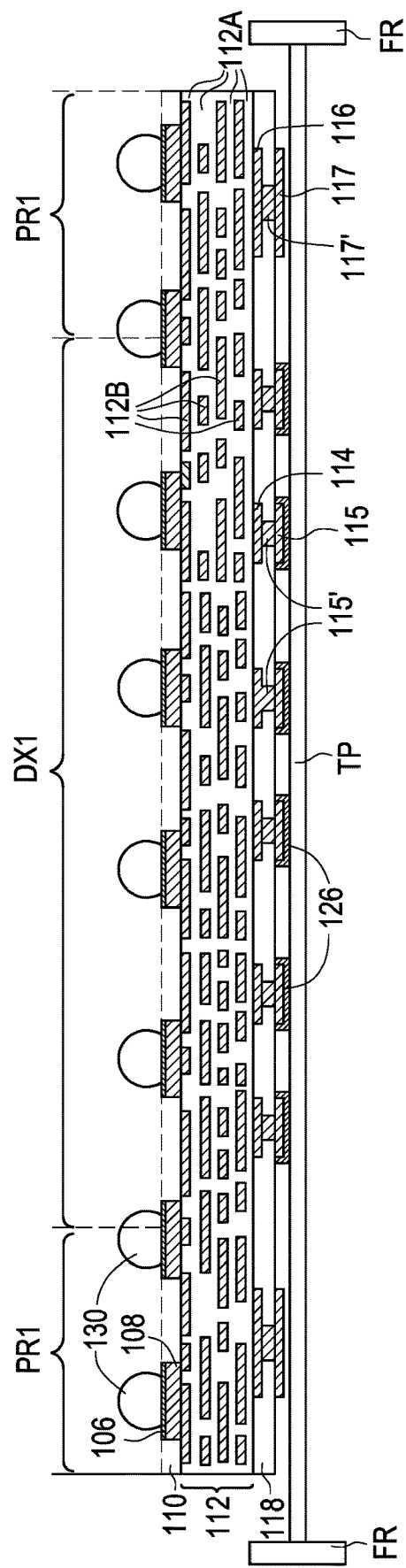
FIG. 7A to FIG. 7D are schematic sectional views of various stages in a method of fabricating a substrate structure according to some other exemplary embodiments of the present disclosure.
Figure 7B:
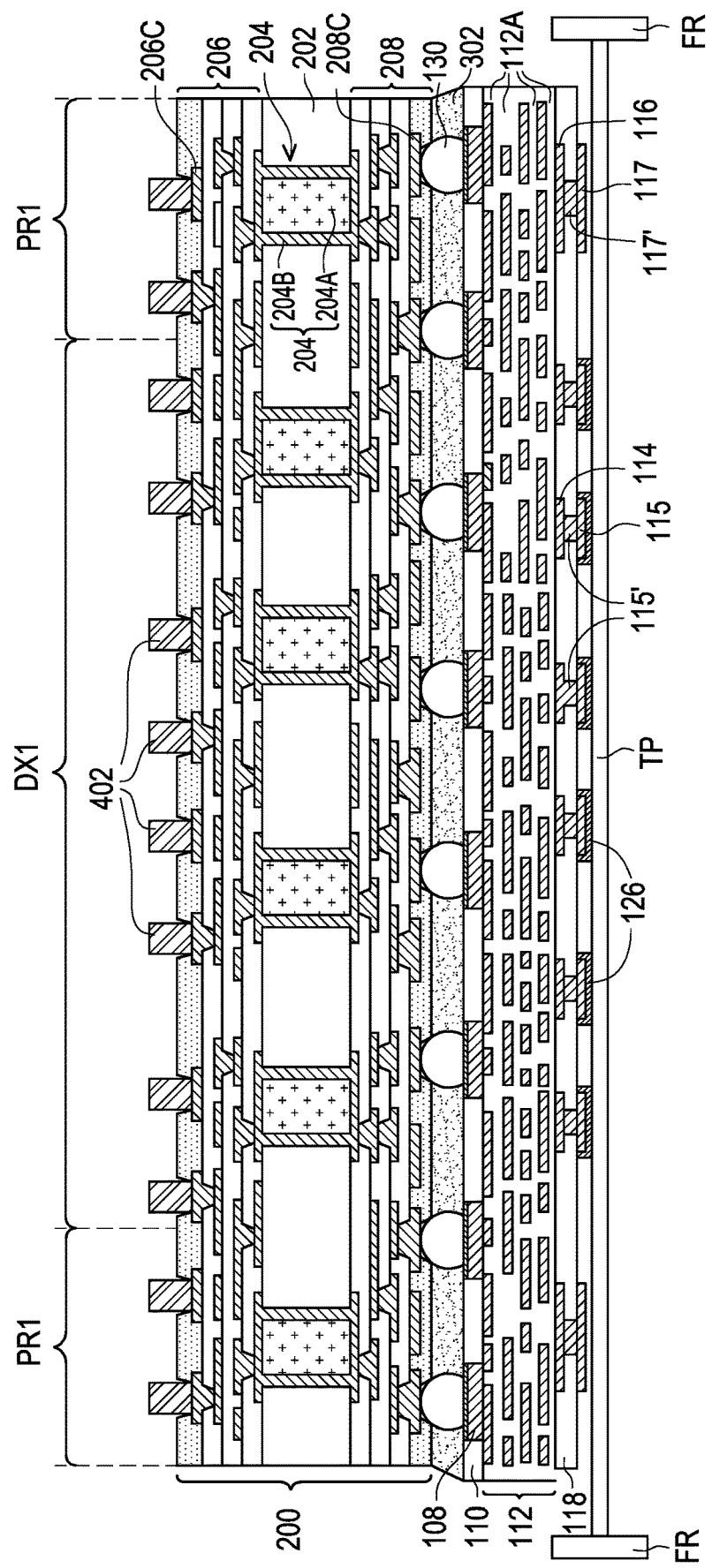

FIG. 7A to FIG. 7D are schematic sectional views of various stages in a method of fabricating a substrate structure according to some other exemplary embodiments of the present disclosure. Referring to FIG. 7A, the same steps described in FIG. 5A to FIG. 5F may be performed to form the conductive connectors 130 over the redistribution layer 112 and on the dielectric layer 110. Referring to FIG. 7B, in a subsequent step, the core substrate 200 shown in FIG. 1L is bonded or attached to the redistribution layer 112 shown in FIG. 7A. For example, the core substrate 200 is electrically connected to the redistribution layer 112 through the conductive connectors 130 and the conductive patterns 108. A reflowing process may be performed so that the conductive connectors 130 are physically and electrically coupled to the conductive pads 208C of the second redistribution structure 208 of the core substrate 200. Thereafter, an underfill material 302 may be formed between the core substrate 200 and the redistribution layer 112. For example, the underfill material 302 fill up the spaces in between the core substrate 200 and the dielectric layer 110. In some embodiments, a plurality of conductive terminals 402 is disposed on the core substrate 200. For example, the conductive terminals 402 are electrically connected to the conductive pads 206C of the first redistribution structure 206. In the exemplary embodiment, the conductive terminals 402 are copper pillars, for example.

Figure 7C:
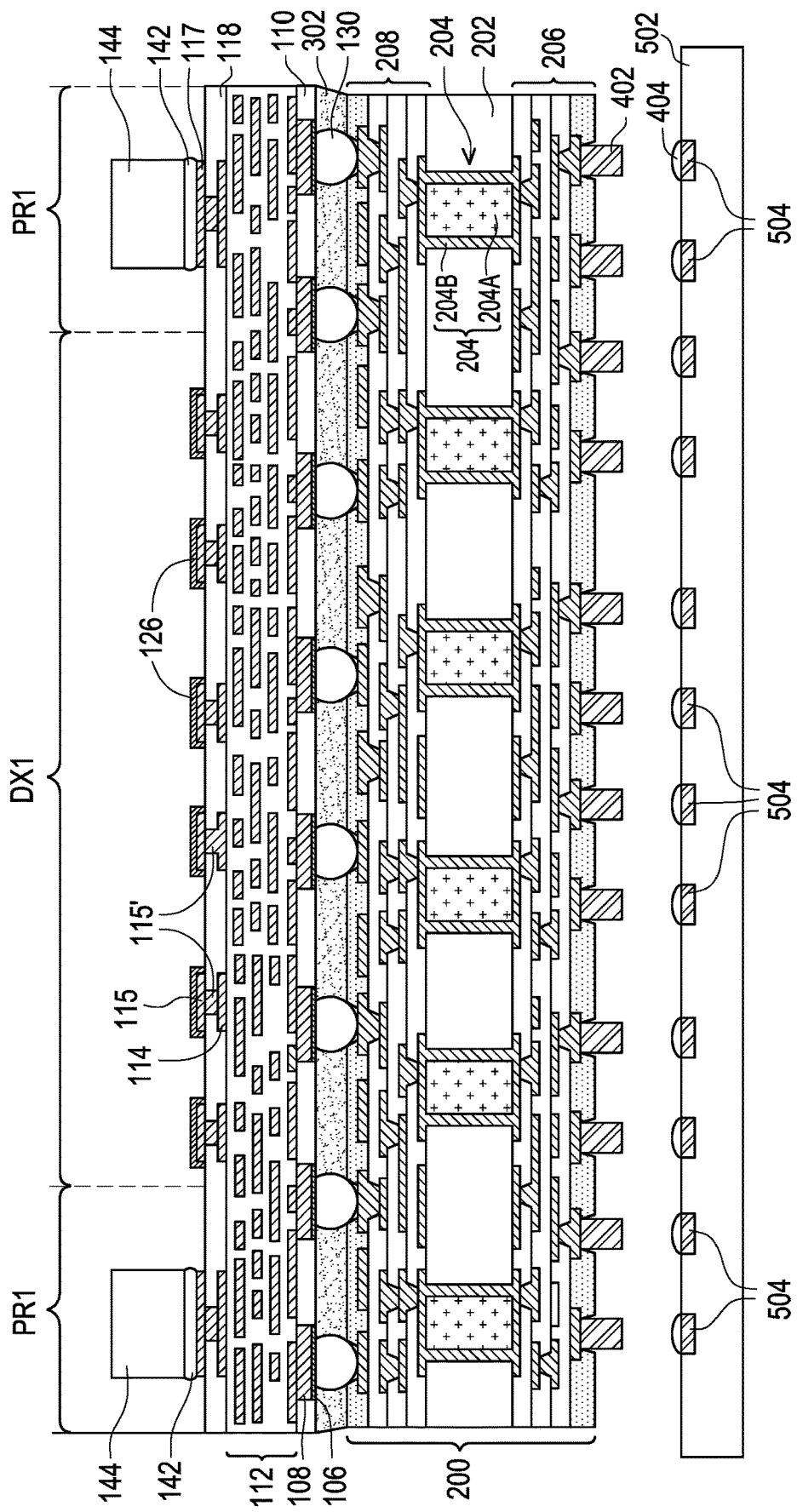

Referring to FIG. 7C, in a subsequent step, the structure shown in FIG. 7B is flipped upside down, and a conductive paste 142 such as solder paste, silver paste, or the like, is dispensed by a printing process on the conductive pads 117 in the peripheral areas PR1. A dicing process may be performed as necessary to separate the entire wafer or substrate into a certain number of unit cells per group (where FIG. 7C shows one unit cell). After forming the conductive paste 142, passive devices 144 (integrated passive device or surface mount devices) may be mounted on the redistribution layer 112 in the peripheral areas PR1 over the conductive paste 142.

As further illustrated in FIG. 7C, the separated groups of unit cells may be disposed on a circuit board structure 502. In other words, the circuit board structure 502 may disposed over a side of the core substrate 200. In some embodiments, the core substrate 502 includes a plurality of conductive pads 504 for electrically connecting embedded electrical components (active devices, passive devices) of the circuit board structure 502 to external components. In certain embodiments, pre-solders 404 are formed on the conductive pads 504.

Figure 7D:
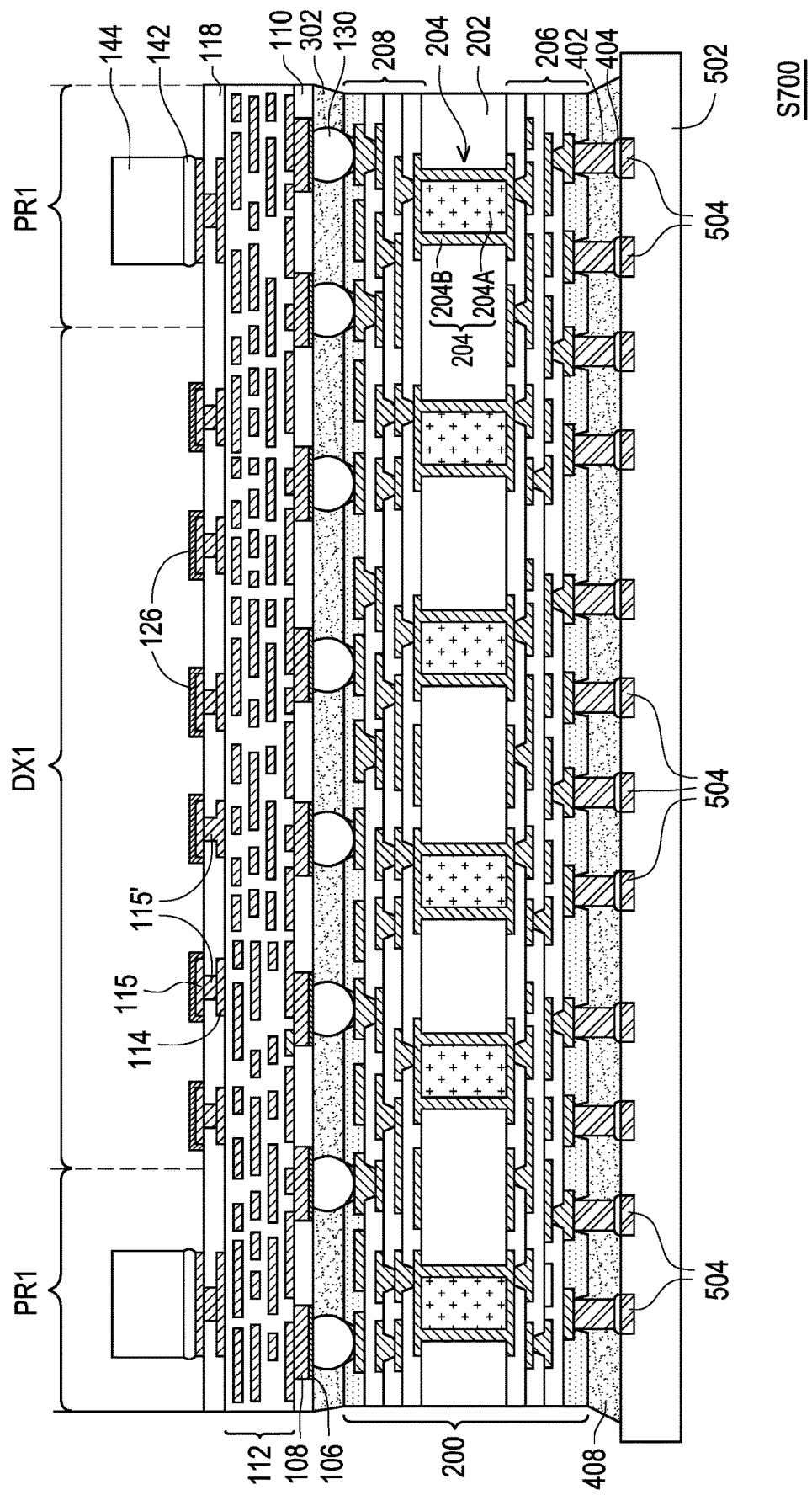

Referring to FIG. 7D, in a subsequent step, the conductive terminals 402 are physically joined with the pre-solders 404. In other words, the core substrate 200 may be electrically connected to the circuit board structure 502 through the conductive terminals 402 and the pre-solders 404. Thereafter, an underfill material 408 may be formed in between the core substrate 200 and the circuit board structure 502 to surround the conductive terminals 402 and the pre-solders 404. Up to here, a substrate structure S700 in accordance with some embodiments of the present disclosure may be accomplished.

Similar to the above embodiments, the substrate structure S700 is a probe card substrate used in probe card applications. For example, in certain embodiments, probe pins (not shown) are further disposed to make contact with the first protective coating 126 over the conductive pads 115 (test pads TP1). The probe pins may be electrically connected to a device under testing (DUT) or examination target for electrical examination.

Figure 8A:
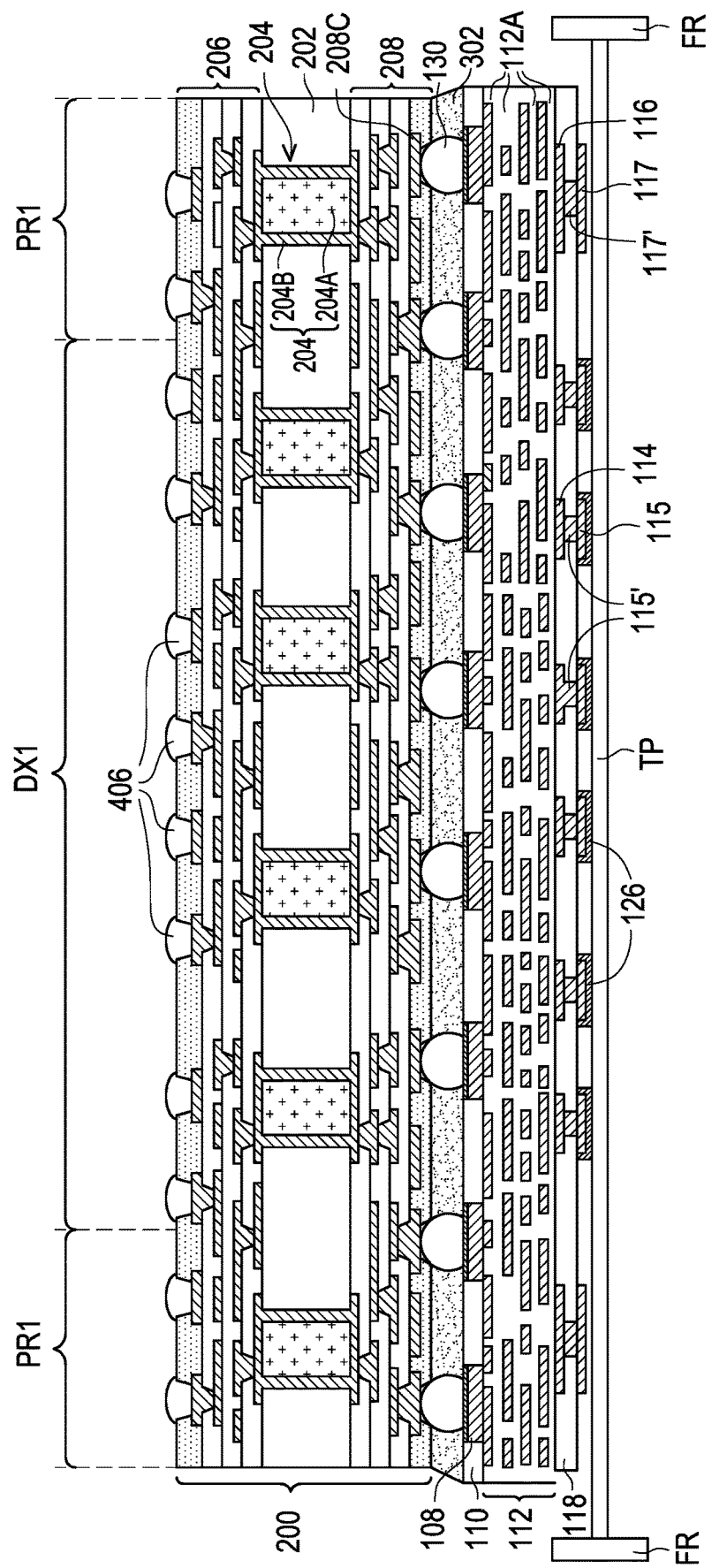
FIG. 8A to FIG. 8C are schematic sectional views of various stages in a method of fabricating a substrate structure according to some other exemplary embodiments of the present disclosure.
Figure 8B:
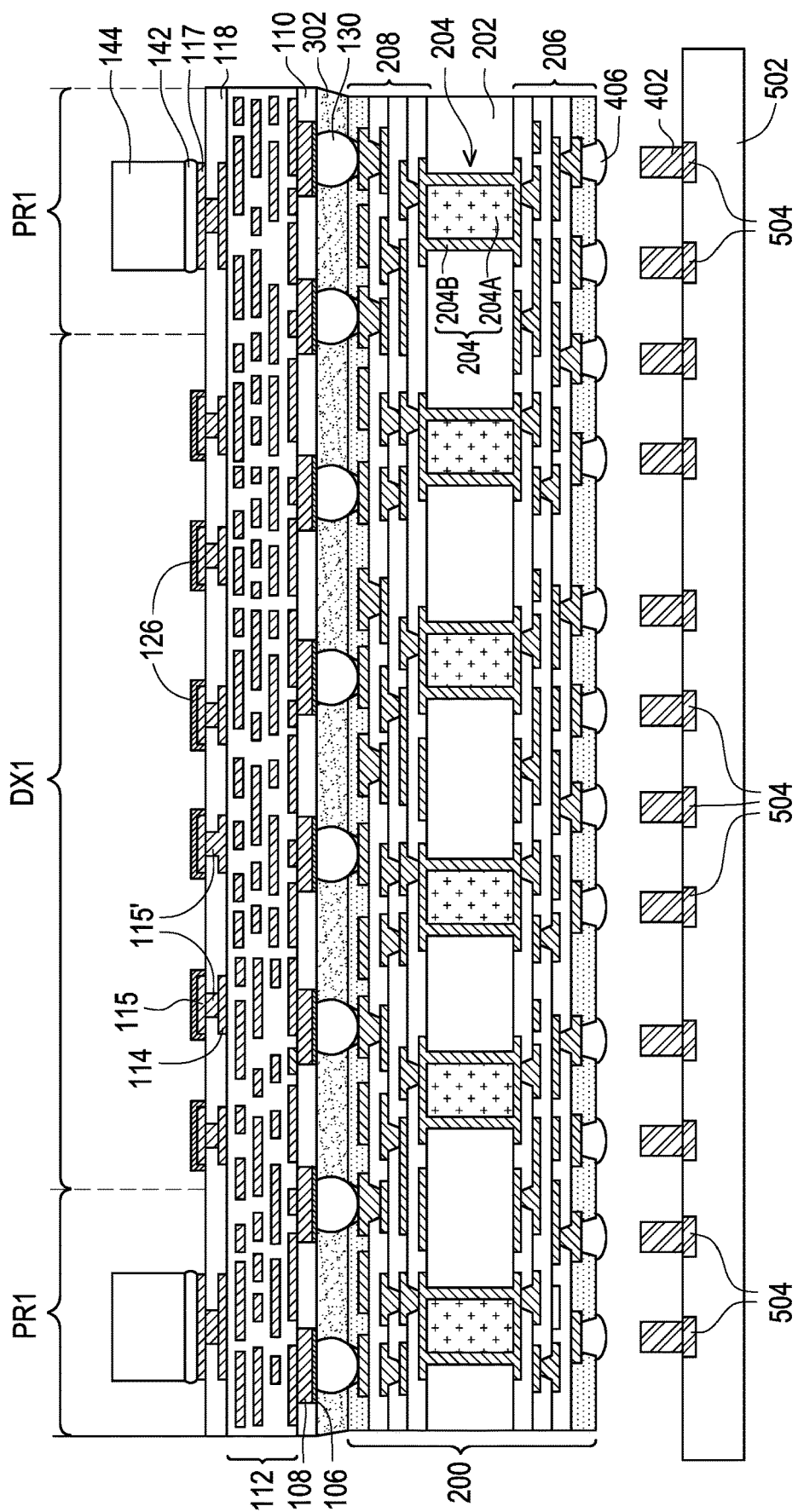
Figure 8C:
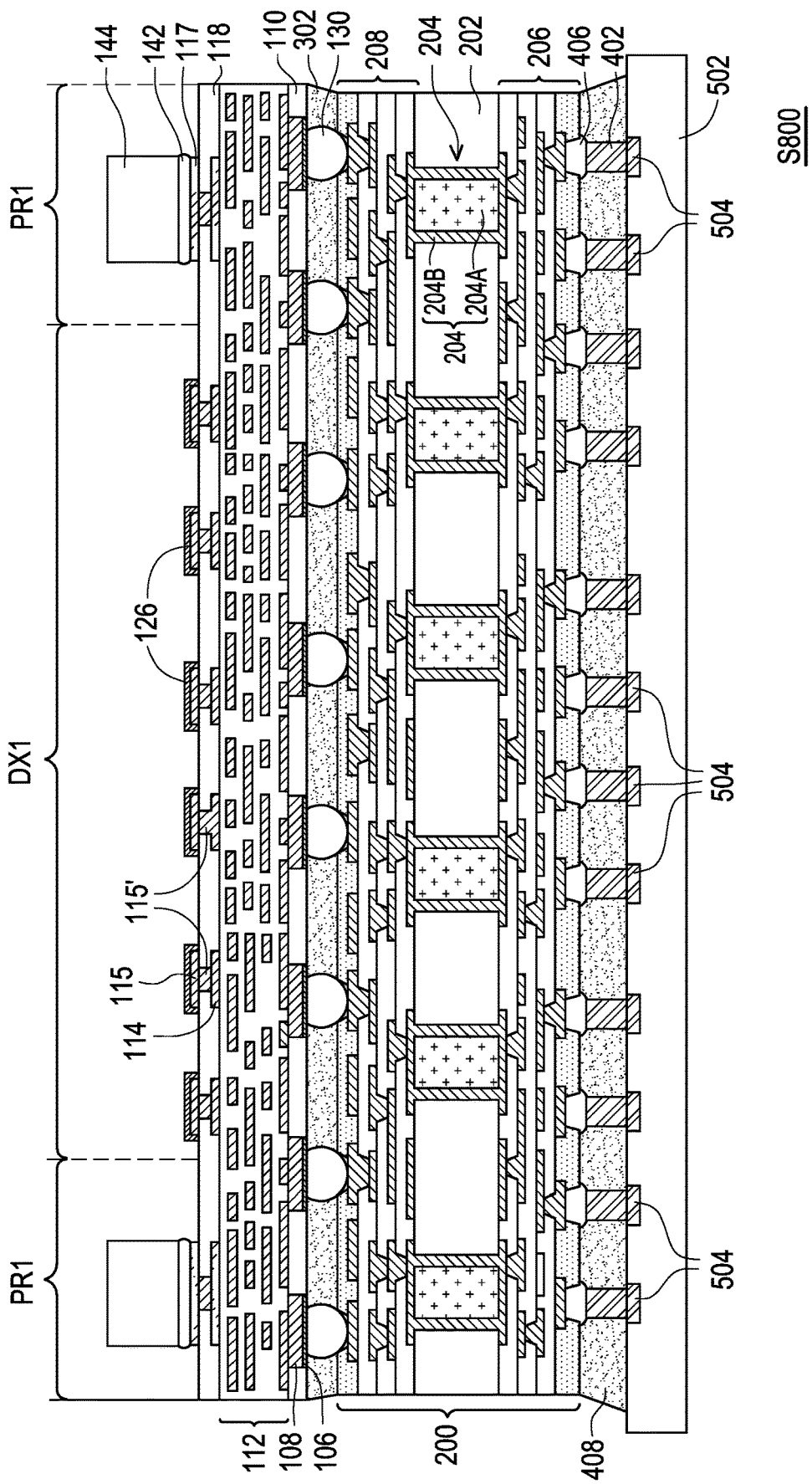

FIG. 8A to FIG. 8C are schematic sectional views of various stages in a method of fabricating a substrate structure according to some other exemplary embodiments of the present disclosure. The method illustrated in FIG. 8A to FIG. 8C is similar to the method illustrated in FIG. 7A to FIG. 7D. Therefore, the same reference numerals are used to refer to the same or liked parts, and its detailed description will be omitted herein.

Referring to FIG. 8A, following the step shown in FIG. 7A, the core substrate 200 shown in FIG. 1L is bonded or attached to the redistribution layer 112 shown in FIG. 7A. For example, the core substrate 200 is electrically connected to the redistribution layer 112 through the conductive connectors 130 and the conductive patterns 108. A reflowing process may be performed so that the conductive connectors 130 are physically and electrically coupled to the conductive pads 208C of the second redistribution structure 208 of the core substrate 200. Thereafter, an underfill material 302 may be formed between the core substrate 200 and the redistribution layer 112. For example, the underfill material 302 fill up the spaces in between the core substrate 200 and the dielectric layer 110. In some embodiments, pre-solders 406 are disposed on the core substrate 200. For example, the pre-solders 406 are electrically connected to the conductive pads 206C of the first redistribution structure 206.

Referring to FIG. 8B, in a subsequent step, the structure shown in FIG. 8A is flipped upside down, and a conductive paste 142 such as solder paste, silver paste, or the like, is dispensed by a printing process on the conductive pads 117 in the peripheral areas PR1. A dicing process may be performed as necessary to separate the entire wafer or substrate into a certain number of unit cells per group (where FIG. 8B shows one unit cell). After forming the conductive paste 142, passive devices 144 (integrated passive device or surface mount devices) may be mounted on the redistribution layer 112 in the peripheral areas PR1 over the conductive paste 142.

As further illustrated in FIG. 8B, the separated groups of unit cells may be disposed on a circuit board structure 502 having conductive terminals 402 disposed thereon. For example, the conductive terminals 402 are electrically connected to the conductive pads 504 of the circuit board structure 502. Subsequently, referring to FIG. 8C, the conductive terminals 402 are physically joined with the pre-solders 406 on the core substrate 200. In other words, the core substrate 200 may be electrically connected to the circuit board structure 502 through the conductive terminals 402 and the pre-solders 406. Thereafter, an underfill material 408 may be formed in between the core substrate 200 and the circuit board structure 502 to surround the conductive terminals 402 and the pre-solders 406. Up to here, a substrate structure S800 in accordance with some embodiments of the present disclosure may be accomplished.

Similar to the above embodiments, the substrate structure S800 is a probe card substrate used in probe card applications. For example, in certain embodiments, probe pins (not shown) are further disposed to make contact with the first protective coating 126 over the conductive pads 115 (test pads TP1). The probe pins may be electrically connected to a device under testing (DUT) or examination target for electrical examination.

Figure 9A:
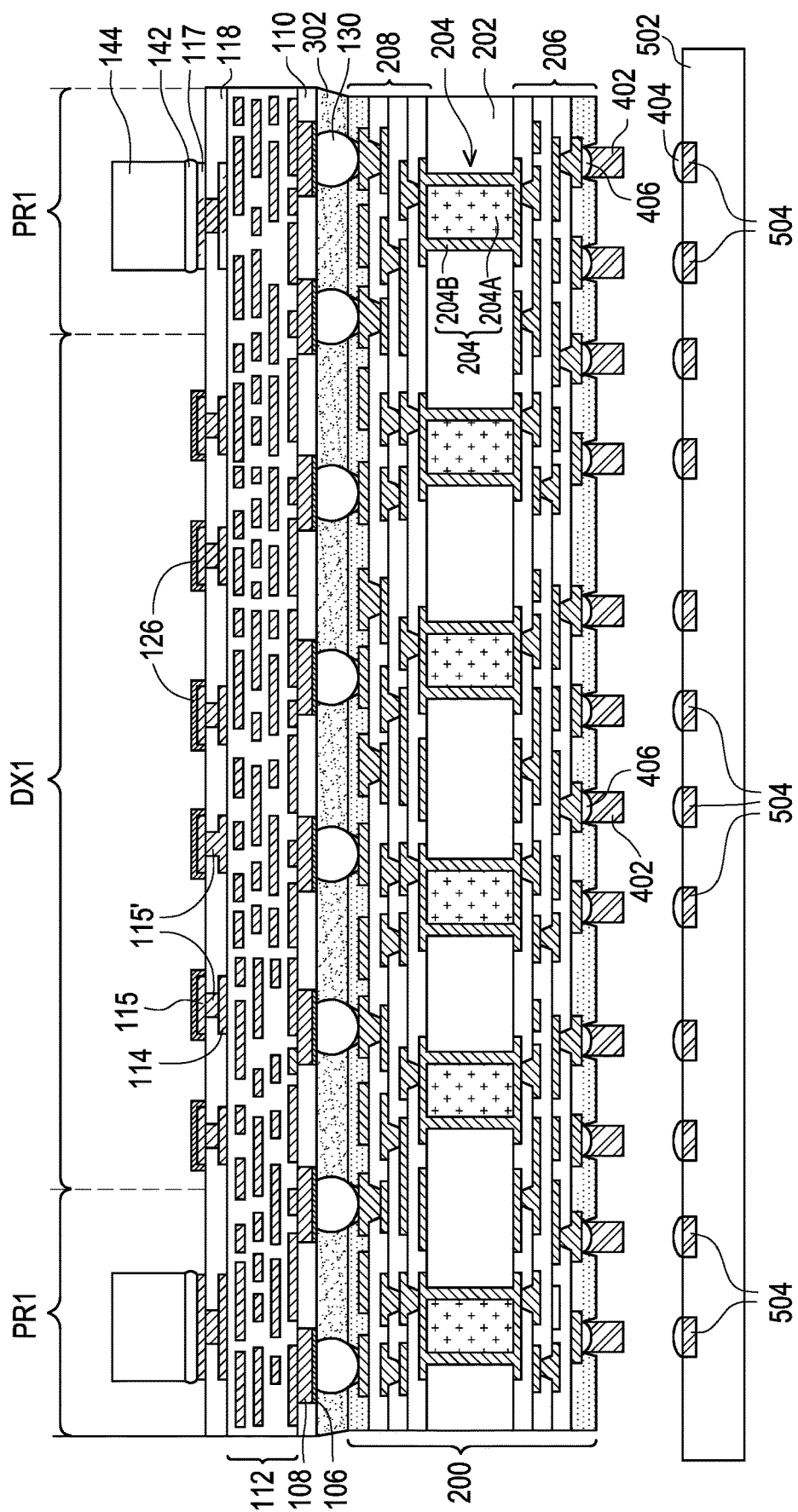
FIG. 9A and FIG. 9B are schematic sectional views of various stages in a method of fabricating a substrate structure according to some other exemplary embodiments of the present disclosure.
Figure 9B:
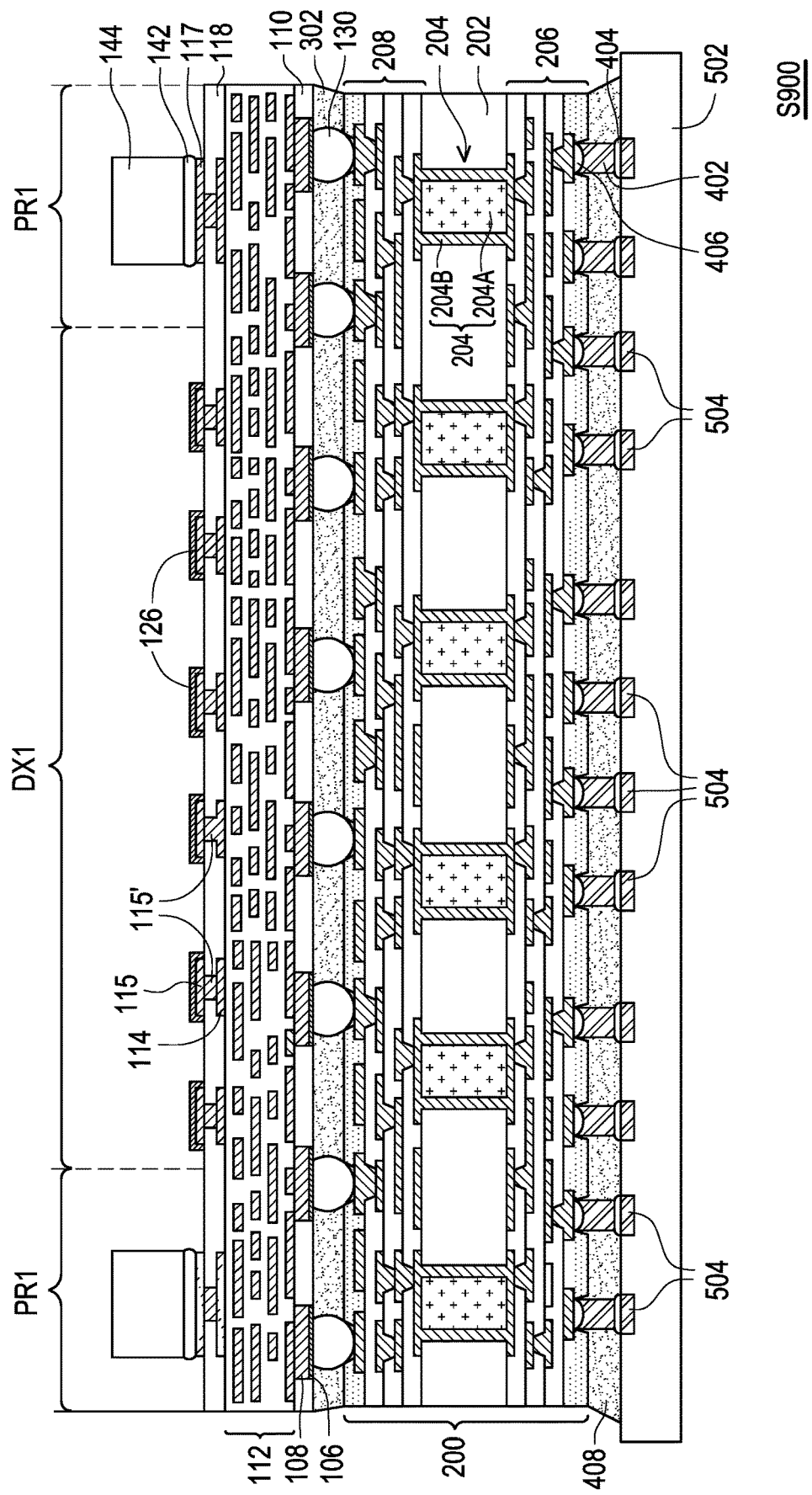

FIG. 9A and FIG. 9B are schematic sectional views of various stages in a method of fabricating a substrate structure according to some other exemplary embodiments of the present disclosure. The method illustrated in FIG. 9A to FIG. 9B is similar to the method illustrated in FIG. 7A to FIG. 7D. Therefore, the same reference numerals are used to refer to the same or liked parts, and its detailed description will be omitted herein.

As illustrated in FIG. 9A, the same steps shown in FIG. 7A to FIG. 7C may be performed for forming the core substrate 200 over the redistribution layer 112. The difference being that the conductive terminals 402 are disposed on the first redistribution structure 206 through the pre-solders 406. In other words, the conductive terminals 402 are attached to the conductive pads 206C of the first redistribution structure 206 through the pre-solders 406. Subsequently, the separated groups of unit cells may be disposed on a circuit board structure 502 having pre-solders 404 disposed thereon. In other words, pre-solders 404 are formed on the conductive pads 504 of the circuit board structure 502.

Referring to FIG. 9B, in a subsequent step, the conductive terminals 402 are physically joined with the pre-solders 404. In other words, the core substrate 200 may be electrically connected to the circuit board structure 502 through the pre-solders 406, the conductive terminals 402 and the pre-solders 404. Thereafter, an underfill material 408 may be formed in between the core substrate 200 and the circuit board structure 502 to surround the conductive terminals 402 and the pre-solders 404, 406. Up to here, a substrate structure S900 in accordance with some embodiments of the present disclosure may be accomplished.

Similar to the above embodiments, the substrate structure S900 is a probe card substrate used in probe card applications. For example, in certain embodiments, probe pins (not shown) are further disposed to make contact with the first protective coating 126 over the conductive pads 115 (test pads TP1). The probe pins may be electrically connected to a device under testing (DUT) or examination target for electrical examination.

Figure 10A:
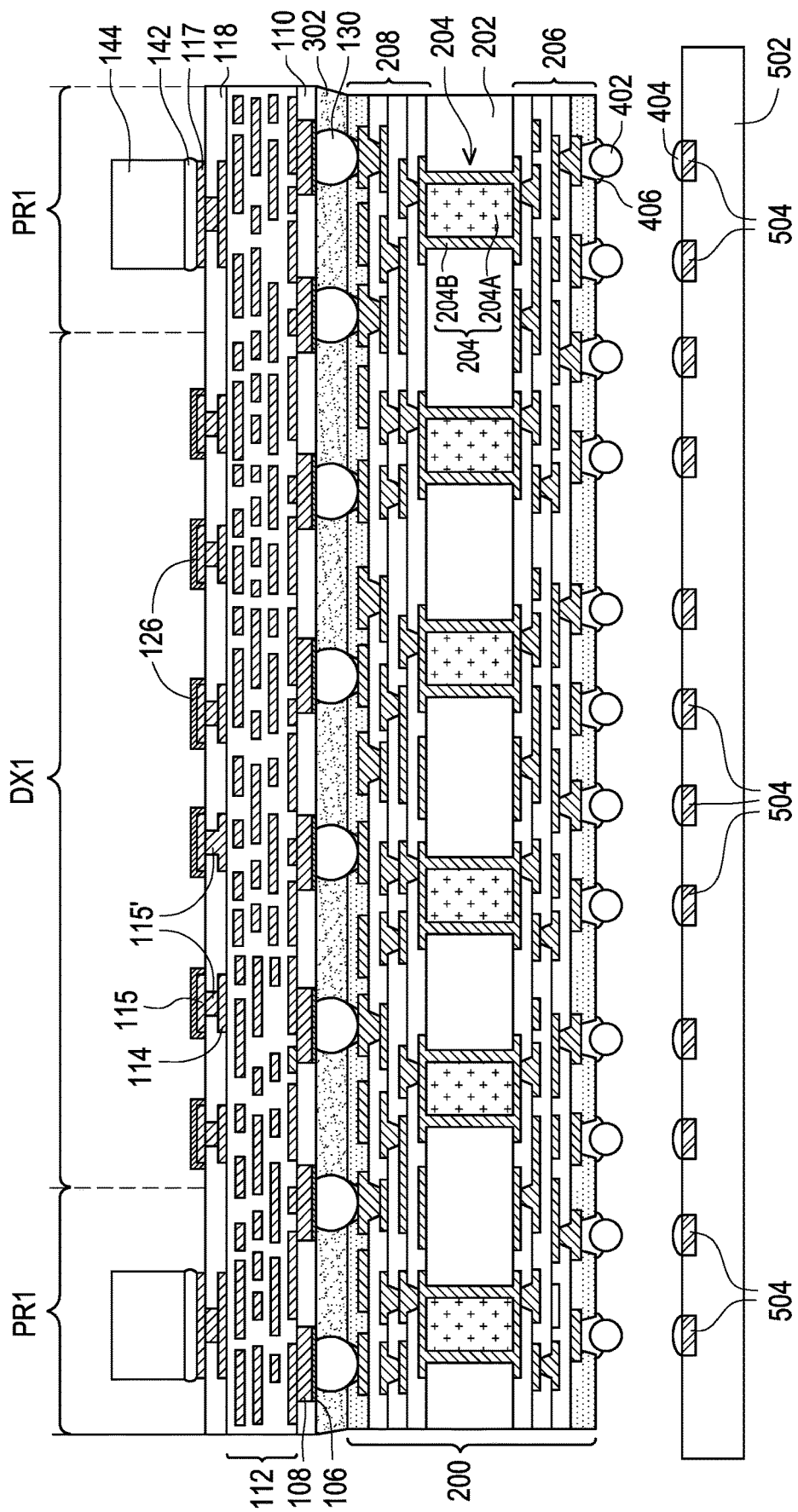
Figure 10B:
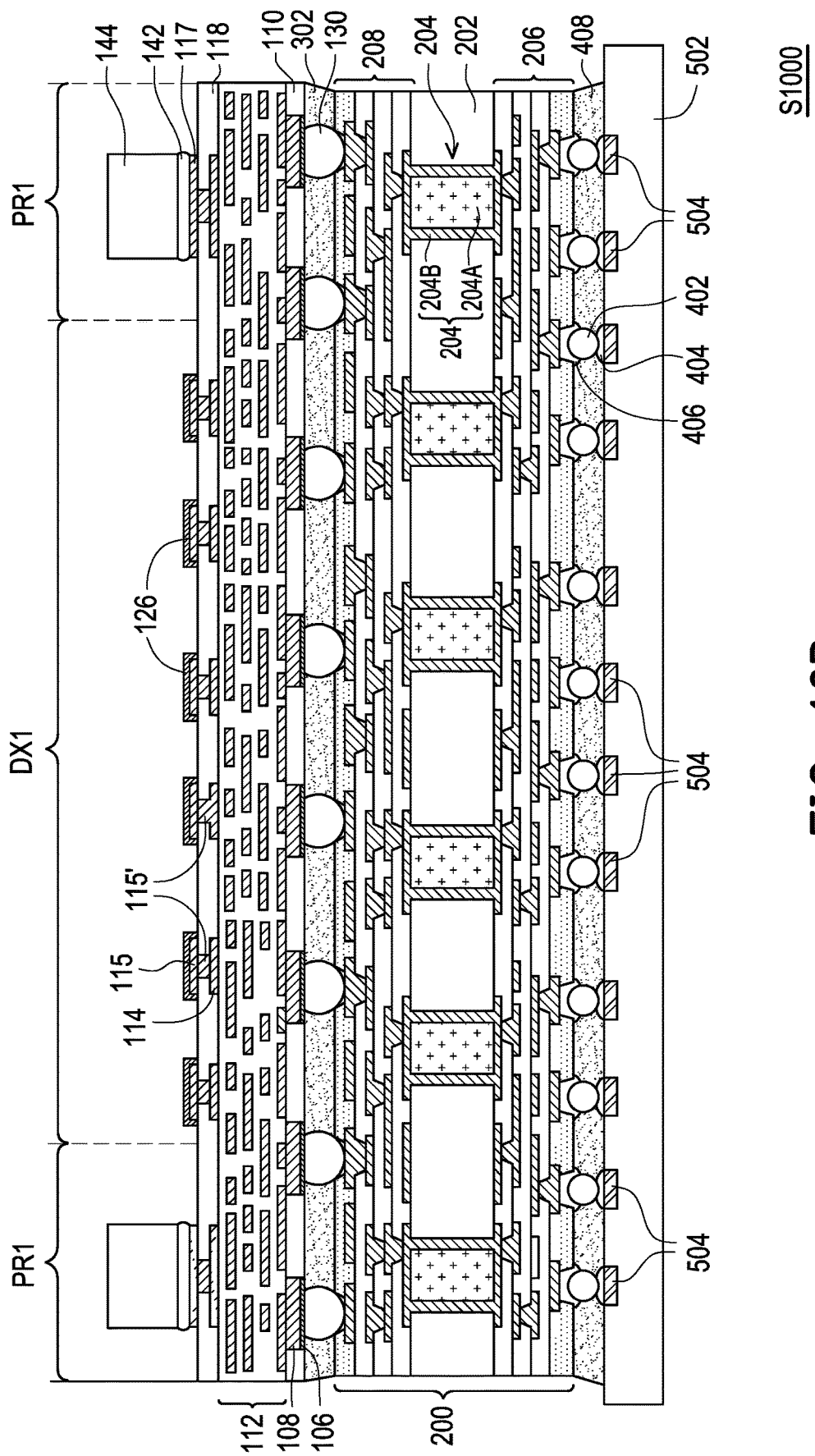

FIG. 10A and FIG. 10B are schematic sectional views of various stages in a method of fabricating a substrate structure according to some other exemplary embodiments of the present disclosure. The method illustrated in FIG. 10A to FIG. 10B is similar to the method illustrated in FIG. 9A to FIG. 9B. Therefore, the same reference numerals are used to refer to the same or liked parts, and its detailed description will be omitted herein.

The structure illustrated in FIG. 10A is the same as the structure illustrated in FIG. 9A, except that copper balls are used as the conductive terminals 402 instead of copper pillars. In a similar way, the conductive terminals 402 are attached to the conductive pads 206C of the first redistribution structure 206 through the pre-solders 406. Subsequently, the separated groups of unit cells may be disposed on a circuit board structure 502 having pre-solders 404 disposed thereon. In other words, pre-solders 404 are formed on the conductive pads 504 of the circuit board structure 502.

Referring to FIG. 10B, in a subsequent step, the conductive terminals 402 are physically joined with the pre-solders 404. In other words, the core substrate 200 may be electrically connected to the circuit board structure 502 through the pre-solders 406, the conductive terminals 402 and the pre-solders 404. Thereafter, an underfill material 408 may be formed in between the core substrate 200 and the circuit board structure 502 to surround the conductive terminals 402 and the pre-solders 404, 406. Up to here, a substrate structure S1000 in accordance with some embodiments of the present disclosure may be accomplished.

Similar to the above embodiments, the substrate structure S1000 is a probe card substrate used in probe card applications. For example, in certain embodiments, probe pins (not shown) are further disposed to make contact with the first protective coating 126 over the conductive pads 115 (test pads TP1). The probe pins may be electrically connected to a device under testing (DUT) or examination target for electrical examination.

Figure 11A:
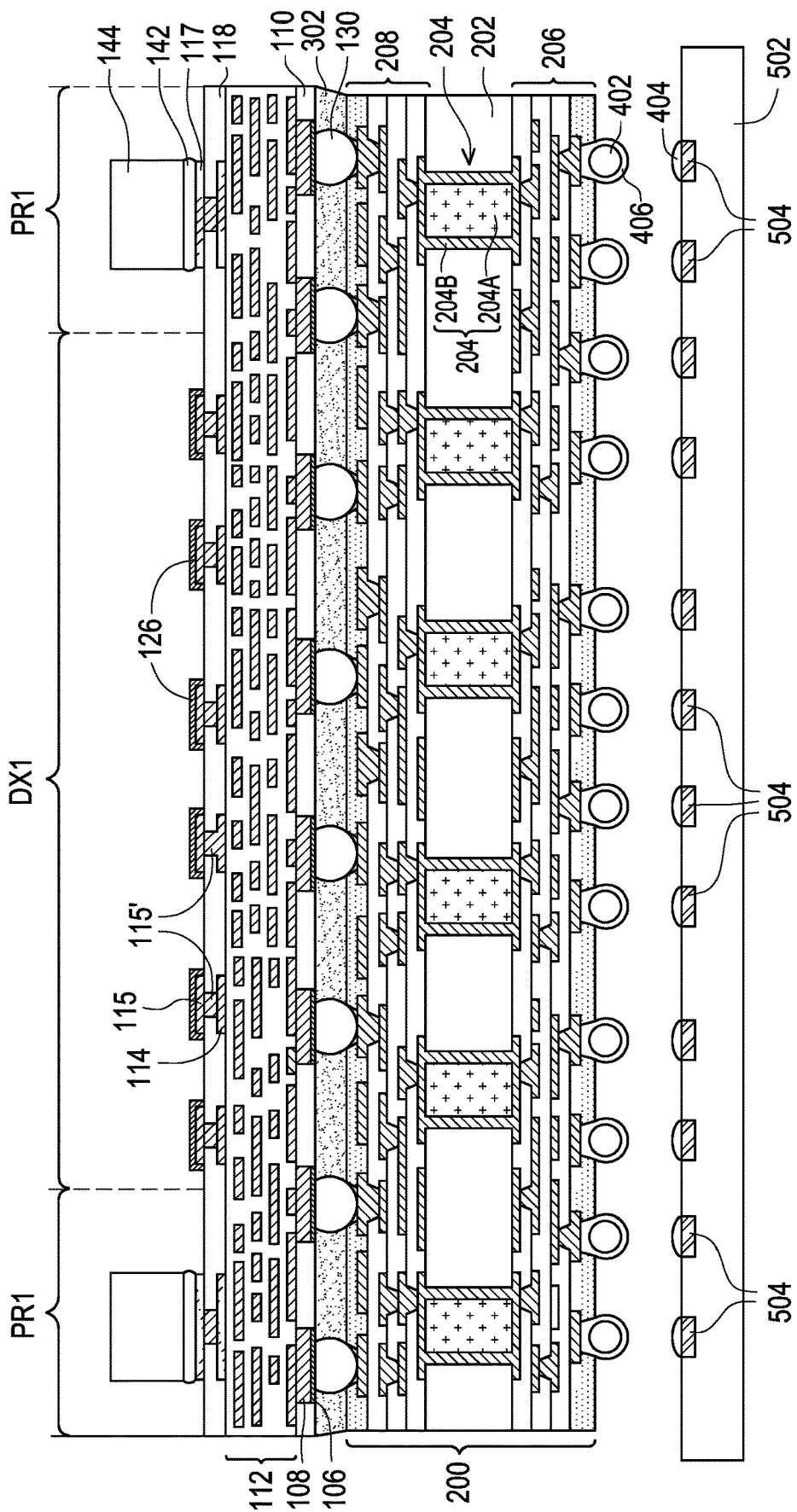
FIG. 11A and FIG. 11B are schematic sectional views of various stages in a method of fabricating a substrate structure according to some other exemplary embodiments of the present disclosure.
Figure 11B:
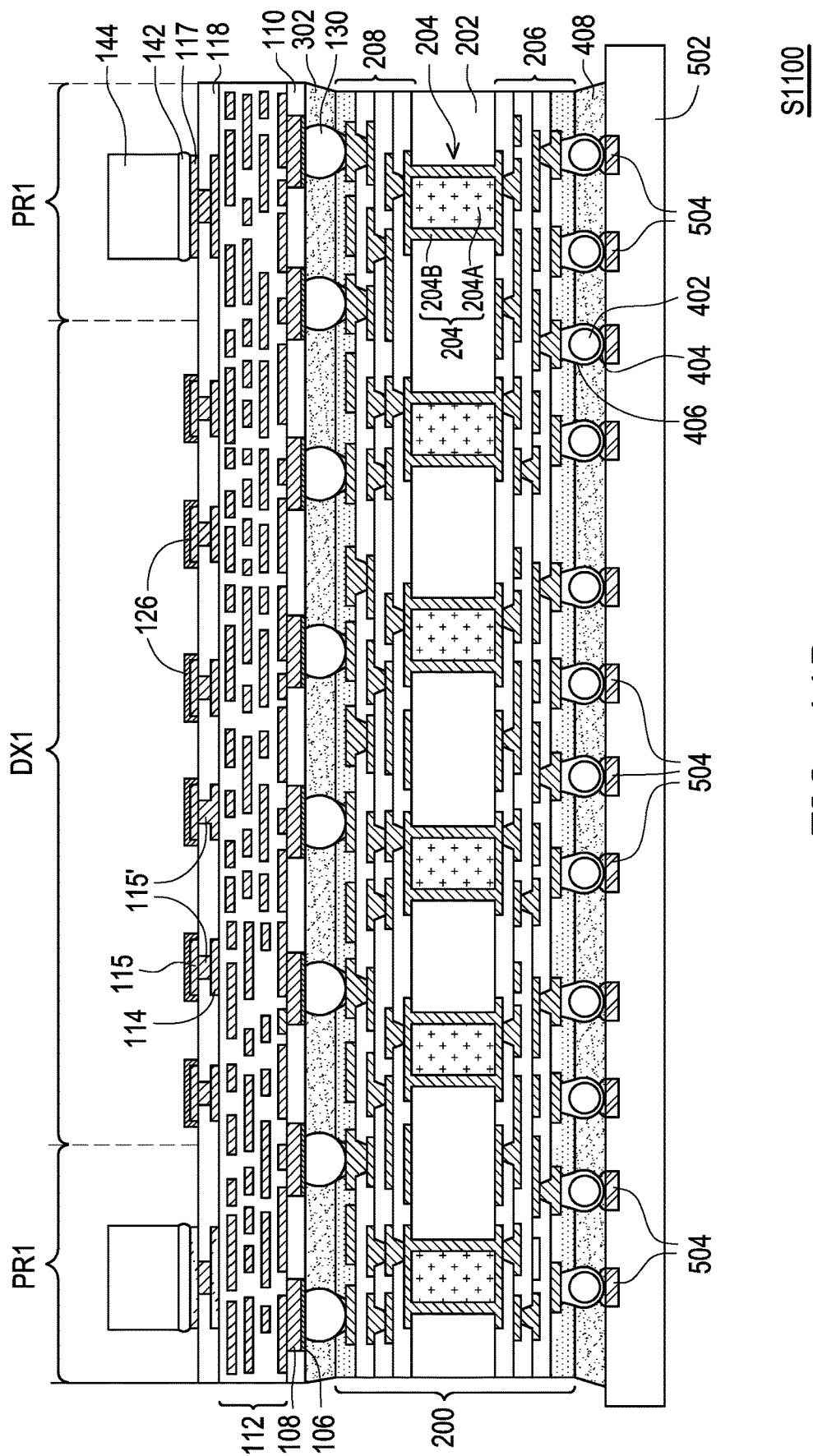

FIG. 11A and FIG. 11B are schematic sectional views of various stages in a method of fabricating a substrate structure according to some other exemplary embodiments of the present disclosure. The method illustrated in FIG. 11A to FIG. 11B is similar to the method illustrated in FIG. 9A to FIG. 9B. Therefore, the same reference numerals are used to refer to the same or liked parts, and its detailed description will be omitted herein.

The structure illustrated in FIG. 11A is the same as the structure illustrated in FIG. 9A, except that copper balls are used as the conductive terminals 402 instead of copper pillars, and that the pre-solders 406 are surrounding the conductive terminals 402 to form copper core balls. In a similar way, the conductive terminals 402 are attached to the conductive pads 206C of the first redistribution structure 206 through the pre-solders 406 formed on the outer surface of the copper ball. Subsequently, the separated groups of unit cells may be disposed on a circuit board structure 502 having pre-solders 404 disposed thereon. In other words, pre-solders 404 are formed on the conductive pads 504 of the circuit board structure 502.

Referring to FIG. 11B, in a subsequent step, the conductive terminals 402 are physically joined with the pre-solders 404. In other words, the core substrate 200 may be electrically connected to the circuit board structure 502 through the pre-solders 406, the conductive terminals 402 and the pre-solders 404. Thereafter, an underfill material 408 may be formed in between the core substrate 200 and the circuit board structure 502 to surround the conductive terminals 402 and the pre-solders 404, 406. Up to here, a substrate structure S1100 in accordance with some embodiments of the present disclosure may be accomplished.

Similar to the above embodiments, the substrate structure S1100 is a probe card substrate used in probe card applications. For example, in certain embodiments, probe pins (not shown) are further disposed to make contact with the first protective coating 126 over the conductive pads 115 (test pads TP1). The probe pins may be electrically connected to a device under testing (DUT) or examination target for electrical examination.

Figure 12:
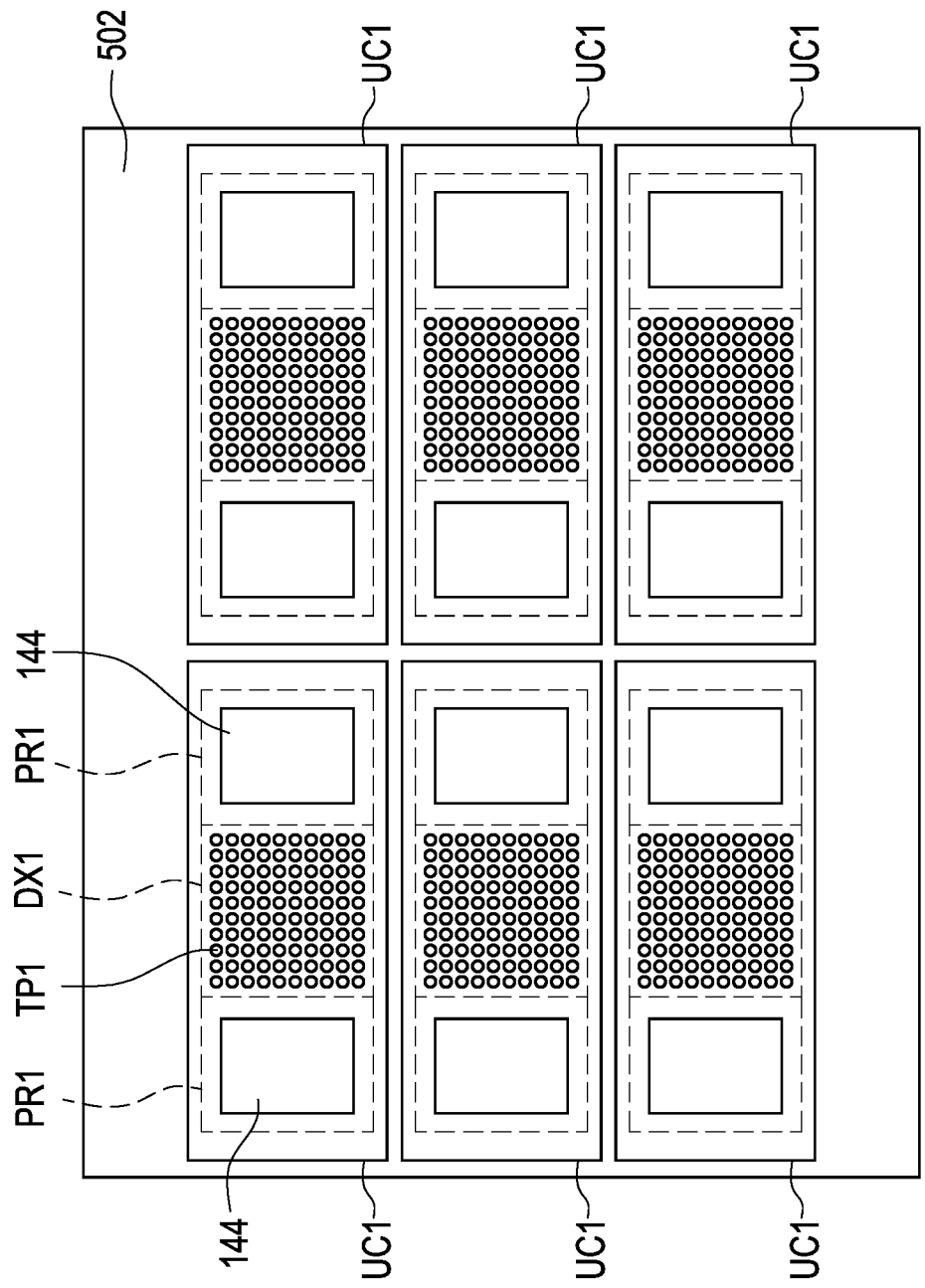
FIG. 12 is a top view of a substrate structure according to some exemplary embodiments of the present disclosure.

FIG. 12 is a top view of a substrate structure according to some exemplary embodiments of the present disclosure. In the above embodiments, only one testing unit cell is illustrated to be disposed on the circuit board structure. However, it is noted that the disclosure is not limited thereto. As illustrated in FIG. 12, the substrate structure SX may include a plurality of testing unit cells UC1. For example, in the illustrated embodiment, there may be six testing unit cells UC1 disposed on the circuit board structure 502. In some other embodiments, there may be one testing unit cells UC1, two testing unit cells, three testing unit cells UC1, four testing unit cells UC1, five testing unit cells UC1, six testing unit cells UC1, seven testing unit cells UC1, eight testing unit cells UC1, nine testing unit cells UC1, or ten testing unit cells UC1, disposed on the circuit board structure 502. In other words, the number of testing unit cells UC1 in the substrate structure SX is not particularly limited, and may be adjusted based on product requirement.

As further illustrated in FIG. 12, each of the testing unit cells UC1 may include test pads TP1 (conductive pads 114 or conductive pads 115) arranged in an array and disposed in the DUT area DX1, and passive devices 144 located in the peripheral areas PR1. Each of the testing unit cells UC1 may correspond to any of the substrate structure S100, S200, S300, S400, S500 and S600 illustrated above, and may be further connected to the circuit board structure 502 in the manner illustrated in any of the substrate structure S700, S800, S900, S1000 and S1100.

According to the above embodiments, the substrate structure includes a plurality of test pads used for probe card applications disposed over a redistribution layer and over the core substrate. The core substrate may be further connected to the circuit substrate through a plurality of conductive terminals. By forming the substrate structure in the above manner, it is possible to improve the circuit board mount yield and coplanarity of the probe card system. Furthermore, the electromigration and electrical performance of the substrate structure (probe card substrate) may be further improved, and costs may be further reduced.

In accordance with some embodiments of the present disclosure, a substrate structure includes a core substrate, a redistribution layer, a plurality of test pads, a first protective coating, at least one conductive pad and a passive device. The redistribution layer is disposed on and electrically connected to the core substrate. The test pads are disposed over the redistribution layer. The first protective coating is coated on the test pads. The conductive pad is d disposed on the redistribution layer aside the plurality of test pads. The passive device is disposed on and electrically connected to the at least one conductive pad.

In accordance with some other embodiments of the present disclosure, a probe card substrate includes a plurality of testing unit cells and a circuit board structure. The testing unit cells are located on and electrically connected to the circuit board structure. Each of the testing unit cells include a redistribution layer, a plurality of test pads, a plurality of passive devices, and a core substrate. The redistribution layer has a device under testing (DUT) area and peripheral areas located on two sides of the DUT area. The test pads are arranged in an array in the DUT area on the redistribution layer. The passive devices are arranged in the peripheral areas and surrounding the plurality of test pads. The core substrate is electrically connected to the redistribution layer through a plurality of conductive connectors.

In accordance with yet another embodiment of the present disclosure, a method of fabricating a substrate structure is described. The method includes the following steps. A redistribution layer is formed on a first carrier. A plurality of test pads is formed over the redistribution layer, and at least one conductive pad is formed on the redistribution layer aside the plurality of test pads. A first protective coating is coated on the plurality of test pads. The first carrier is de-bonded, and the redistribution layer is boned onto a tape. A core substrate is bonded on the redistribution layer, wherein the redistribution layer is electrically connected to the core substrate. The tape is removed, and a passive device is formed on the at least one conductive pad, wherein the passive device is electrically connected to the at least one conductive pad.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A substrate structure, comprising:
   a core substrate;
   a redistribution layer disposed on and electrically connected to the core substrate;
   a plurality of test pads disposed over the redistribution layer, wherein the plurality of test pads includes a bottom surface, a top surface opposite to the bottom surface, and sidewalls joining the bottom surface to the top surface;
   a first protective coating coated on the plurality of test pads, and covering and contacting the top surface and the sidewalls;
   at least one conductive pad disposed on the redistribution layer aside the plurality of test pads; and
   a passive device disposed on and electrically connected to the at least one conductive pad.

2. The substrate structure according to claim 1, wherein the core substrate comprises:
   a core material having a first surface and a second surface opposite to the first surface;
   a conductive via structure extending through the core material;
   a first redistribution structure disposed on the first surface of the core material; and
   a second redistribution structure disposed on the second surface of the core material, wherein the first redistribution structure is electrically connected to the second redistribution structure through the conductive via structure, and the redistribution layer is electrically connected to the second redistribution structure of the core substrate through a plurality of conductive connectors.

3. The substrate structure according to claim 2, further comprising an underfill material located in between the core substrate and the redistribution layer, wherein the underfill material covers the plurality of conductive connectors.

4. The substrate structure according to claim 1, further comprising a pad layer disposed on the redistribution layer and separating each of the plurality of test pads from one another.

5. The substrate structure according to claim 1, further comprising a polymer layer disposed on the redistribution layer and have openings revealing top surfaces of the plurality of test pads, wherein the first protective coating is disposed in the openings and located on the top surfaces of the plurality of test pads.

6. The substrate structure according to claim 1, further comprising a polymer layer disposed in between the redistribution layer and the plurality of test pads, wherein the first protective coating is disposed on the polymer layer and cover sidewalls and top surfaces of the plurality of test pads.

7. The substrate structure according to claim 1, further comprising a second protective coating located on the first protective coating and over the plurality of test pads, wherein a material of the second protective coating is different from a material of the first protective coating.

8. The substrate structure according to claim 1, further comprising a circuit board structure disposed over the core substrate, wherein the core substrate is electrically connected to the circuit board structure through a plurality of conductive terminals.

9. The substrate structure according to claim 1, wherein a thickness of the plurality of test pads is smaller than a thickness of the passive device, and wherein a level of a bottom surface of the passive device is located above a level of the top surface of the plurality of test pads.

10. A probe card substrate, comprising:
   a plurality of testing unit cells, wherein each of the plurality of testing unit cells comprises:
      a redistribution layer having a device under testing (DUT) area and peripheral areas located on two sides of the DUT area;
      a plurality of test pads arranged in an array in the DUT area on the redistribution layer;
      a plurality of passive devices arranged in the peripheral areas and surrounding the plurality of test pads;

a pad layer disposed on the redistribution layer and separating the plurality of test pads from one another, wherein the pad layer is spaced apart from the plurality of test pads so that air spaces exist in between the pad layer and the plurality of test pads;

a core substrate electrically connected to the redistribution layer through a plurality of conductive connectors; and a circuit board structure, wherein the plurality of testing unit cells is located on and electrically connected to the circuit board structure.

11. The probe card substrate according to claim 10, wherein the plurality of testing unit cells comprises six testing unit cells, and the DUT area of each of the six testing unit cells is separated from one another.

12. The probe card substrate according to claim 11, wherein the redistribution layer is shared between the six testing unit cells.

13. The probe card substrate according to claim 10, wherein a first protective coating is coated on the plurality of test pads.

14. The probe card substrate according to claim 13, wherein the first protective coating is coated on side surfaces and top surfaces of the plurality of test pads.

15. The probe card substrate according to claim 10, further comprising:
  a plurality of conductive terminals disposed in between the circuit board structure and the core substrate for providing electrical connection therebetween; and
  an underfill material surrounding the plurality of conductive terminals.

16. A method of fabricating a substrate structure, comprising:
  forming a redistribution layer on a first carrier;
  forming a plurality of test pads over the redistribution layer, and forming at least one conductive pad on the redistribution layer aside the plurality of test pads, wherein the plurality of test pads is formed with a bottom surface, a top surface opposite to the bottom surface, and sidewalls joining the bottom surface to the top surface;
  forming a first protective coating coated on the plurality of test pads, wherein the first protective coating is covering and contacting the top surface and the sidewalls;
  de-bonding the first carrier, and bonding the redistribution layer onto a tape;
  bonding a core substrate on the redistribution layer, wherein the redistribution layer is electrically connected to the core substrate; and
  removing the tape, and forming a passive device on the at least one conductive pad, wherein the passive device is electrically connected to the at least one conductive pad.

17. The method according to claim 16, wherein forming the first protective coating comprises:
  forming a photoresist on the redistribution layer covering the at least one conductive pad, wherein the photoresist comprises openings exposing the plurality of test pads;
  forming the first protective coating on the plurality of test pads through the openings; and
  removing the photoresist.

18. The method according to claim 16, wherein bonding the core substrate on the redistribution layer comprises connecting the core substrate to the redistribution layer through a plurality of conductive connectors.

19. The method according to claim 16, further comprising forming a pad layer on the redistribution layer, wherein the pad layer separates each of the plurality of test pads from one another.

20. The method according to claim 16, further comprising disposing a circuit board structure over the core substrate, wherein the core substrate is electrically connected to the circuit board structure through a plurality of conductive terminals.

* * * * *